(12) United States Patent
Ishii et al.

(10) Patent No.: US 9,099,334 B2
(45) Date of Patent: *Aug. 4, 2015

(54) METHOD OF MANUFACTURING SEMICONDUCTOR DEVICE AND SEMICONDUCTOR DEVICE

(71) Applicant: Renesas Electronics Corporation, Kawasaki-shi, Kanagawa (JP)

(72) Inventors: Yasushi Ishii, Kanagawa (JP); Hiraku Chakihara, Kanagawa (JP); Kentaro Saito, Kanagawa (JP)

(73) Assignee: RENESAS ELECTRONICS CORPORATION, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/089,959

(22) Filed: Nov. 26, 2013

(65) Prior Publication Data
US 2014/0077310 A1 Mar. 20, 2014

Related U.S. Application Data

(63) Continuation of application No. 13/662,509, filed on Oct. 28, 2012, now Pat. No. 8,617,974.

(30) Foreign Application Priority Data

Oct. 28, 2011 (JP) ................................ 2011-236675

(51) Int. Cl.
*H01L 21/3205* (2006.01)
*H01L 27/088* (2006.01)
(Continued)

(52) U.S. Cl.
CPC ........ *H01L 27/088* (2013.01); *H01L 21/28008* (2013.01); *H01L 21/82* (2013.01); *H01L 21/82385* (2013.01); *H01L 21/823425* (2013.01); *H01L 21/823814* (2013.01);
(Continued)

(58) Field of Classification Search
CPC .................. H01L 29/66742; H01L 29/66484; H01L 29/66659; H01L 29/66674; H01L 29/7801; H01L 29/7835; H01L 29/7838
USPC ................. 438/197, 199, 301, 381, 581, 587; 257/365, 369, E21.156, E21.593
See application file for complete search history.

(56) References Cited

U.S. PATENT DOCUMENTS 7,371,631 B2 * 5/2008 Sakai et al. .................... 438/201
7,414,292 B2 * 8/2008 Ema et al. ..................... 257/369
(Continued)

FOREIGN PATENT DOCUMENTS

JP 05-326513 A 12/1993
JP 2005-005508 A 1/2005

*Primary Examiner* — Brook Kebede
(74) *Attorney, Agent, or Firm* — Miles & Stockbridge P.C.

(57) ABSTRACT

An improvement is achieved in the manufacturing yield of a semiconductor device including a plurality of field effect transistors having different characteristics over the same substrate. By combining anisotropic dry etching with isotropic wet etching or isotropic dry etching, three types of sidewalls having different sidewall lengths are formed. By reducing the number of anisotropic dry etching steps, in a third n-type MISFET region and a third p-type MISFET region where layout densities are high, it is possible to prevent a semiconductor substrate from being partially cut between n-type gate electrodes adjacent to each other, between the n-type gate electrode and a p-type gate electrode adjacent to each other, and the p-type gate electrodes adjacent to each other.

6 Claims, 49 Drawing Sheets

(51) Int. Cl.
*H01L 21/82* (2006.01)
*H01L 21/8234* (2006.01)
*H01L 21/8238* (2006.01)
*H01L 21/28* (2006.01)

(52) U.S. Cl.
CPC *H01L21/823857* (2013.01); *H01L 21/823864* (2013.01)

(56) References Cited

U.S. PATENT DOCUMENTS

2003/0151109 A1* 8/2003 Taniguchi et al. ............ 257/500
2005/0101076 A1* 5/2005 Nakabayashi ................ 438/199
2010/0038692 A1* 2/2010 Chuang et al. ................ 257/298

* cited by examiner

METHOD OF MANUFACTURING SEMICONDUCTOR DEVICE AND SEMICONDUCTOR DEVICE

CROSS-REFERENCE TO RELATED APPLICATIONS

The disclosure of Japanese Patent Application No. 2011-236675 filed on Oct. 28, 2011 including the specification, drawings and abstract is incorporated herein by reference in its entirety.

BACKGROUND

The present invention relates to a method of manufacturing a semiconductor device and the semiconductor device, and particularly to a technology which is effective when applied to a semiconductor device in which a plurality of field effect transistors different in gate length and layout density are produced in the same substrate.

For example, Japanese Unexamined Patent Publication No. Hei 5 (1993)-326513 (Patent Document 1) discloses a technique which forms a $SiO_2$ spacer layer by dry etching and then removes a thermal oxidation $SiO_2$ film remaining over a substrate surface by wet etching to thereby inhibit damage to the substrate surface.

Also, Japanese Unexamined Patent Publication No. 2005-5508 (Patent Document 2) discloses a technique which dry-etches a sidewall spacer formation layer to form sidewall spacers and then removes the sidewall spacers in a low-voltage-transistor formation region by wet etching.

RELATED ART DOCUMENTS

Patent Documents

[Patent Document 1]
Japanese Unexamined Patent Publication No. Hei 5 (1993)-326513
[Patent Document 2]
Japanese Unexamined Patent Publication No. 2005-5508

SUMMARY recent years, to meet finely differentiated use applications, a plurality of MISFETs (Metal Insulator Semiconductor Field Effect Transistors) designed for individual required characteristics (such as breakdown voltage, leakage current, and operating speed) are formed over the same substrate. Accordingly, if the individual required characteristics are to be obtained, a plurality of MISFETS which are different in, e.g., the thickness of a gate insulating film, gate length, the thicknesses of sidewalls, layout density, or the like may be formed over the same substrate. However, when the plurality of MISFETs designed for the individual required characteristics are to be formed over the same substrate, it is difficult to control processing conditions in each of manufacturing steps, or a manufacturing process may be complicated. Therefore, a technique for manufacturing the plurality of MISFETs which satisfy the individual required characteristics with an improved yield or a technique for manufacturing the plurality of MISFETs in a simpler and easier manufacturing process is in demand.

An object of the present invention is to provide a technique which allows an improvement in the manufacturing yield of a semiconductor device having a plurality of field effect transistors having different characteristics over the same substrate.

The above and other objects and novel features of the present invention will become apparent from a statement in the present specification and the accompanying drawings.

The following is a brief description of an embodiment of a representative aspect of the invention disclosed in the present application.

The embodiment provides a method of manufacturing a semiconductor device including high-voltage MISFETs in a first region, low-leakage low-voltage MISFETs in a second region, and high-speed-operation low-voltage MISFETs in a third region. The method of manufacturing the semiconductor device includes the step of forming first gate electrodes in the first region each via a first gate insulating film, forming second gate electrodes in the second region each via a second gate insulating film, and forming third gate electrodes in the third region each via a third gate insulating film, the step of forming a first insulating film over a main surface of a semiconductor substrate so as to cover the first gate electrodes, the second gate electrodes, and the third gate electrodes therewith, the step of forming a second insulating film over the first insulating film, the step of processing the second insulating film by anisotropic dry etching to leave the second insulating film over each of the side surfaces of the first gate electrodes, the second gate electrodes, and the third gate electrodes, the step of processing the second insulating film left over each of the side surfaces of the second gate electrodes and the third gate electrodes by isotropic dry etching or isotropic wet etching, the step of removing the second insulating film left over each of the side surfaces of the third gate electrodes by isotropic dry etching or isotropic wet etching, the step of forming a third insulating film over the main surface of the semiconductor substrate so as to cover the first gate electrodes, the second insulating film left over each of the side surfaces of the first gate electrodes, the second gate electrodes, the second insulating film left over each of the side surfaces of the second gate electrodes, and the third gate electrodes, the step of processing the third insulating film by anisotropic dry etching to leave the third insulating film over each of the side surfaces of the first gate electrodes via the first insulating film and the second insulating film, each of the side surfaces of the second gate electrodes via the first insulating film and the second insulating film, and each of the side surfaces of the third gate electrodes via the first insulating film, and the step of removing the exposed first insulating film. First sidewalls are each formed of the first insulating film, the second insulating film, and the third insulating film which are formed over each of the side surfaces of the first gate electrodes. Second sidewalls are each formed of the first insulating film, the second insulating film, and the third insulating film which are formed over each of the side surfaces of the second gate electrodes. Third sidewalls are each formed of the first insulating film and the third insulating film which are formed over each of the side surfaces of the third gate electrodes.

Alternatively, the embodiment provides a method of manufacturing a semiconductor device including high-voltage MISFETs in a first region, low-leakage low-voltage MISFETs in a second region, and high-speed-operation low-voltage MISFETs in a third region. The method of manufacturing the semiconductor device includes the step of forming first gate electrodes in the first region each via a first gate insulating film, forming second gate electrodes in the second region each via a second gate insulating film, and forming third gate electrodes in the third region each via a third gate insulating film, the step of forming a first insulating film over a main surface of a semiconductor substrate so as to cover the first gate electrodes, the second gate electrodes, and the third gate electrodes therewith, the step of forming a second insulating film over the first insulating film, the step of processing the second insulating film by anisotropic dry etching to leave the second insulating film over each of the side surfaces of the first gate electrodes, the second gate electrodes, and the third gate electrodes, the step of processing the second insulating film left over each of the side surfaces of the second gate electrodes and the third gate electrodes by isotropic dry etching or isotropic wet etching, the step of processing the second insulating film left over each of the side surfaces of the third gate electrodes by isotropic dry etching or isotropic wet etching, and the step removing the exposed first insulating film. First sidewalls are each formed of the first insulating film and the second insulating film which are formed over each of the side surfaces of the first gate electrodes. Second sidewalls are each formed of the first insulating film and the second insulating film which are formed over each of the side surfaces of the second gate electrodes. Third sidewalls are each formed of the first insulating film and the second insulating film which are formed over each of the side surfaces of the third gate electrodes.

The embodiment also provides a semiconductor device including high-voltage MISFETs in a first region, low-leakage low-voltage MISFETs in a second region, high-speed-operation low-voltage MISFETs in a third region, first sidewalls each having a first sidewall length and provided over side surfaces of first gate electrodes each having a first gate length in the high-voltage MISFETs, second sidewalls each having a second sidewall length and provided over side surfaces of second gate electrodes each having a second gate length in the low-leakage low-voltage MISFETs, and third sidewalls each having a third sidewall length and provided over side surfaces of third gate electrodes each having a third gate length in the high-speed-operation low-voltage MISFETs. The second sidewall length is shorter than the first sidewall length, and the third sidewall length is shorter than the second sidewall length. The height of each of the second sidewalls from a main surface of a semiconductor substrate is shorter than a height of each of the first sidewalls from the main surface of the semiconductor substrate, and the height of each of the third sidewalls from the main surface of the semiconductor substrate is shorter than the height of each of the second sidewalls from the main surface of the semiconductor substrate.

The following is a brief description of effects achievable by the embodiment of the representative aspect of the invention disclosed in the present application.

An improvement can be achieved in the manufacturing yield of a semiconductor device including a plurality of field effect transistors having mutually different characteristics over the same substrate.

DETAILED DESCRIPTION

Figure 1:
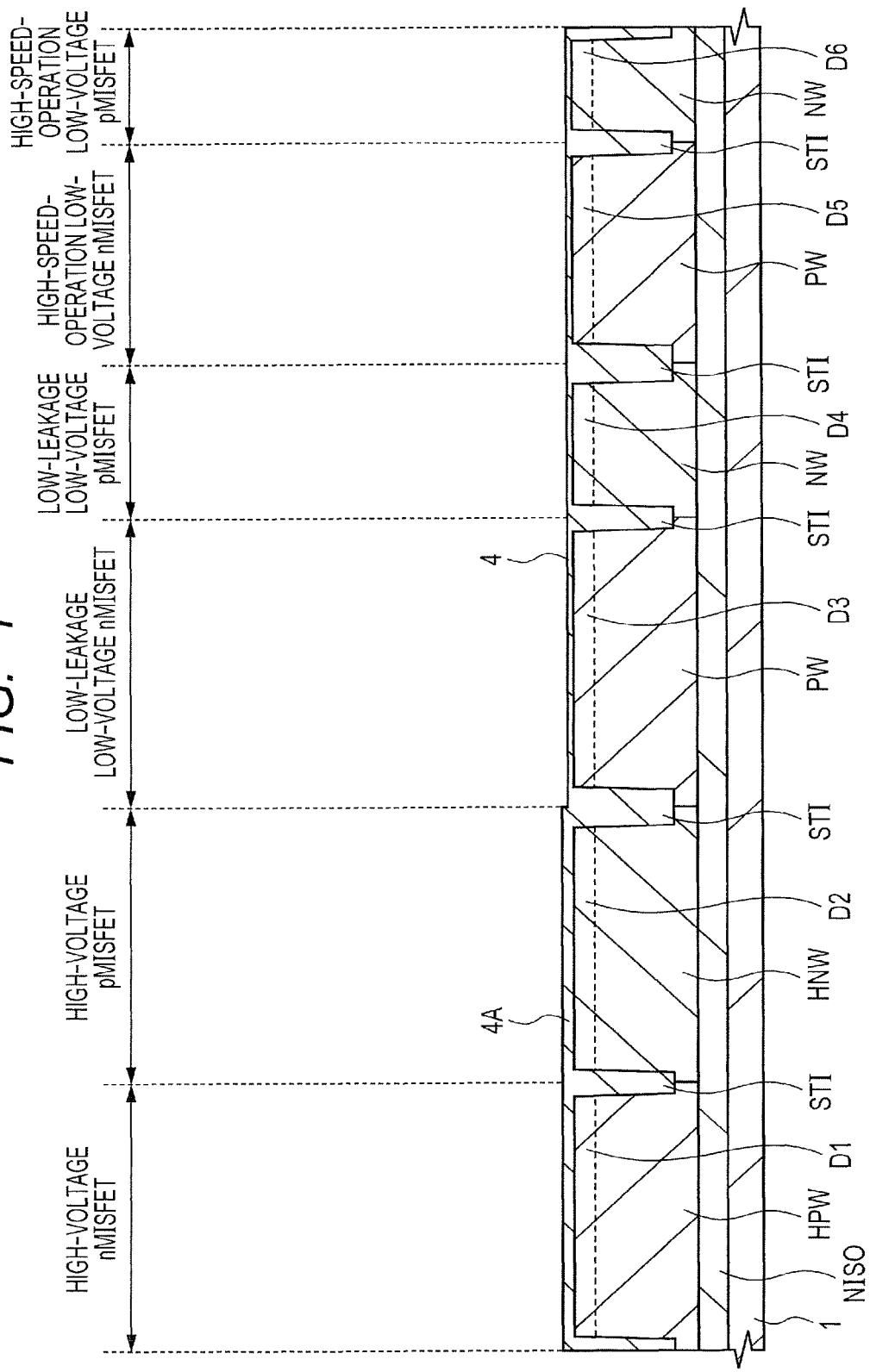
FIG. 1 is a main-portion cross-sectional view of a semiconductor device according to Embodiment 1 of the present invention, which illustrates a manufacturing step of the semiconductor device.

In the following embodiments, if necessary for the sake of convenience, the embodiments will be each described by being divided into a plurality of sections or embodiments. However, they are by no means irrelevant to each other unless particularly explicitly described otherwise, and one of the sections or embodiments is modifications, details, supplementary explanation, and so forth of part or the whole of the others.

When the number and the like (including the number, numerical value, amount, range, and the like thereof) of elements are referred to in the following embodiments, they are not limited to specific numbers unless particularly explicitly described otherwise or unless they are obviously limited to specific numbers in principle. The number and the like of the elements may be not less than or not more than specific numbers. It will be appreciated that, in the present embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

In the following embodiments, a MISFET representative of a field effect transistor is shortened as a MIS, a p-channel MISFET is shortened as a pMISFET, and an n-channel MISFET is shortened as an nMISFET. It will be appreciated that a MONOS nonvolatile memory cell described in the following embodiments is also included in the subordinate concept of the foregoing MIS. In the following embodiments, when silicon nitride is mentioned, it naturally includes $Si_3N_4$, but is not limited thereto. It is assumed that silicon nitride includes not only $Si_3N_4$, but also an insulating film of a nitride of silicon having a similar composition. Also in the following embodiments, when a wafer is mentioned, it mainly refers to a Si (Silicon) single-crystal wafer, but is not limited thereto. It is assumed that a wafer refers to not only the Si single-crystal wafer, but also a SOI (Silicon On Insulator) wafer, an insulating film substrate for forming an integrated circuit thereover, or the like. It is also assumed that the shape thereof includes not only a circular or approximately circular shape, but also a square, a rectangle, and the like.

Note that, throughout all the drawings for illustrating the following embodiments, members having the same functions are designated by the same reference numerals, and a repeated description thereof is omitted. Hereinbelow, the embodiments of the present invention will be described in detail based on the drawings.

First, a method of manufacturing high-voltage MISFETs and low-voltage MISFETs each studied by the present inventors prior to the present invention will be described below conceivably because, by doing so, a method of manufacturing a semiconductor device according to the embodiments of the present invention will become clearer. The gate insulating film of each of the high-voltage MISFETs is formed thicker than the gate insulating film of each of the low-voltage MISFETs. Also, each of the high-voltage MISFETs is formed to have a gate length longer than that of each of the low-voltage MISFETs. Accordingly, even when a relatively high voltage is applied thereto, the high-voltage MISFETs can operate without breaking down. In addition, due to different breakdown voltages, the layout density of the high-voltage MISFETs is lower than that of the low-voltage MISFETs.

Figure 48:
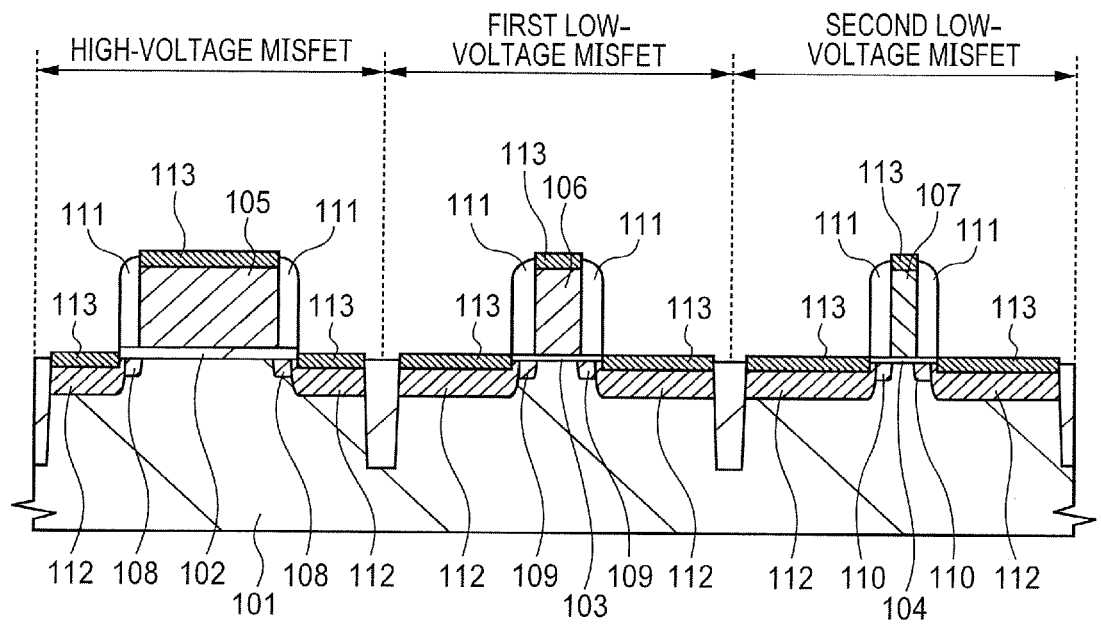
FIG. 48 is a main-portion cross-sectional view of a semiconductor device (high-voltage MISFETs and low-voltage MISFETs) studied by the present inventors, which illustrates a first example of a method of manufacturing the semiconductor device.

A first example of the method of manufacturing the high-voltage MISFETs and the low-voltage MISFETs each studied by the present inventors will be described below using FIG. 48. FIG. 48 shows a main-portion cross-sectional view of each of the high-voltage MISFETs which is driven with an applied voltage of, e.g., 3.3 to 5 V, a main-portion cross-sectional view of each of first low-voltage MISFETs (low-leakage MISFETs) which is driven with an applied voltage of, e.g., 1.2 V, and a main-portion cross-sectional view of each of second low-voltage MISFETs (high-speed-operation MISFETs) which is driven with an applied voltage of, e.g., 1.2 V.

The leakage current between the gate and drain of the first low-voltage MISFET can be controlled to be lower than that of the second low-voltage MISFET, and the second low-voltage MISFET can perform a higher-speed operation than performed by the first low-voltage MISFET. That is, the first low-voltage MISFET and the second low-voltage MISFET are different in gate length and layout density. The gate length of the first low-voltage MISFET is longer than the gate length of the second low-voltage MISFET, and the layout density of the first low-voltage MISFETs is lower than the layout density of the second low-voltage MISFETs. Note that, here, the n-channel high-voltage MISFET, the n-channel first low-voltage MISFET, and the n-channel second low-voltage MISFET are shown by way of example.

First, over the main surface of a p-type semiconductor substrate 101 in which the high-voltage MISFETs are formed, a gate insulating film 102 having a thickness of, e.g., about nm is formed and, over the main surface of the semiconductor substrate 101 in which the first and second low-voltage MISFETs are formed, gate insulating films 103 and 104 each having a thickness of, e.g., about 3 nm are formed. Then, gate electrodes 105 of the high-voltage MISFETs are formed over the gate insulating film 102, gate electrodes 106 of the first low-voltage MISFETs are formed over the gate insulating film 103, and gate electrodes 107 of the second low-voltage MISFETs are formed over the gate insulating film 104. The gate lengths of the high-voltage MISFETs are, e.g., about 800 nm, the gate lengths of the first low-voltage MISFETs are, e.g., about 55 nm, and the gate lengths of the second low-voltage MISFETs are, e.g., about 44 nm. The gate electrodes 105, 106, and 107 are each made of, e.g., polysilicon.

Next, using the gate electrodes 105 of the high-voltage MISFETs as a mask, an n-type impurity is introduced into the semiconductor substrate 101 by an ion implantation method to form lightly doped diffusion layers 108 of the high-voltage MISFETs. Likewise, lightly doped diffusion layers 109 of the first low-voltage MISFETs are formed, and lightly doped diffusion layers 110 of the second low-voltage MISFETs are formed Next, over the respective side surfaces of the gate electrodes 105 of the high-voltage MISFETs, the gate electrodes 106 of the first low-voltage MISFETs, and the gate electrodes 107 of the second low-voltage MISFETs, sidewalls 111 are formed. Then, using the gate electrodes 105 of the high-voltage MISFETs, the gate electrodes 106 of the first low-voltage MISFETs, the gate electrodes 107 of the second low-voltage MISFETs, and the sidewalls 111 as a mask, an n-type impurity is introduced into the semiconductor substrate 101 by an ion implantation method to form heavily doped diffusion layers 112.

Next, by a self alignment method, over the gate electrodes 105, 106, and 107 and in the upper surfaces of the heavily doped diffusion layers 112, silicide layers 113 are formed. Then, an interlayer insulating film which covers the high-voltage MISFETs, the first low-voltage MISFETs, and the second low-voltage MISFETs, interconnect wires, and the like are formed.

Note that the sidewall lengths of the sidewalls 111 formed over the respective surfaces of the gate electrodes 105 of the high-voltage MISFETs, the gate electrodes 106 of the first low-voltage MISFETs, and the gate electrodes 107 of the second low-voltage MISFETs are determined by performance required of the second low-voltage MISFETs which are the shortest in gate length and the highest in layout density. Therefore, by performing ion implantation in forming the lightly doped diffusion layers 108 of the high-voltage MISFETs, the lightly doped diffusion layers 109 of the first low-voltage. MISFETs, and the lightly doped diffusion layers 110 of the second low-voltage MISFETs in different process steps and appropriately using optimum ion implantation conditions (such as implantation energy and dose), performances required of the high-voltage MISFETs, the first low-voltage MISFETs, and the second low-voltage MISFETs are satisfied.

However, the problem has arisen that, in each of the high-voltage MISFETs, an electric field between the gate electrode 105 and each of the silicide layers 113 formed in the upper surfaces of the heavily doped diffusion layers 112 becomes intense to increase leakage currents between the gate electrode 105 and the heavily doped diffusion layers 112 and between the heavily doped diffusion layers 112 and the semiconductor substrate 101.

To solve the problem, the present inventors have studied the approach of setting the sidewall lengths of the sidewalls of the high-voltage MISFETs longer than, the sidewall lengths of the sidewalls of the first and second low-voltage MISFETs.

Figure 49:
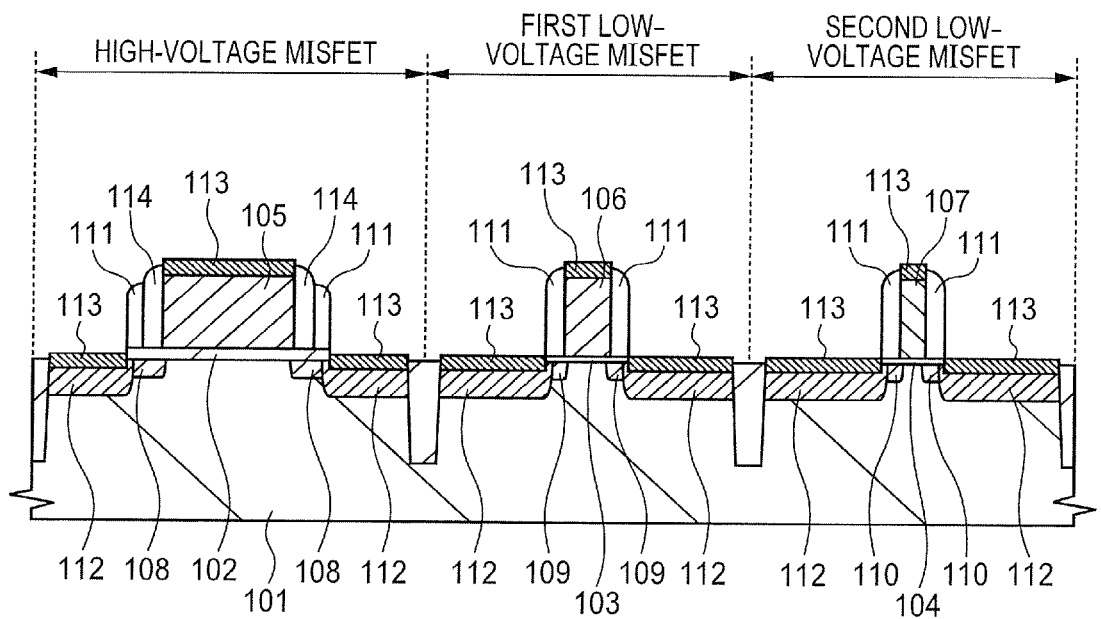
FIG. 49 is a main-portion cross-sectional view of the semiconductor device (high-voltage MISFETs and low-voltage MISFETs) studied by the present inventors, which illustrates a second example of the method of manufacturing the semiconductor device.

A second example of the method of manufacturing the high-voltage MISFETs and the low-voltage MISFETs each studied by the present inventors will be described below using FIG. 49. The structures of the first and second low-voltage MISFETs are substantially the same as the structures shown in FIG. 48 described above. By contrast, in each of the high-voltage MISFETs, the two-layer sidewalls 111 and 114 are formed over the side surfaces of the gate electrode 105. Accordingly, in the high-voltage MISFET, the distance between the gate electrode 105 and each of the silicide layers 113 formed in the upper surfaces of the heavily doped diffusion layers 112 is increased to weaken the electric field. This has allowed reductions in the leakage currents between the gate electrode 105 and the heavily doped diffusion layers 112 and between the heavily doped diffusion layers 112 and the semiconductor substrate 101.

However, as semiconductor devices have been more highly integrated, in each of the first low-voltage MISFETs also, a demand for particularly reducing leakage currents between the gate electrode 106 and the heavily doped diffusion layers 112 has become stronger.

Accordingly, the present inventors have further studied the approach of setting the sidewall lengths of the sidewalls of the first low-voltage MISFETs longer than the sidewall lengths of the sidewalls of the second low-voltage MISFETs.

Figure 50:
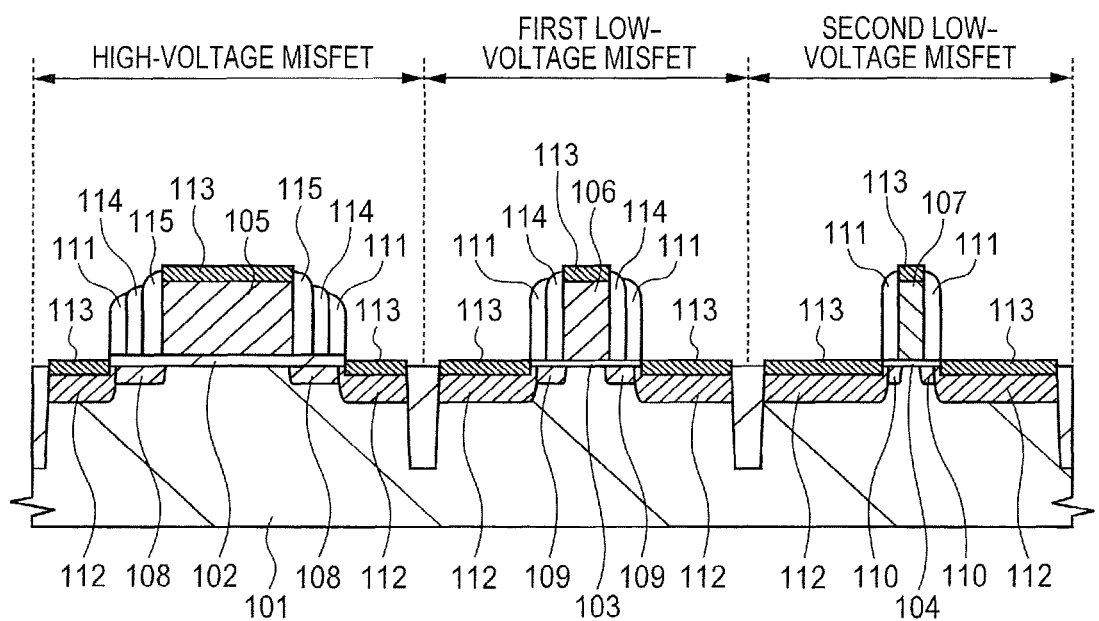
FIG. 50 is a main-portion cross-sectional view of the semiconductor device (high-voltage MISFETs and low-voltage MISFETs) studied by the present inventors, which illustrates a third example of the method of manufacturing the semiconductor device.

A third example of the method of manufacturing the high-voltage MISFETs and the low-voltage MISFETs each studied by the present inventors will be described below using FIG. 50. The structure of each of the second low-voltage MISFETs is substantially the same as the structure shown in FIG. 48 described above. By contrast, in each of the first low-voltage MISFETs, the two-layer sidewalls 111 and 114 are formed over the side surfaces of the gate electrode 106 and, in each of the high-voltage MISFETs, the three-layer sidewalls 111, 114, and 115 are formed over the side surfaces of the gate electrode 105. Accordingly, in the first low-voltage MISFET, the electric field between the gate electrode 106 and each of the heavily doped diffusion layers 112 is weakened and, in the high-voltage MISFET, the electric field between the gate electrode 105 and each of the heavily doped diffusion layers 112 is further weakened to allow reductions in the respective leakage currents.

Figure 51:
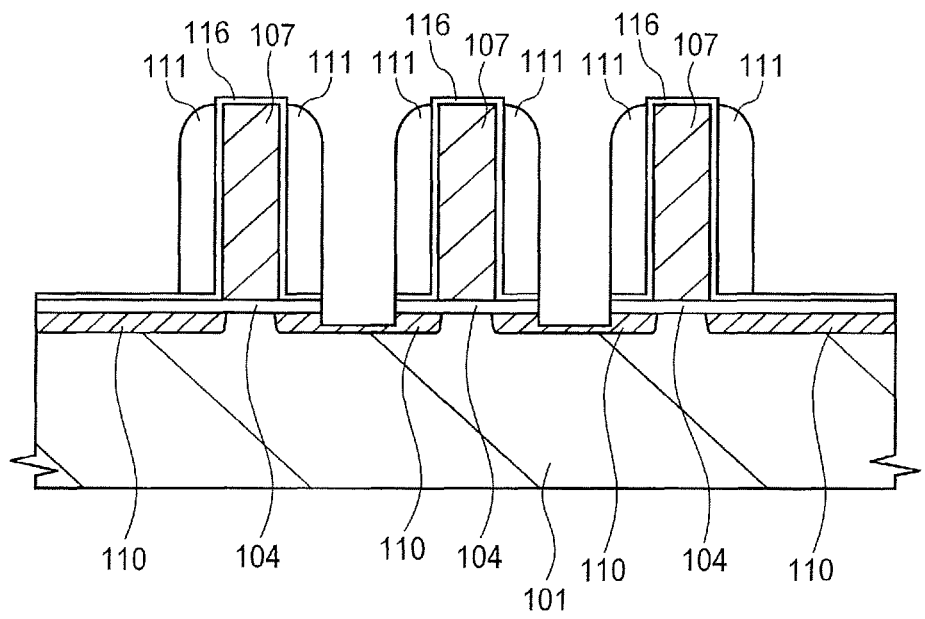
FIG. 51 is a main-portion cross-sectional view of the semiconductor device, which illustrates a processing defect in the process of manufacturing the semiconductor device found by the present inventors.

However, as shown in FIG. 51, the problem has arisen that, in the second low-voltage MISFET, a part of the semiconductor substrate 101 between the adjacent gate electrodes 107 is cut. The following is a conceivable reason for this.

When the foregoing two-layer sidewalls 111 and 114 and the foregoing three-layer sidewalls 111, 114, and 115 are formed, it is necessary to repeat the step of depositing an upper-layer insulating film (e.g., a silicon oxide film) for covering the gate electrodes 105 of the high-voltage MISFETs, the gate electrodes 106 of the first low-voltage MISFETs, and the gate electrodes 107 of the second low-voltage MISFETs over the main surface of the semiconductor substrate 101, and the step of etching back the upper-layer insulating film. Under the upper-layer insulating film, a lower-layer insulating film (e.g., a silicon nitride film) 116 which functions as an etching stopper is formed.

When the space between the adjacent gate electrodes 105 or between the adjacent gate electrodes 106 is relatively wide as in the high-voltage MISFET or the first low-voltage MISFET, the composition ratio of an etching gas when the upper-layer insulating film is etched back remains unchanged so that the etching selectivity of the upper-layer insulating film to the lower-layer insulating film 116 remains unchanged. Therefore, the etching of the upper-layer insulating film can be stopped by the lower-layer insulating film 116. By contrast, when the space between the adjacent gate electrodes 107 is relatively narrow as in the second low-voltage MISFET, various gases forming an etching gas do not equally enter the spaces between the adjacent gate electrodes 107 so that the composition ratio of the etching gas when the upper-layer insulating film is etched back is undesirably changed. Accordingly, the etching selectivity of the upper-layer insulating film to the lower-layer insulating film 116 gradually changes. As a result, it becomes difficult for the lower-layer insulating film 116 to stop the etching of the upper-layer insulating film so that the semiconductor substrate 101 is partially cut.

Embodiment 1

A method of producing a semiconductor device including first nMISFETs, first pMISFETs, second nMISFETs, second pMISFETs, third nMISFETs, and third pMISFETs which form a peripheral circuit according to Embodiment 1 will be described in the order of process steps using FIGS. 1 to 17. FIGS. 1 to 17 are main-portion cross-sectional views of an example of the first nMISFETs, the first pMISFETs, the second nMISFETs, the second pMISFETs, the third nMISFETs, and the third pMISFETs which are formed in the peripheral circuit region in the manufacturing steps of the semiconductor device. Each of the drawings shows a main-portion cross section in which channels are cut along the gate length directions of gate electrodes. In Embodiment 1, the first nMIS- FETs and the first pMISFETs are formed as, e.g., high-voltage MISFETs, the second nMISFETs and the second pMISFETs are formed as, e.g., low-leakage low-voltage MISFETs, and the third nMISFETs and the third pMISFETs are formed as, e.g., high-speed-operation low-voltage MISFETs.

Each of the high-voltage MISFETs forms, e.g., an input/output (I/O) circuit. Each of the low-voltage MISFETs forms a logic circuit such as, e.g., a PLL (Phase Locked Loop), a CPU (Central Processing Unit), or a processor. For the low-voltage MISFETs, various structures which are different in gate material, gate length, impurity concentrations in the source/drain regions thereof, layout density, or the like are used appropriately depending on operation characteristics required thereof. Here, the low-leakage low-voltage MISFETs of each of which a low-leakage operation is required (in each of which higher priority is given to a low-leakage operation than to a high-speed operation) and the high-speed-operation low-voltage MISFETs of each of which a high-speed operation is required (in each of which higher priority is given to a high-speed operation than to a low-leakage operation) are shown by way of example.

Each of the high-voltage MISFETs is driven with an applied voltage of, e.g., 3.3 to 5 V. The gate length of the gate electrode thereof is, e.g., 800 nm, and the sidewall lengths of sidewalls formed over the side surfaces of the gate electrode are, e.g., about 80 to 90 nm. Each of the low-leakage low-voltage MISFETs is driven with an applied voltage of, e.g., 1.2 V. The gate length of the gate electrode thereof is, e.g., about 55 nm, and the sidewall lengths of sidewalls formed over the side surfaces of the gate electrode are, e.g., about 40 to 50 nm. Each of the high-speed-operation low-voltage MISFETs is driven with an applied voltage of, e.g., 1.2 V. The gate length of the gate electrode thereof is, e.g., about 44 nm, and the sidewall lengths of sidewalls formed over the side surfaces of the gate electrode are, e.g., about 30 nm.

That is, the high-voltage MISFETs, the low-leakage low-voltage MISFETs, and the high-speed-operation low-voltage MISFETs are different in terms of structure, mainly gate length and layout density. The gate lengths of the high-voltage MISFETs are the longest, and the gate lengths of the low-leakage low-voltage MISFETs and the high-speed-operation low-voltage MISFETs are progressively shorter in this order. Also, the layout density of the high-voltage MISFETs is the lowest, and the layout densities of the low-leakage low-voltage MISFETs and the high-speed-operation low-voltage MISFETs are progressively higher in this order.

First, as shown in FIG. 1, in the main surface of a semiconductor substrate (which is a thin plate of a semiconductor having a generally circular plan view shape and called a semiconductor wafer at this stage) 1, e.g., a trench-shaped isolation portion STI, active regions located so as to be surrounded thereby, and the like are formed. That is, after an isolation trench is formed in a predetermined portion of the semiconductor substrate 1, an insulating film made of, e.g., a silicon oxide or the like is deposited over the main surface of the semiconductor substrate 1. The insulating film is further polished by a CMP (Chemical Mechanical Polishing) method or the like so as to remain only in the isolation trench and thus embedded in the isolation trench. In this manner, the isolation portion STI is formed.

Next, an n-type impurity is ion-implanted into the semiconductor substrate 1 to form an n-type embedded well NISO. Subsequently, a p-type impurity is selectively ion-implanted into the semiconductor substrate 1 in a first nMISFET region to form a p-type well HPW, while an n-type impurity is selectively ion-implanted into the semiconductor substrate 1 in a first pMISFET region to form an n-type well HNW. Likewise, a p-type impurity is selectively ion-implanted into the semiconductor substrate 1 in a second nMISFET region and a third nMISFET region to form p-type wells PW, while an n-type impurity is selectively ion-implanted into the semiconductor substrate 1 in a second pMISFET region and a third pMISFET region to form n-type wells NW.

Next, into the semiconductor substrate 1 in the first nMISFET region, the first pMISFET region, the second nMISFET region, the second pMISFET region, the third nMISFET region, and the third pMISFET region, predetermined impurities are respectively ion-implanted. Thus, in the semiconductor substrate 1 in the first nMISFET region, the first pMISFET region, the second nMISFET region, the second pMISFET region, the third nMISFET region, and the third pMISFET region, channel-formation semiconductor regions D1, D2, D3, D4, D5, and D6 are respectively formed.

Next, by performing oxidation treatment on the semiconductor substrate 1, a gate insulating film 4A made of, e.g., a silicon oxide and having a thickness of about 10 to 20 nm is formed over the main surface of the semiconductor substrate 1. Subsequently, the gate insulating film 4A in the second nMISFET region, the second pMISFET region, the third nMISFET region, and the third pMISFET region is removed therefrom. Thereafter, oxidation treatment is performed on the semiconductor substrate 1. Thus, over the main surface of the semiconductor substrate 1 in the second nMISFET region, the second pMISFET region, the third nMISFET region, and the third pMISFET region, a gate insulating film 4 made of, e.g., a silicon oxide and having a thickness of about 1 to 5 nm is formed. The gate insulating film 4 is not limited to a silicon oxide film. The gate insulating film 4 may also be formed of a high-dielectric-constant film of a hafnium oxide (HfSiON) or the like.

Figure 2:
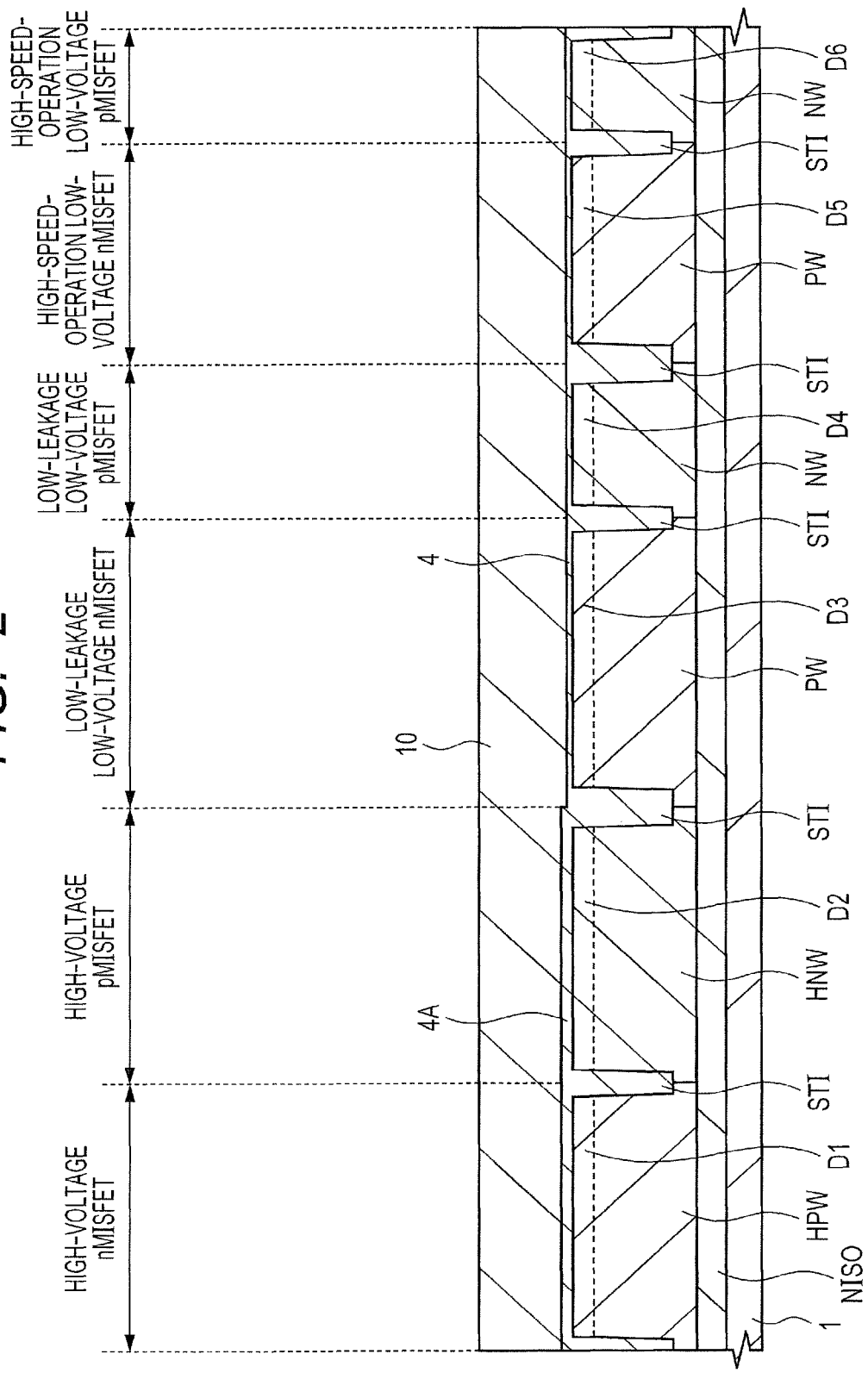
FIG. 2 is a main-portion cross-sectional view of the same portion of the semiconductor device as shown in FIG. 1 in a manufacturing step of the semiconductor device, which is subsequent to FIG. 1.

Next, as shown in FIG. 2, over the main surface of the semiconductor substrate 1, a conductive film 10 made of, e.g., amorphous silicon is deposited by a CVD (Chemical Vapor Deposition) method. The thickness of the conductive film 10 is, e.g., about 100 nm.

Figure 3:
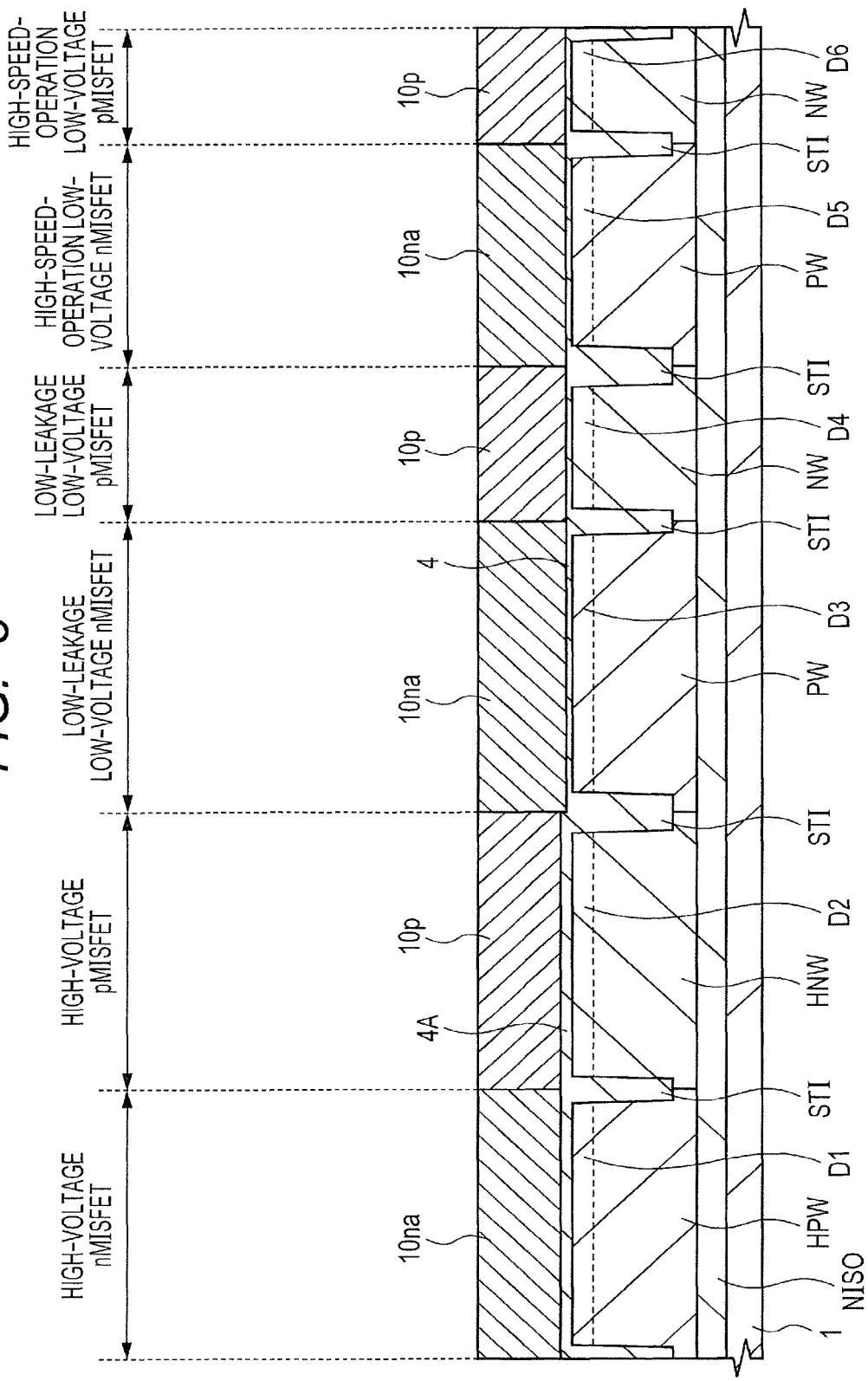
FIG. 3 is a main-portion cross-sectional view of the same portion of the semiconductor device as shown in FIG. 1 in a manufacturing step of the semiconductor device, which is subsequent to FIG. 2.

Next, as shown in FIG. 3, an n-type impurity is introduced into the conductive film 10 in the first nMISFET region, the second nMISFET region, and the third nMISFET region by an ion implantation method or the like to form n-type conductive films 10na. On the other hand, a p-type impurity is introduced into the conductive film 10 in the first pMISFET region, the second pMISFET region, and the third pMISFET region by an ion implantation method or the like to form p-type conductive films 10p.

Figure 4:
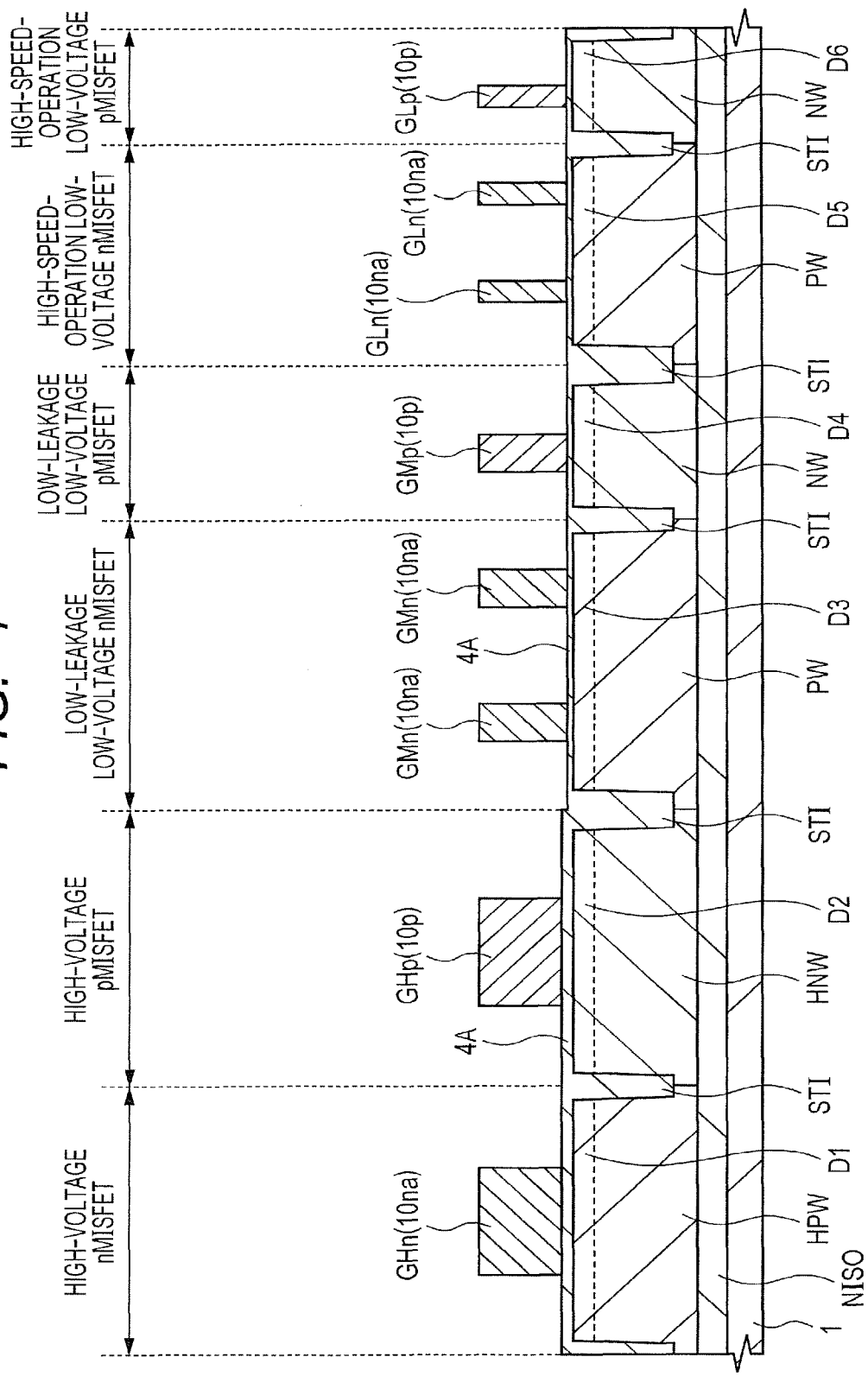
FIG. 4 is a main-portion cross-sectional view of the same portion of the semiconductor device as shown in FIG. 1 in a manufacturing step of the semiconductor device, which is subsequent to FIG. 3.

Next, as shown in FIG. 4, the conductive films 10na and 10p are patterned using photolithography and dry etching to form gate electrodes GHn of the first nMISFETs each made of the conductive film 10na, gate electrodes GHp of the first pMISFETs each made of the conductive film 10p, gate electrodes GMn of the second nMISFETs each made of the conductive film 10na, gate electrodes GMp of the second pMISFETs each made of the conductive film 10p, gate electrodes GLn of the third nMISFETs each made of the conductive film 10na, and gate electrodes GLp of the third pMISFETs each made of the conductive film 10p.

In the active region, the gate lengths of the gate electrodes GHn of the first nMISFETs and the gate electrodes GHp of the first pMISFETs are, e.g., about 800 nm. In the active region, the gate lengths of the gate electrodes GMn of the second nMISFETs and the gate electrodes GMp of the second pMISFETs are, e.g., about 55 nm, and the minimum spacing between the adjacent gate electrodes GMn, between the adjacent gate electrodes GMn and GMp, and between the adjacent gate electrodes GMp is, e.g., about 110 nm. In the active region, the gate lengths of the gate electrodes GLn of the third nMISFETs and the gate electrodes GLp of the third pMIS-FETs are, e.g., about 44 nm, and the minimum spacing between the adjacent gate electrodes GLn, between the adjacent gate electrodes GLn and GLp, and between the adjacent gate electrodes GLp is, e.g., about 88 nm.

Figure 5:
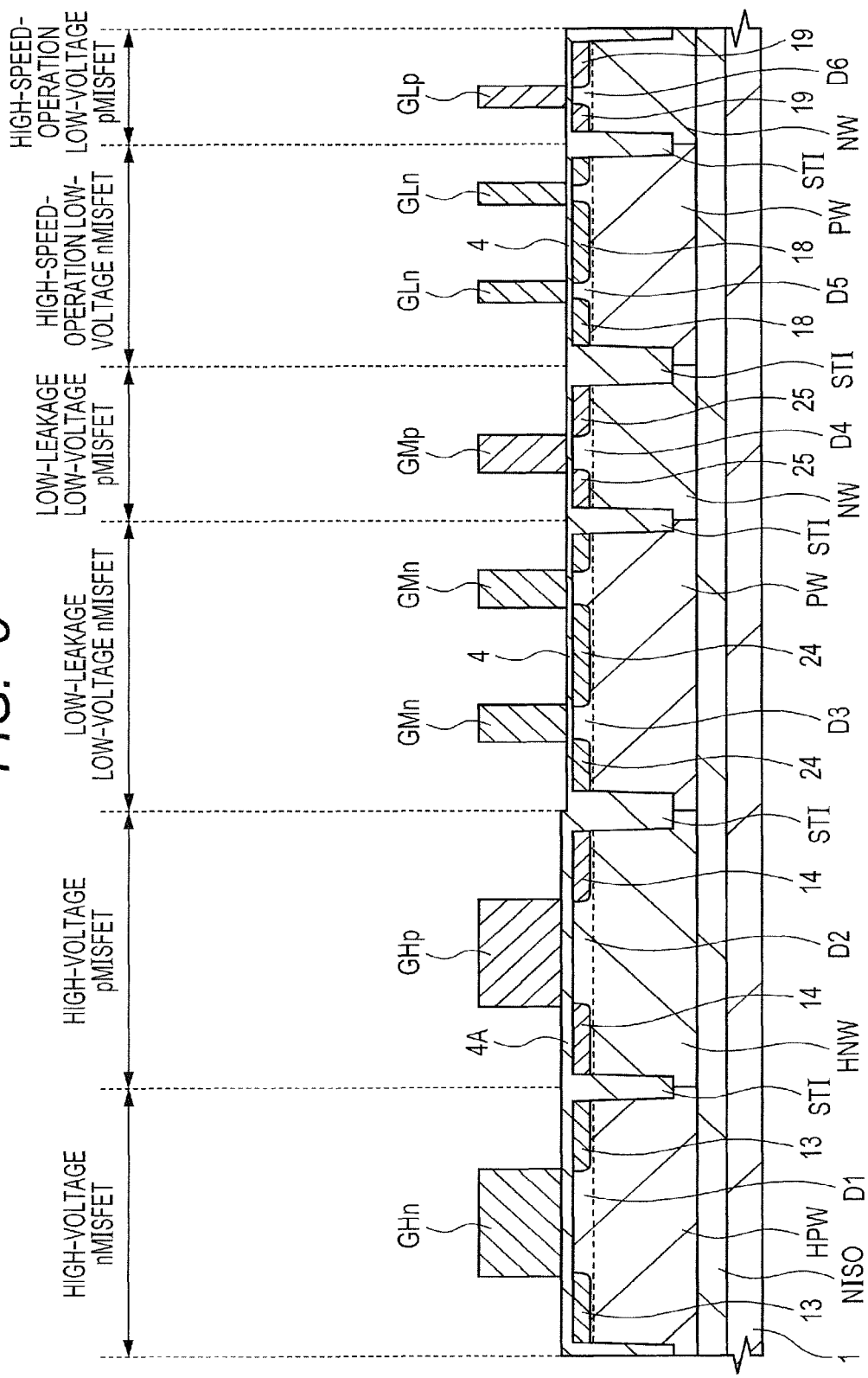
FIG. 5 is a main-portion cross-sectional view of the same portion of the semiconductor device as shown in FIG. 1 in a manufacturing step of the semiconductor device, which is subsequent to FIG. 4.

Next, as shown in FIG. 5, into the main surface of the semiconductor substrate 1 in the first nMISFET region, an n-type impurity, e.g., arsenic is ion-implanted to form n⁻-type semiconductor regions 13 in the main surface of the semiconductor substrate 1 in the first nMISFET region by self-alignment with respect to the gate electrodes GHn. Likewise, into the main surface of the semiconductor substrate 1 in the first pMISFET region, a p-type impurity, e.g., a boron fluoride is ion-implanted to form p⁻-type semiconductor regions 14 in the main surface of the semiconductor substrate 1 in the first pMISFET region by self-alignment with respect to the gate electrodes GHp.

Next, into the main surface of the semiconductor substrate 1 in the second nMISFET region, an n-type impurity, e.g., arsenic is ion-implanted to form n⁻-type semiconductor regions 24 in the main surface of the semiconductor substrate 1 in the second nMISFET region by self-alignment with respect to the gate electrodes GMn. Likewise, into the main surface of the semiconductor substrate 1 in the second pMISFET region, a p-type impurity, e.g., a boron fluoride is ion-implanted to form p⁻-type semiconductor regions 25 in the main surface of the semiconductor substrate 1 in the second pMISFET region by self-alignment with respect to the gate electrodes GMp.

Next, into the main surface of the semiconductor substrate 1 in the third nMISFET region, an n-type impurity, e.g., arsenic is ion-implanted to form n⁻-type semiconductor regions 18 in the main surface of the semiconductor substrate 1 in the third nMISFET region by self-alignment with respect to the gate electrodes GLn. Likewise, into the main surface of the semiconductor substrate 1 in the third pMISFET region, a p-type impurity such as, e.g., a boron fluoride is ion-implanted to form p⁻-type semiconductor regions 19 in the main surface of the semiconductor substrate 1 in the third pMISFET region by self-alignment with respect to the gate electrodes GLp.

Figure 6:
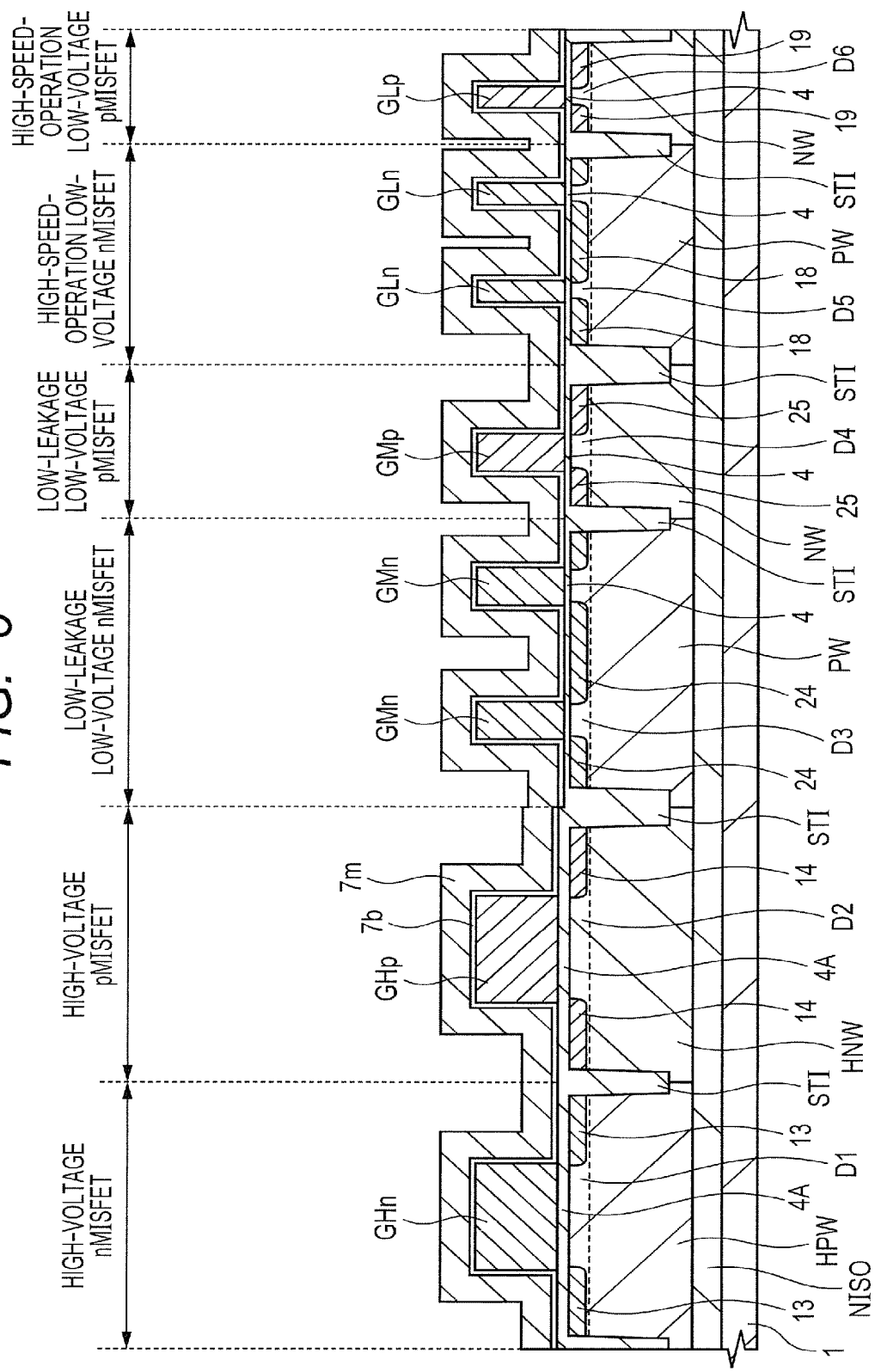
FIG. 6 is a main-portion cross-sectional view of the same portion of the semiconductor device as shown in FIG. 1 in a manufacturing step of the semiconductor device, which is subsequent to FIG. 5.

Next, as shown in FIG. 6, over the main surface of the semiconductor substrate 1, a first insulating film (e.g., silicon nitride film) 7b is deposited by a CVD method. The thickness of the first insulating film 7b is, e.g., about 10 nm. Subsequently, over the first insulating film 7b, a second insulating film (e.g., silicon oxide film) 7m is formed by a CVD method. The thickness of the second insulating film 7m is, e.g., about 50 to 60 nm. Here, a material for the first insulating film 7b and a material for the second insulating film 7m are selectively determined to provide a high dry etching selectivity and a high wet etching selectivity (ratios between the etching speeds of the first insulating film 7b and the etching speeds of the second insulating film 7m). The respective thicknesses of the first insulating film 7b and the second insulating film 7m are set so as to approach the sidewall lengths (e.g., about 80 to 90 nm) of the sidewalls formed over the respective side surfaces of the gate electrodes GHn of the first nMISFETs and the gate electrodes GHp of the first pMISFETs as target values.

Figure 7:
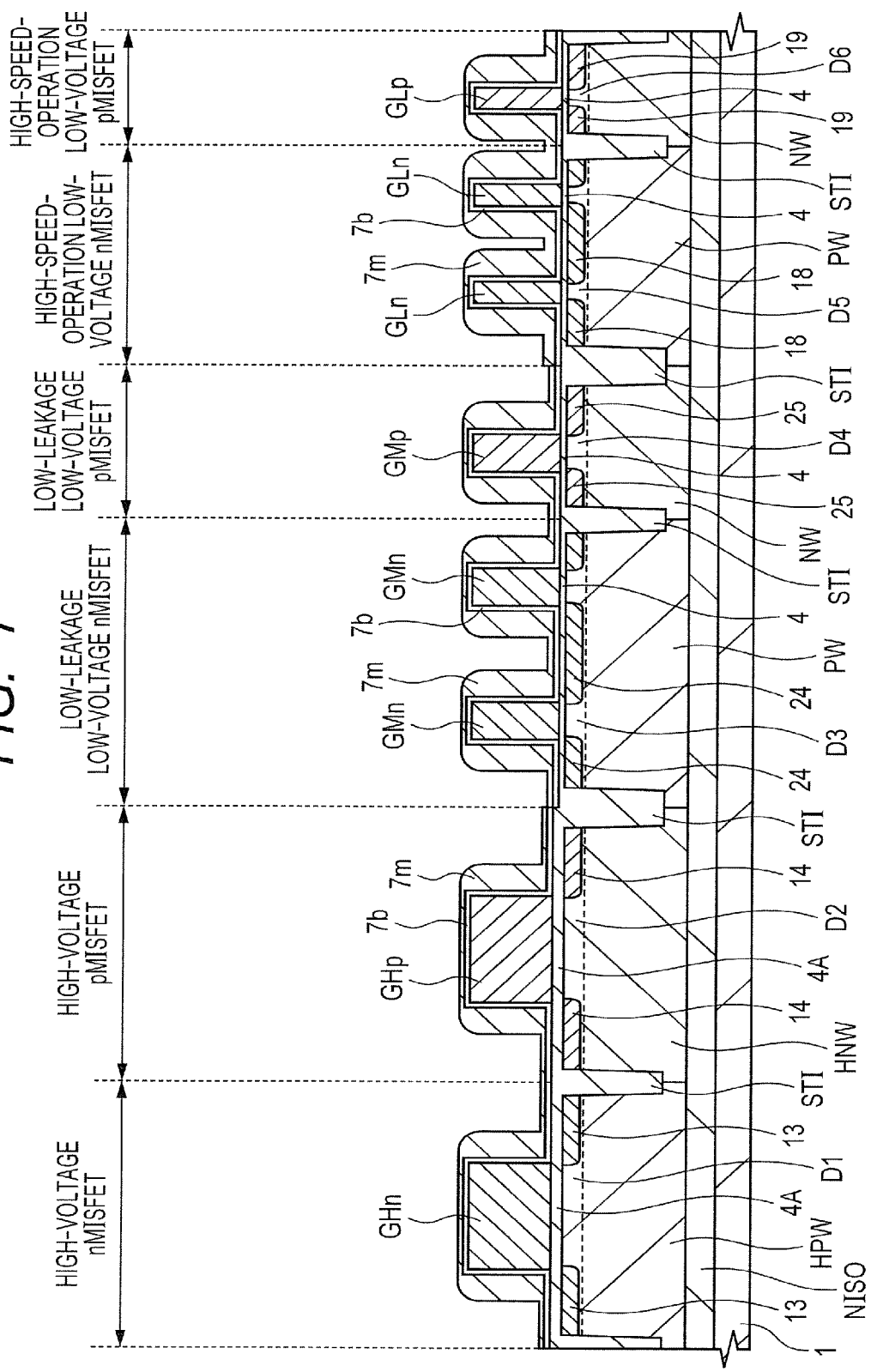
FIG. 7 is a main-portion cross-sectional view of the same portion of the semiconductor device as shown in FIG. 1 in a manufacturing step of the semiconductor device, which is subsequent to FIG. 6.

Next, as shown in FIG. 7, the second insulating film 7m is etched back by anisotropic dry etching. Thus, the second insulating film 7m over the respective upper surfaces of the gate electrodes GHn of the first nMISFETs, the gate electrodes GHp of the first pMISFETs, the gate electrodes GMn of the second nMISFETs, the gate electrodes GMp of the second pMISFETs, the gate electrodes GLn of the third nMISFETs, and the gate electrodes GLp of the third pMISFETs and over the main surface of the semiconductor substrate 1 where the gate electrodes GHn, GHp, GMn, GMp, GLn, and GLp are not formed is removed completely or such that a part thereof (corresponding to e.g., about 1 to 3 nm) remains.

At this time, even when the second insulating film 7m over the upper surfaces of the gate electrodes GHn and GHp and over the main surface of the semiconductor substrate 1 where the gate electrodes GHn and GHp are not formed is removed completely in the first nMISFET region and the first pMISFET region, the second insulating film 7m may remain over the main surface of the semiconductor substrate 1 where the gate electrodes GLn and GLp are not formed in the third nMISFET region and the third pMISFET region. The conceivable reasons for this include the second insulating film 7m which is embedded in the spaces between the adjacent gate electrodes GLn, between the adjacent gate electrodes GLn and GLp, and between the adjacent gate electrodes GLp, and the composition ratio of an etching gas used for the anisotropic dry etching which gradually changes to reduce the etching speed.

In such a case, it may also be possible to perform wet etching after performing the anisotropic dry etching and remove the second insulating film 7m remaining over the main surface of the semiconductor substrate 1 where the gate electrodes GLn and GLp are not formed. Even when the second insulating film 7m is embedded in the spaces between the adjacent gate electrodes GLn, between the adjacent gate electrodes GLn and GLp, and between the adjacent gate electrodes GLp, an etchant can enter the second insulating film 7m from an interfacial surface in contact with the surface of the second insulating film 7m due to capillary and remove the second insulating film 7m remaining over the main surface of the semiconductor substrate 1 where the gate electrodes GLn and GLp are not formed.

Figure 8:
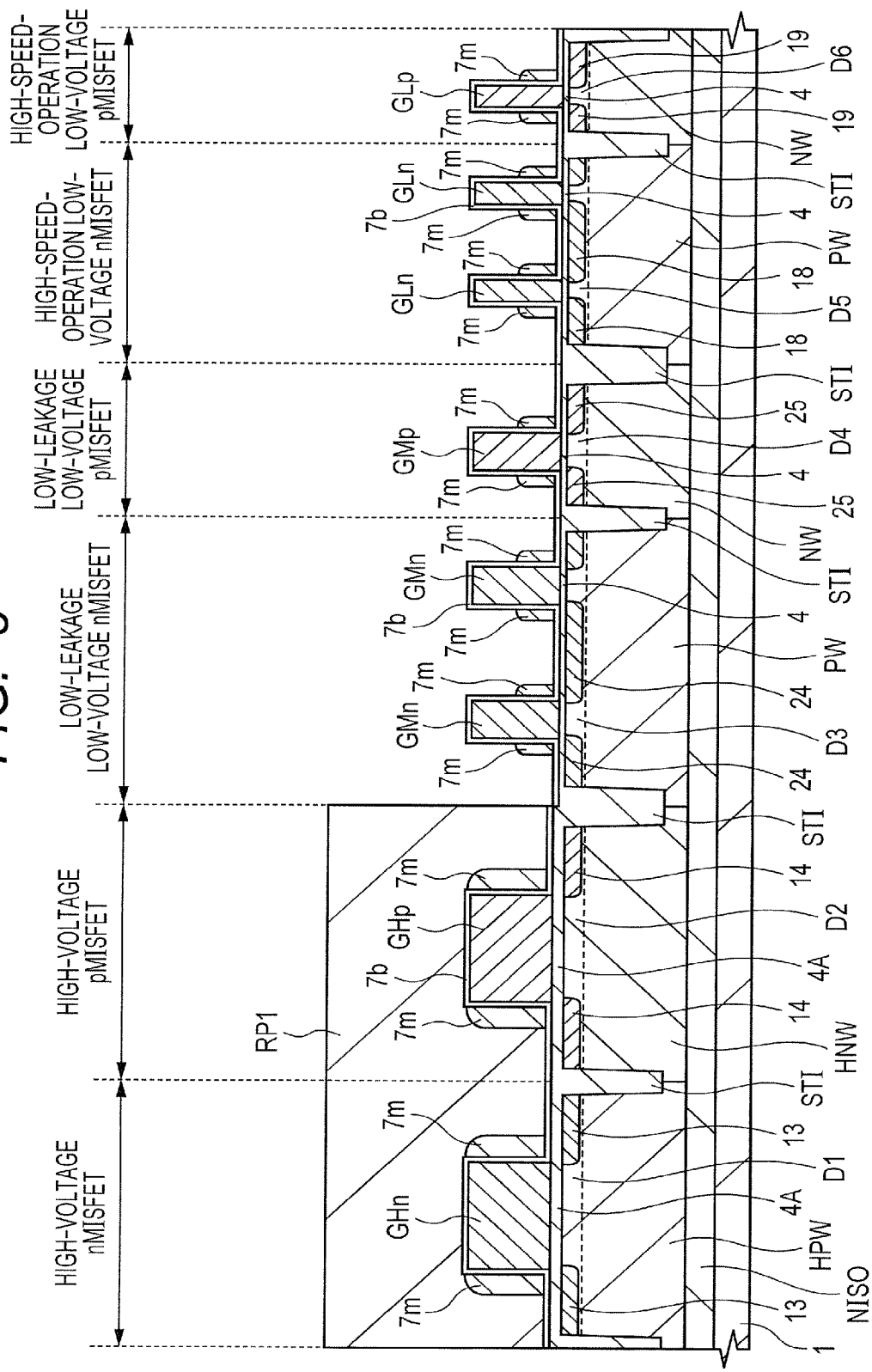
FIG. 8 is a main-portion cross-sectional view of the same portion of the semiconductor device as shown in FIG. 1 in a manufacturing step of the semiconductor device, which is subsequent to FIG. 7.

Next, as shown in FIG. 8, the first nMISFET region and the first pMISFET region are covered with a photoresist pattern RP1, and the second insulating film 7m in the second nMISFET region, the second pMISFET region, the third nMISFET region, and the third pMISFET region is processed by isotropic wet etching or isotropic dry etching. Since isotropic etching is used, the second insulating film 7m is etched from above in a vertical direction and in a lateral direction.

Thus, over each of the side surfaces of the gate electrodes GMn of the second nMISFETs, the gate electrodes GMp of the second pMISFETs, the gate electrodes GLn of the third nMISFETs, and the gate electrodes GLp of the third pMISFETs, the second insulating film 7m having a width of about 20 to 30 nm in the lateral direction (gate length direction) is left. Since the etching selectivity between the first insulating film 7b and the second insulating film 7m is high, the first insulating film 7b is unlikely to be etched, and therefore the main surface of the semiconductor substrate 1 is not partially cut.

Figure 9:
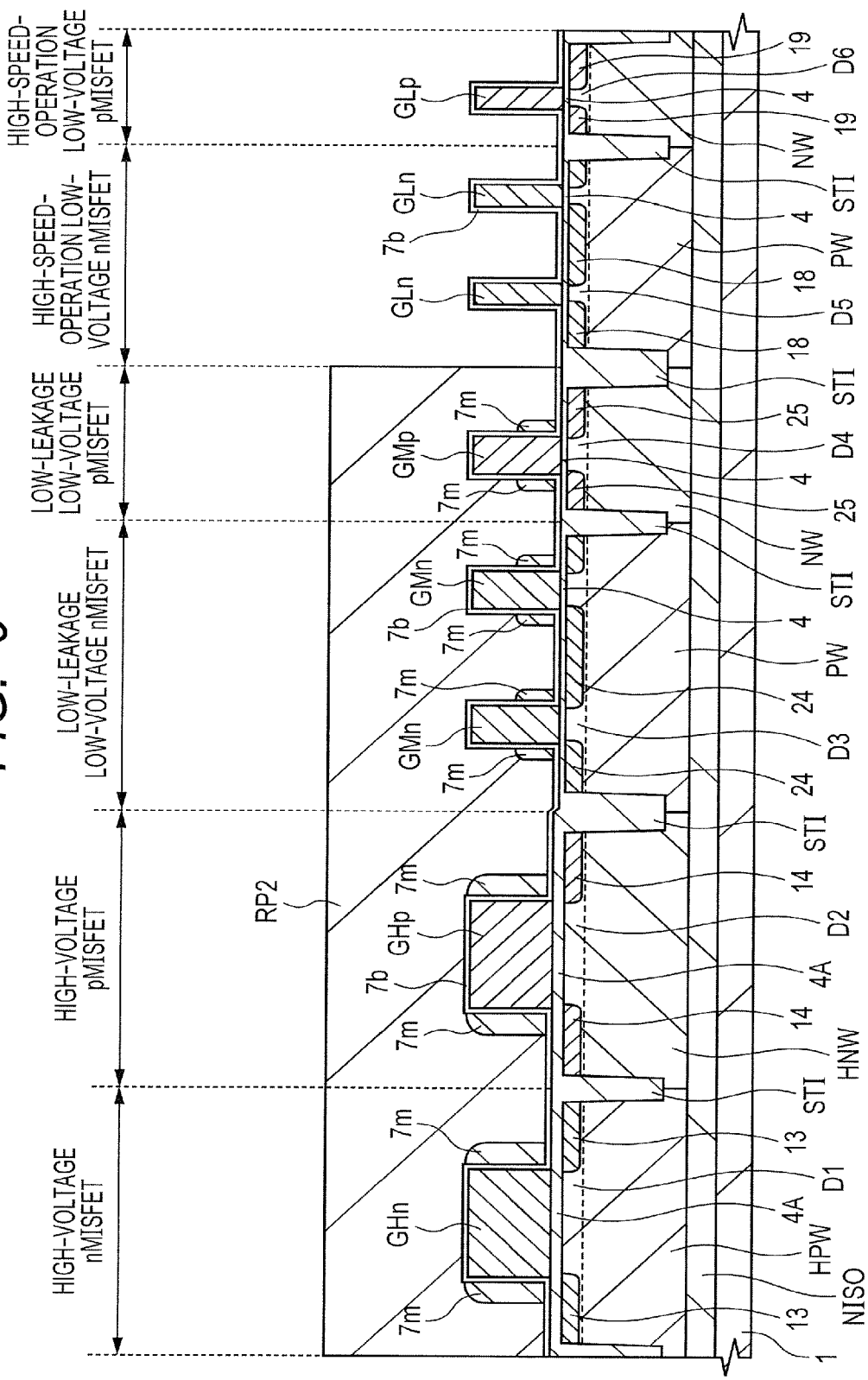
FIG. 9 is a main-portion cross-sectional view of the same portion of the semiconductor device as shown in FIG. 1 in a manufacturing step of the semiconductor device, which is subsequent to FIG. 8.

Next, as shown in FIG. 9, after the photoresist pattern RP1 is removed, the first nMISFET region, the first pMISFET region, the second nMISFET region, and the second pMISFET region are covered with a photoresist pattern RP2, and the second insulating film 7m in the third nMISFET region and the third pMISFET region is removed by isotropic wet etching. In the same manner as in the previous step, the etching selectivity between the first insulating film 7b and the second insulating film 7m is high so that the first insulating film 7b is unlikely to be etched, and therefore the main surface of the semiconductor substrate 1 is not partially cut.

Figure 10:
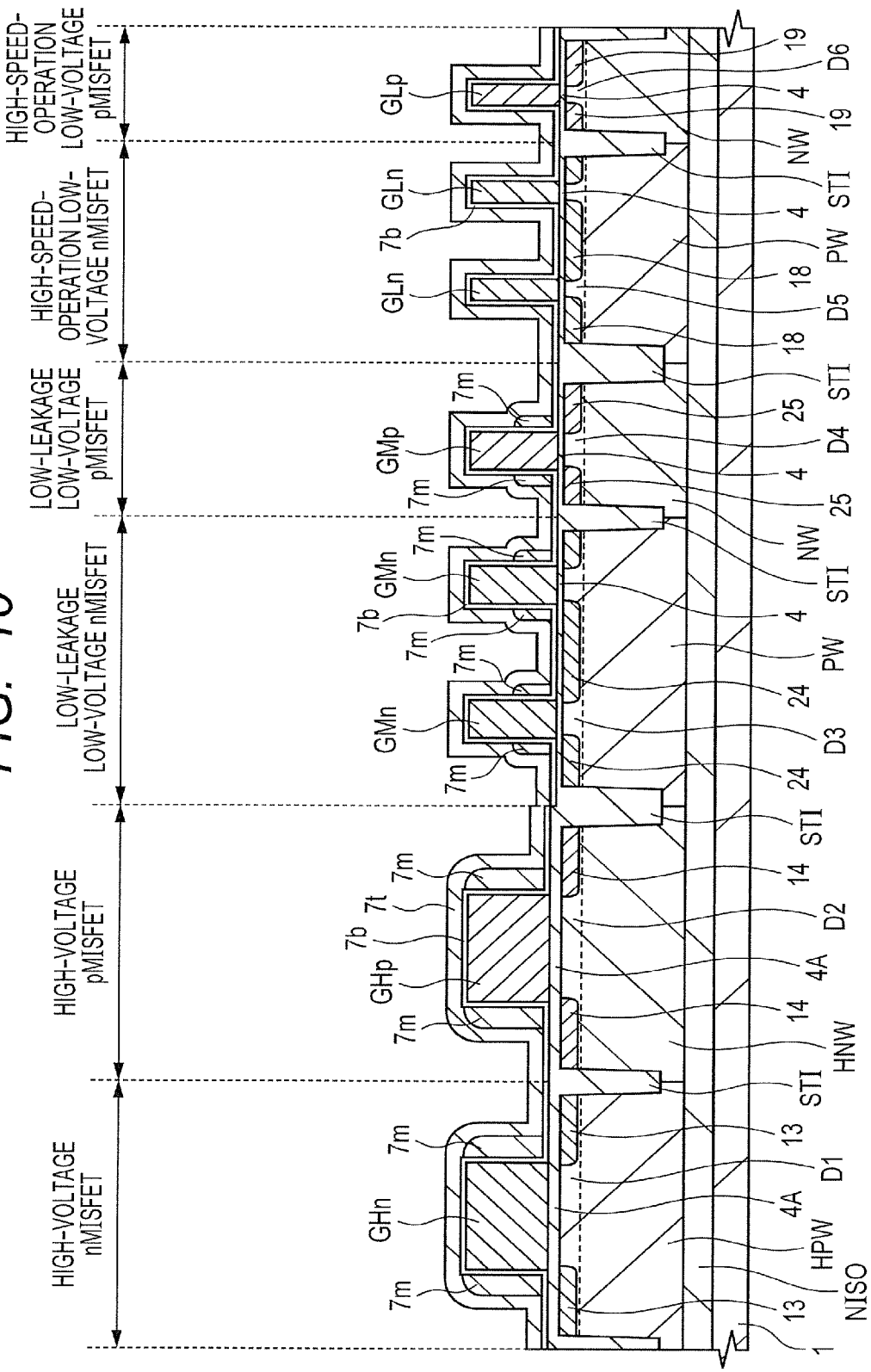
FIG. 10 is a main-portion cross-sectional view of the same portion of the semiconductor device as shown in FIG. 1 in a manufacturing step of the semiconductor device, which is subsequent to FIG. 9.

Next, as shown in FIG. 10, after the photoresist pattern RP2 is removed, a third insulating film (e.g., silicon oxide film) 7t is deposited over the main surface of the semiconductor substrate 1 by a CVD method. The thickness of the third insulating film 7t is, e.g., about 20 to 30 nm. The thickness of the third insulating film 7t is set so as to approach the sidewall lengths (e.g., about 30 nm) of the sidewalls formed over the respective side surfaces of the gate electrodes GLn of the third nMISFETs and the gate electrodes GLp of the third pMISFETs as target values.

Figure 11:
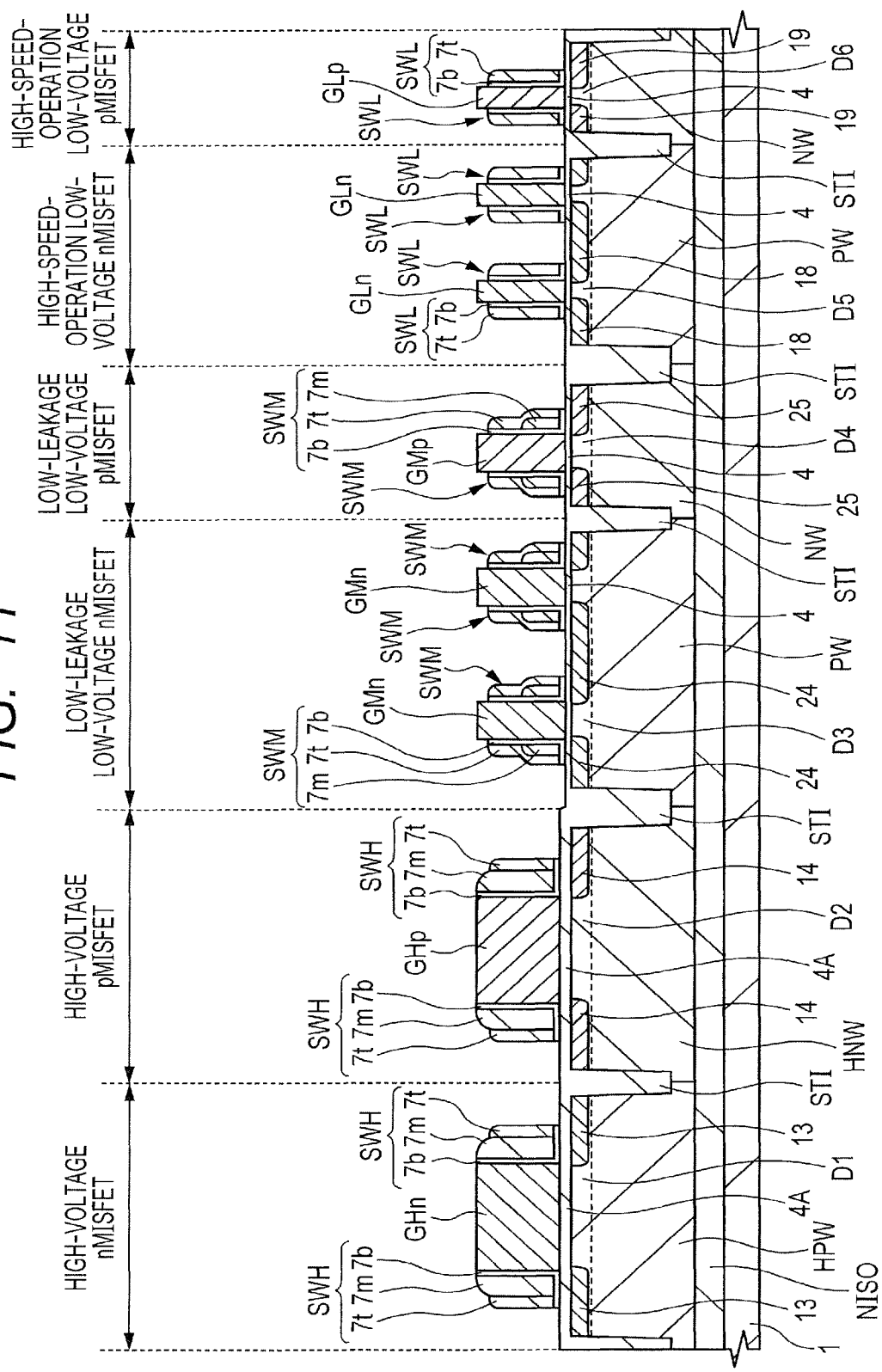
FIG. 11 is a main-portion cross-sectional view of the same portion of the semiconductor device as shown in FIG. 1 in a manufacturing step of the semiconductor device, which is subsequent to FIG. 10.

Next, as shown in FIG. 11, after the third insulating film 7t is etched back by anisotropic dry etching, the exposed first insulating film 7b is removed by dry etching or wet etching. Thus, in the first nMISFETs and the first pMISFETs, sidewalls SWH each including the first insulating film 7b, the second insulating film 7m, and the third insulating film 7t are formed over the side surfaces of the gate electrodes GHn and GHp. Also, in the second nMISFETs and the second pMISFETs, sidewalls SWM each including the first insulating film 7b, the second insulating film 7m, and the third insulating film 7t are formed over the side surfaces of the gate electrodes GMn and GMp. On the other hand, in the third nMISFETs and the third pMISFETs, sidewalls SWL each including the first insulating film 7b and the third insulating film 7t are formed over the side surfaces of the gate electrodes GLn and GLp. The sidewall lengths of the foregoing sidewalls SWH are, e.g., about 80 to 90 nm. The sidewall lengths of the foregoing sidewalls SWM are, e.g., about 40 to 50 nm. The sidewall lengths of the foregoing sidewalls SWL are, e.g., about 30 nm.

By thus reducing the number of anisotropic etching steps in the manufacturing processes (of three kinds in Embodiment 1) for forming the plurality of sidewalls SWL, SWM, and SWH having different sidewall lengths and combining anisotropic dry etching with isotropic wet etching or isotropic dry etching, the foregoing sidewalls SWL, SWM, and SWH are formed. As a result, particularly in the third nMISFET region and the third pMISFET region where layout densities are high, the semiconductor substrate 1 can be prevented from being partially cut between the adjacent gate electrodes GLn, between the adjacent gate electrodes GLn and GLp, and between the adjacent gate electrodes GLp.

The heights of the sidewalls SWM formed over the side surfaces of the gate electrodes GMn and GMp of the second nMISFETs and the second pMISFETs from the main surface of the semiconductor substrate 1 are lower than the heights of the gate electrodes GMn and GMp from the main surface of the semiconductor substrate 1. Likewise, the heights of the sidewalls SWL formed over the side surfaces of the gate electrodes GLn and GLp of the third nMISFETs and the third pMISFETs from the main surface of the semiconductor substrate 1 are lower than the heights of the gate electrodes GLn and GLp from the main surface of the semiconductor substrate 1. The heights of the foregoing sidewalls SWM from the main surface of the semiconductor substrate 1 are the same as the heights of the foregoing sidewalls SWL from the main surface of the semiconductor substrate 1.

Thus, in the regions where the spacings between the adjacent gate electrodes are relative small, the heights of the foregoing sidewalls SWM and SWL from the main surface of the semiconductor substrate 1 are reduced to allow an improvement in the coverage (embeddedness) of an interlayer insulating film formed over the main surface of the semiconductor substrate 1 in the step described later. When the coverage (embeddedness) of the interlayer insulating film is improved, in the third nMISFET region and the third pMISFET region, the interlayer insulating film is more likely to enter the spaces between the adjacent gate electrodes GLn, between the adjacent gate electrodes GLn and GLp, and between the adjacent gate electrodes GLp, and a void (cavity) is less likely to be formed. If the void is formed, when contact holes are formed in the interlayer insulating film in the step described later, the contact holes suffer shape defects, which may cause a short-circuit between the adjacent contact holes.

On the other hand, the heights of the sidewalls SWH formed over the side surfaces of the gate electrodes GHn and GHp of the first nMISFETs and the first pMISFETs from the main surface of the semiconductor substrate 1 are substantially the same as the heights of the gate electrodes GHn and GHp from the main surface of the semiconductor substrate 1. In addition, the heights of the foregoing sidewalls SWH from the main surface of the semiconductor substrate 1 are higher than the heights of the foregoing sidewalls SWM and SWL from the main surface of the semiconductor substrate 1. Thus, the heights of the foregoing sidewalls SWH from the main surface of the semiconductor substrate 1 are not set as low as those of the other foregoing sidewalls SWM and SWL from the main surface of the semiconductor substrate 1 for the following reason. That is, since the layout densities of the first nMISFETs and the first pMISFETs are lower than the layout densities of the second nMISFETs, the second pMISFETs, the third nMISFETs, and the third pMISFETs, the coverage (embeddedness) of the interlayer insulating film formed over the main surface of the semiconductor substrate 1 in the step described later is excellent. Accordingly, there is no need to reduce the heights of the foregoing sidewalls SWH from the main surface of the semiconductor substrate 1.

Also, in the third nMISFETs and the third pMISFETs, the sidewall lengths of the sidewalls SWL formed over the side surfaces of the gate electrodes GLn and GLp are determined by the thickness of the third insulating film 7t, and etching conditions for the anisotropic dry etching of the third insulating film 7t. This leads to high layout densities and easy control of the operation characteristics of the third nMISFETs and the third pMISFETs which are each required to perform a high-speed operation.

Figure 12:
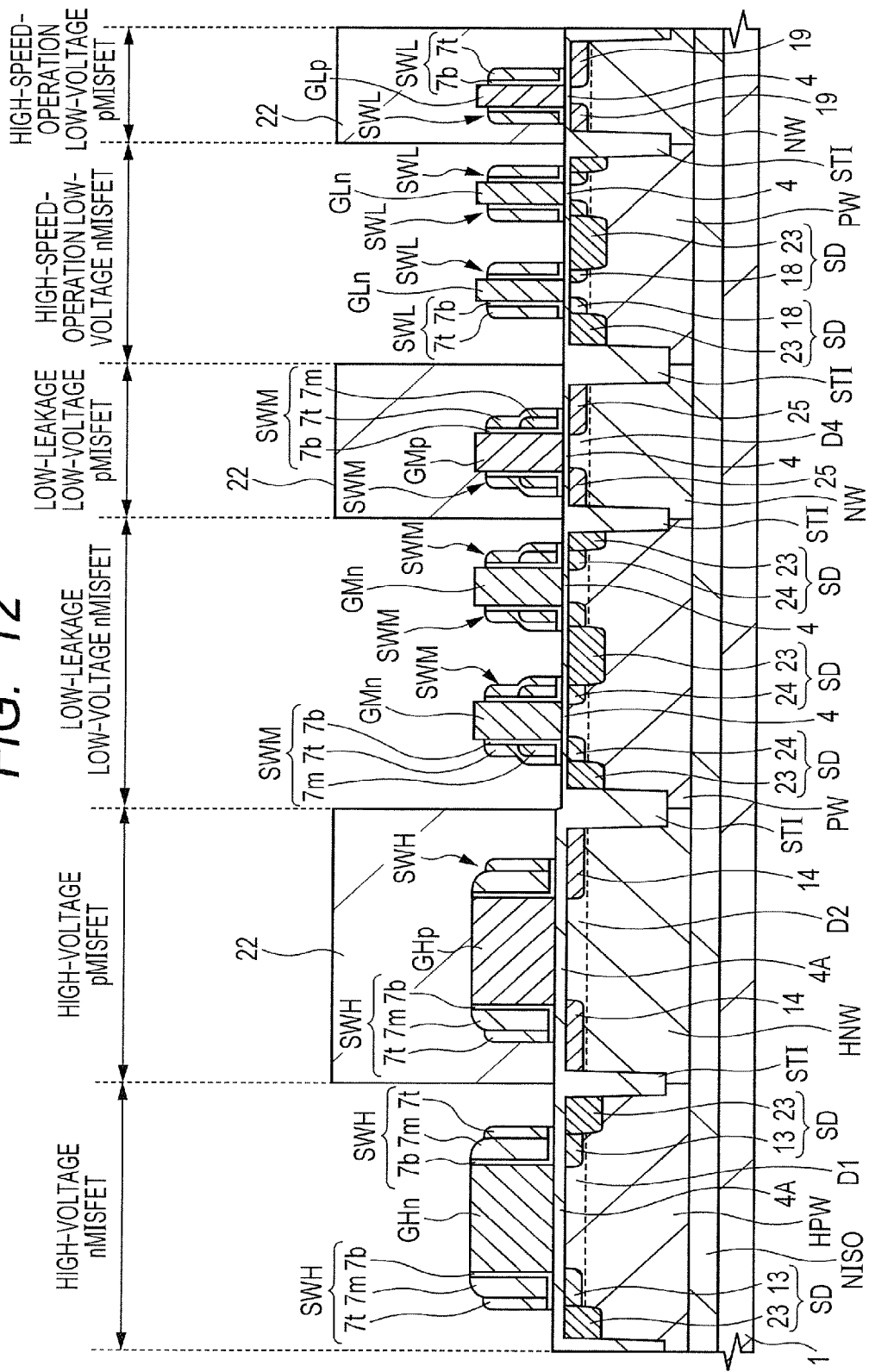
FIG. 12 is a main-portion cross-sectional view of the same portion of the semiconductor device as shown in FIG. 1 in a manufacturing step of the semiconductor device, which is subsequent to FIG. 11.

Next, as shown in FIG. 12, into the main surface of the semiconductor substrate 1 in the first nMISFET region, the second nMISFET region, and the third nMISFET region, n-type impurities, e.g., arsenic and phosphorus are ion implanted using a photoresist pattern 22 as a mask to form $n^+$-type semiconductor regions 23 by self-alignment with respect to the gate electrodes GHn of the first nMISFETs, the gate electrodes GMn of the second nMISFETs, and the gate electrodes GLn of the third nMISFETs.

Thus, source/drain regions SD of the first nMISFETs including the $n^-$-type semiconductor regions 13 and the $n^+$-type semiconductor regions 23 are formed, the source/drain regions SD of the second nMISFETs including the $n^-$-type semiconductor regions 24 and the $n^+$-type semiconductor regions 23 are formed, and the source/drain regions SD of the third nMISFETs including the $n^-$-type semiconductor regions 18 and the $n^+$-type semiconductor regions 23 are formed.

Figure 13:
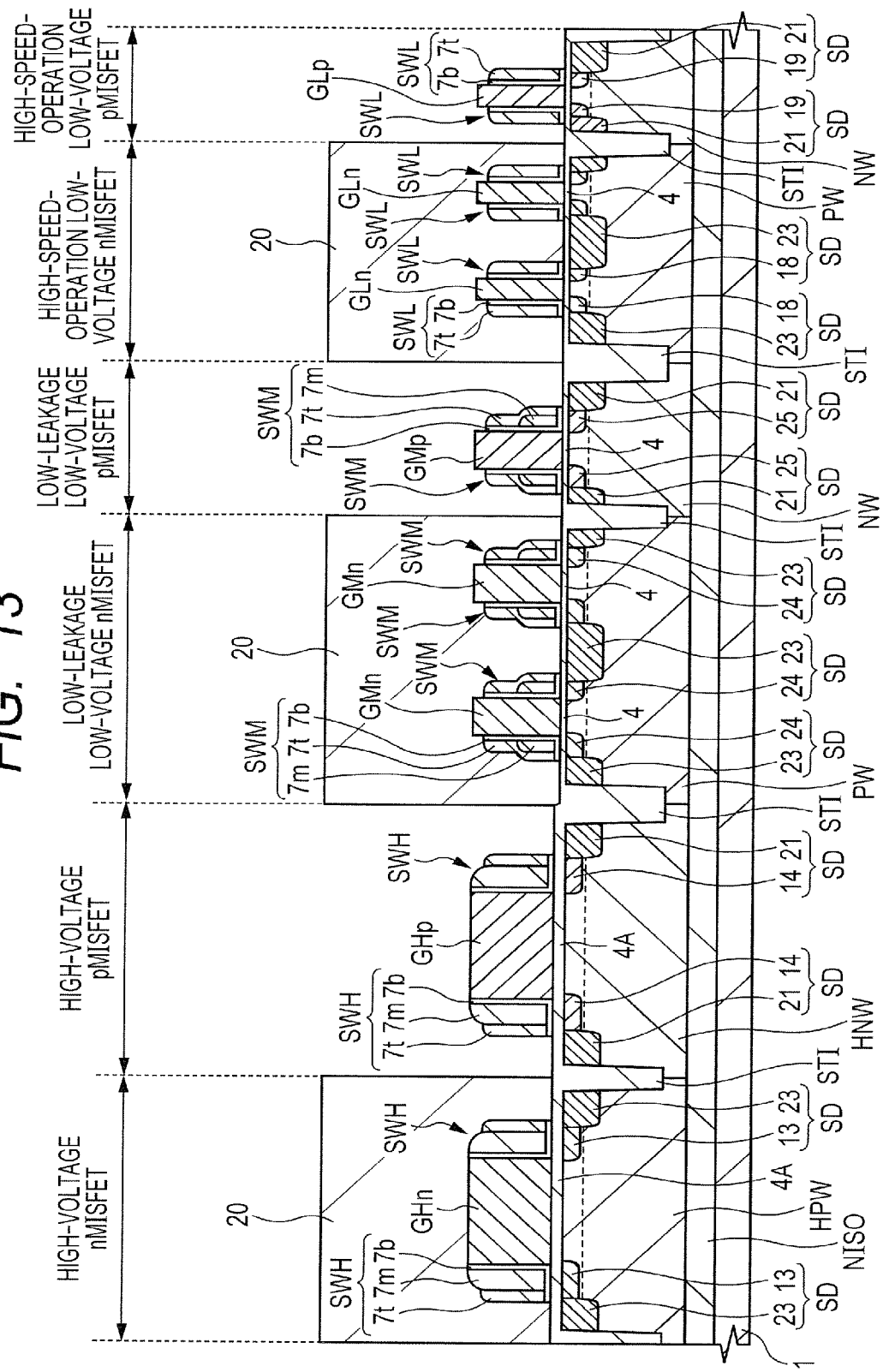
FIG. 13 is a main-portion cross-sectional view of the same portion of the semiconductor device as shown in FIG. 1 in a manufacturing step of the semiconductor device, which is subsequent to FIG. 12.

Next, as shown in FIG. 13, into the main surface of the semiconductor substrate 1 in the first pMISFET region, the second pMISFET region, and the third pMISFET region, a p-type impurity, e.g., boron or a boron fluoride is ion-implanted using a photoresist pattern 20 as a mask to form $p^+$-type semiconductor regions 21 by self-alignment with respect to the gate electrodes GHp of the first pMISFETs, the gate electrodes GMp of the second pMISFETs, and the gate electrodes GLp of the third pMISFETs.

Thus, the source/drain regions SD of the first pMISFETs including the p⁻-type semiconductor regions 14 and the p⁺-type semiconductor regions 21 are formed, the source/drain regions SD of the second pMISFETs including the p⁻-type semiconductor regions 25 and the p⁺-type semiconductor regions 21 are formed, and the source/drain regions SD of the third pMISFETs including the p⁻-type semiconductor regions 19 and the p⁺-type semiconductor region 21 are formed.

Figure 14:
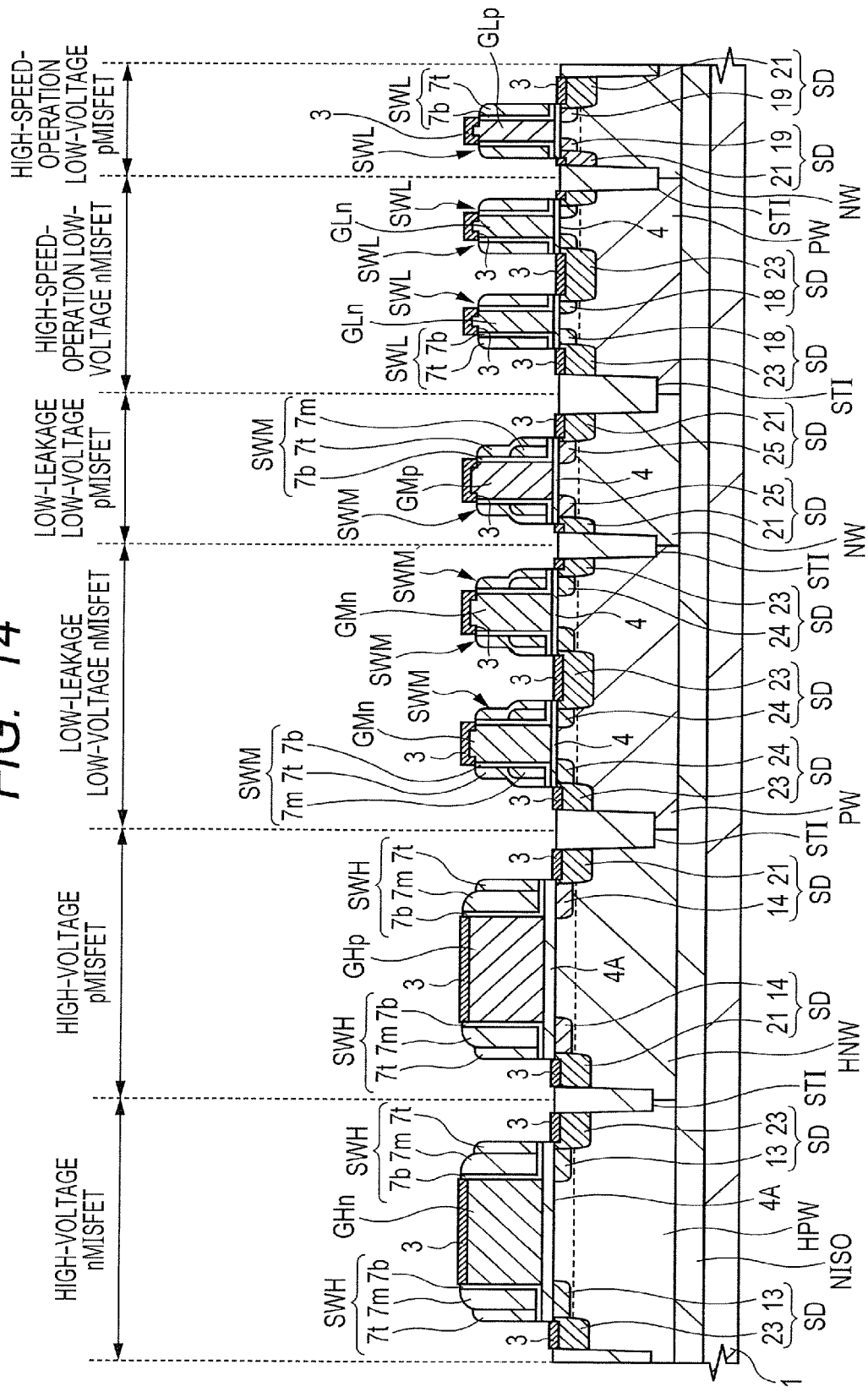
FIG. 14 is a main-portion cross-sectional view of the same portion of the semiconductor device as shown in FIG. 1 in a manufacturing step of the semiconductor device, which is subsequent to FIG. 13.

Next, as shown in FIG. 14, over the gate electrodes GHn of the first nMISFETs, in the upper surfaces of the n⁺-type semiconductor regions 23, over the gate electrodes GHp of the first pMISFETs, in the upper surfaces of the p⁺-type semiconductor regions 21, over the gate electrodes GMn of the second nMISFETs, in the upper surfaces of the n⁺-type semiconductor regions 23, over the gate electrodes GMp of the second pMISFETs, in the upper surfaces of the p⁺-type semiconductor regions 21, over the gate electrodes GLn of the third nMISFETs, in the upper surfaces of the n⁺-type semiconductor regions 23, over the gate electrodes GLp of the third pMISFETs, and in the upper surfaces of the p⁺-type semiconductor regions 21, silicide layers 3 are formed by a Salicide (Self-Align silicide) process. For the silicide layers 3, e.g., nickel silicide, cobalt silicide, or the like is used.

By forming the silicide layers 3, coupling resistance between the silicide layers 3 and plugs or the like formed thereover in the step described later can be reduced. In addition, it is possible to reduce the resistances of the gate electrodes GHn of the first nMISFETs, the gate electrodes GHp of the first pMISFETs, the gate electrodes GMn of the second nMISFETs, the gate electrodes GMp of the second pMISFETs, the gate electrodes GLn of the third nMISFETs, and the gate electrodes GLp of the third pMISFETs as well as the resistances of the source/drain regions SD.

Here, in the first nMISFETs and the first pMISFETs, a silicide reaction proceeds from each of the exposed upper surfaces of the gate electrodes GHn and GHp. On the other hand, in the second nMISFETs and the second pMISFETs, a silicide reaction proceeds from each of the exposed upper surfaces and both side surfaces of the gate electrodes GMn and GMp. Likewise, in the third nMISFETs and the third pMISFETs, a silicide reaction proceeds from each of the exposed upper surfaces and both side surfaces of the gate electrodes GLn and GLp. As a result, the silicide layers 3 are formed also over the both side surfaces of the upper portions of the gate electrodes GMn, GMp, GLn, and GLp. Therefore, it is possible to further reduce the resistances of the gate electrodes GMn, GMp, GLn, and GLp.

If the portions of the silicide layer 3 formed by the silicide reaction which proceeds from the both side surfaces of the upper portion of each of the gate electrodes GMn and GMp of the second nMISFETs and the second pMISFETs and the gate electrodes GLn and GLp of the third nMISFETs and the third pMISFETs are united, the film thickness of the entire silicide layer 3 equals the total film thickness of the film thickness of the portion of the silicide layer 3 formed from the upper surface and the film thicknesses of the portions thereof formed from the both side surfaces of the upper portion, though not shown. As a result, a case may also be considered where the film thicknesses of the silicide layers 3 formed over the gate electrodes GMn and GMp of the second nMISFETs and the second pMISFETs and the gate electrodes GLn and GLp of the third nMISFETs and the third pMISFETs are larger than the film thicknesses of the silicide layers 3 formed over the gate electrodes GHn and GHp of the first nMISFETs and the first pMISFETs.

Figure 15:
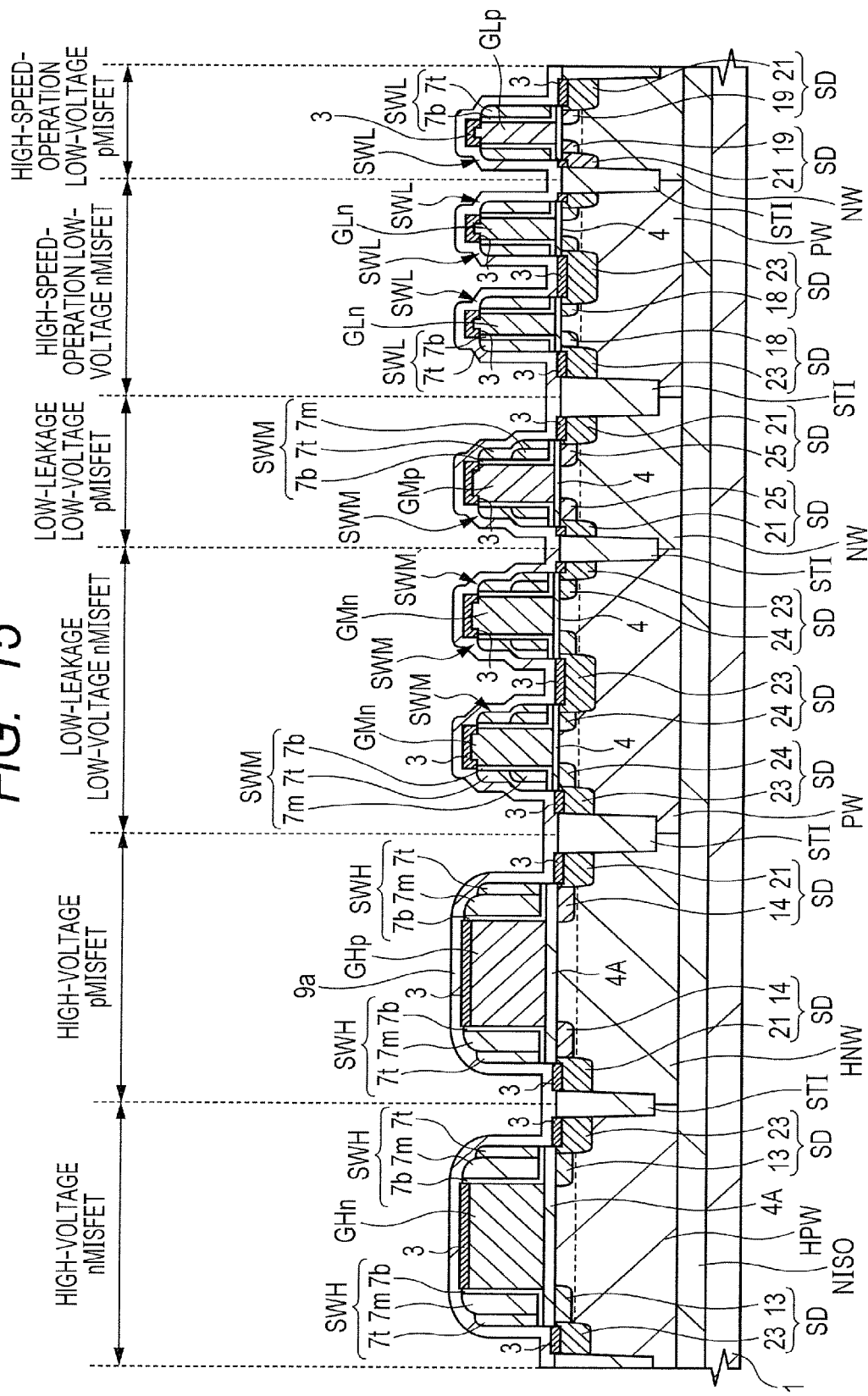
FIG. 15 is a main-portion cross-sectional view of the same portion of the semiconductor device as shown in FIG. 1 in a manufacturing step of the semiconductor device, which is subsequent to FIG. 14.

Next, as shown in FIG. 15, over the main surface of the semiconductor substrate 1, a silicon nitride film 9a is deposited as an insulating film by a CVD method. The silicon nitride film 9a functions as an etching stopper when contact holes are formed in the step described later.

Figure 16:
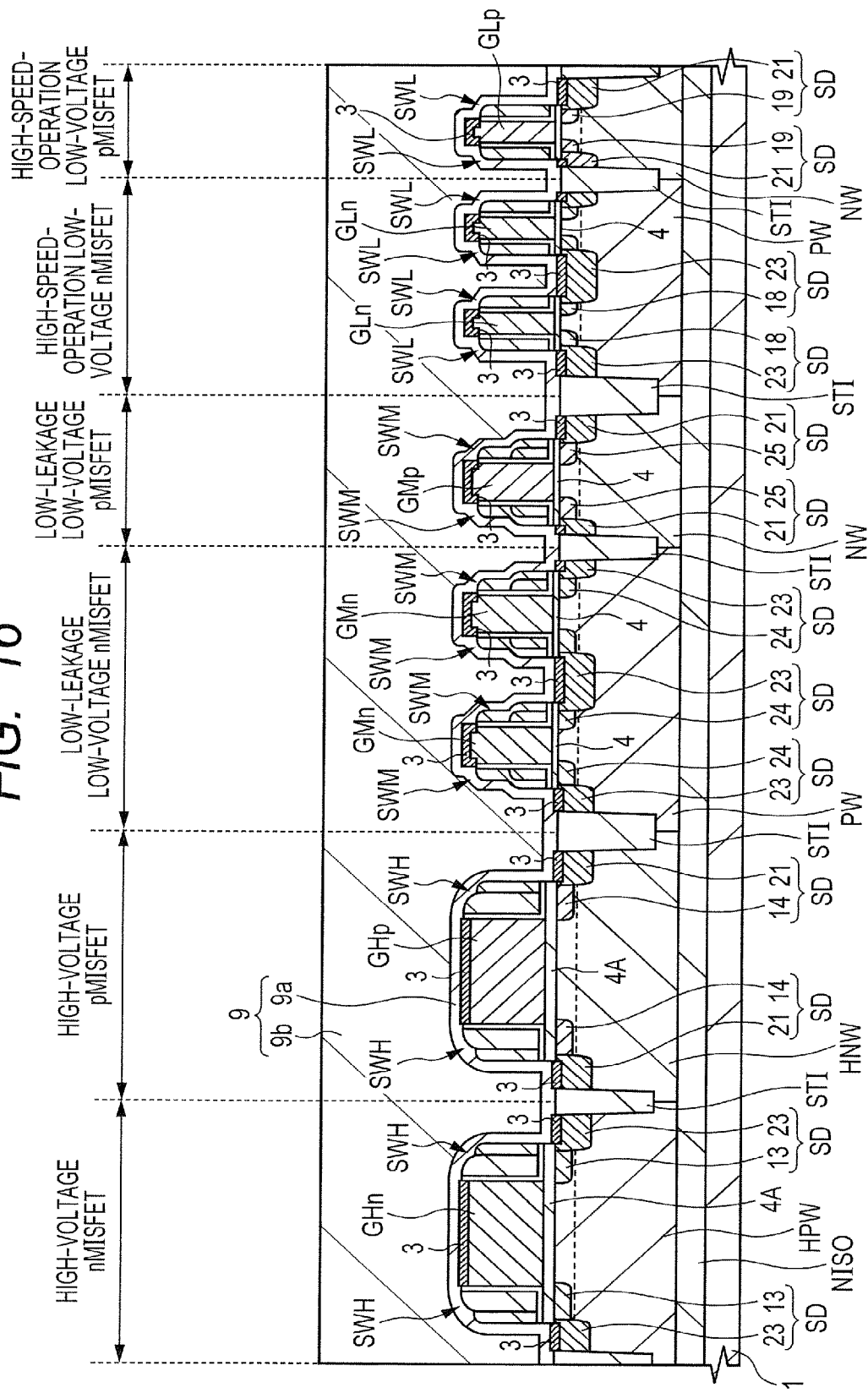
FIG. 16 is a main-portion cross-sectional view of the same portion of the semiconductor device as shown in FIG. 1 in a manufacturing step of the semiconductor device, which is subsequent to FIG. 15.

Next, as shown in FIG. 16, a silicon oxide film 9b is deposited as an insulating film by a CVD method and, by polishing the surface of the silicon oxide film 9b by a CMP method, an interlayer insulating film 9 including the silicon nitride film 9a and the silicon oxide film 9b is formed. As described above, in the third nMISFETs and the third p-type MISFETs, the sidewalls SWL are formed to have heights from the main surface of the semiconductor substrate 1 which are lower than the heights of the gate electrodes GLn and GLp from the main surface of the semiconductor substrate 1. Therefore, the interlayer insulating film 9 can be formed to show excellent coverage (embeddedness). The improved coverage (embeddedness) of the interlayer insulating film 9 can prevent the contact holes formed in the interlayer insulating film 9 in the step described later from suffering shape defects.

Figure 17:
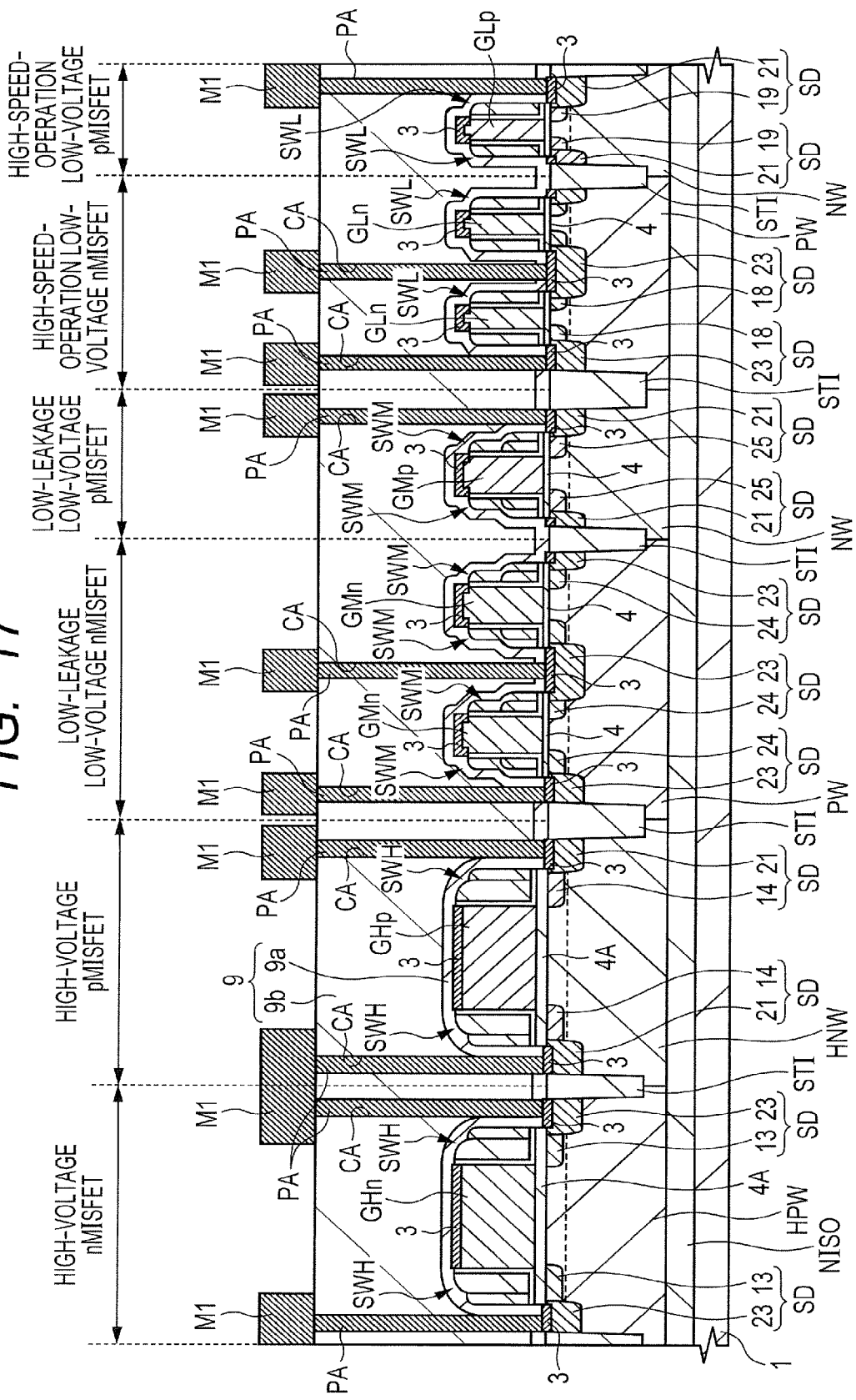
FIG. 17 is a main-portion cross-sectional view of the same portion of the semiconductor device as shown in FIG. 1 in a manufacturing step of the semiconductor device, which is subsequent to FIG. 16.

Next, as shown in FIG. 17, in the first nMISFETs, the first pMISFETs, the second nMISFETs, the second pMISFETs, the third nMISFET, and the third pMISFETs, contact holes CA are formed to reach the silicide layers 3 formed over the gate electrodes GHn, GHp, GMn, GMp, GLn, and GLp and in the respective upper surfaces of the source/drain regions SD. In FIG. 17, for simpler illustration, only the contact holes CA reaching the source/drain regions SD of the first nMISFET, the first pMISFET, the second nMISFET, the second pMISFET, the third nMISFET, and the third pMISFET are shown by way of example.

Next, in the contact holes CA, plugs PA are formed. The plugs PA are each formed of a laminate film including a relatively thin barrier film in which, e.g., titanium and a titanium nitride are stacked and a relatively thick conductive film made of tungsten, aluminum, or the like and formed so as to be wrapped with the barrier film. Thereafter, over the interlayer insulating film 9, a first-layer interconnect wire M1 containing, e.g., copper or aluminum as a main component is formed.

By the manufacturing process described above, in the peripheral circuit region, the first nMISFETs, the first pMISFETs, the second nMISFETs, the second pMISFETs, the third nMISFETs, and the third pMISFETs are substantially completed. Thereafter, by performing typical manufacturing steps of a semiconductor device, further upper-layer interconnect wires are formed, whereby the semiconductor device having the nonvolatile memory is manufactured.

Note that, in Embodiment 1 described above, as the MISFETs including the gate electrodes having gate lengths shorter than the gate lengths of the gate electrodes GHn and GHp of the first nMISFETs and the first pMISFETs and longer than the gate lengths of the gate electrodes GLn and GLp of the third nMISFETs and the third pMISFETs, the second nMISFETs and the second pMISFETs are shown by way of example, but they are not limited thereto. For examples, MISFETs forming nonvolatile memory cells formed in a memory region can also be shown by way of example.

In recent years, as an electrically rewritable nonvolatile memory cell, a MONOS (Metal Oxide Nitride Oxide Silicon) nonvolatile memory cell using an insulating film having a trap level, such as a nitride film, as a charge storing layer has drawn attention. In this case, charges contributing to data storage are stored in a discrete trap in the nitride film which is an insulator. Accordingly, even if a defect occurs in any part of an oxide film surrounding a storage node to cause an abnormal leakage, not all the charges in the charge storing layer come off. Therefore, it is possible to improve the reliability of data retention.

However, a semiconductor device including a nonvolatile memory in which the MONOS nonvolatile memory cells are arranged as an array have various technical problems to be solved, which will be described below.

To achieve a nonvolatile memory having high reliability, high reliability is required also of the peripheral circuit of the nonvolatile memory. For example, the peripheral circuit needs a voltage boosting circuit for generating a voltage higher than a power source voltage given from the outside, a circuit for applying the generated high voltage to any of the nonvolatile memory cells, and the like. Accordingly, when the nonvolatile memory is to be operated, semiconductor elements each having breakdown voltage performance higher than that of each of the nonvolatile memory cells are required for the peripheral circuit.

Accordingly, the present inventors have formed the low-voltage MISFETs each operating at a relatively low voltage (e.g., the same voltage as the power source voltage) and the high-voltage MISFETs each operating at a voltage higher than the voltage at which each of the low-voltage MISFETs operates in the peripheral circuit to thereby implement desired operation performance and breakdown voltage performance.

The method of manufacturing the semiconductor device having the nonvolatile memory cells, first nMISFETs, first pMISFETs, third nMISFETs, and third pMISFETs according to Embodiment 1 will be described in the order of process steps using FIGS. 18 to 37. FIGS. 18 to 37 are main-portion cross-sectional views of the nonvolatile memory cells which are formed in the memory region, the first nMISFETs, the first pMISFETs, the third nMISFETs, and the third pMISFETs which are formed in the peripheral circuit region in the manufacturing steps of the semiconductor device. Each of the drawings shows a main-portion cross section in which the channels are cut along the gate length directions of the gate electrodes. The first nMISFETs and the first pMISFETs are formed as, e.g., the high-voltage MISFETs, while the third nMISFETs and the third pMISFETs are formed as, e.g., the high-speed-operation low-voltage MISFETs.

As the nonvolatile memory cells, MONOS nonvolatile memory cells each having a split-gate structure in which the memory gate electrode of a memory nMISFET in the form of a sidewall is formed on one side surface of the selection gate electrode of a selection nMISFET is shown by way of example. The sidewall lengths of the sidewalls formed over the side surfaces of the selection gate electrodes opposite to the memory gate electrodes and over the side surfaces of the memory gate electrodes are about 40 to 50 nm.

The first nMISFETs and the first pMISFETs forming the peripheral circuit are the same as described above, and each driven with an applied voltage of, e.g., 3.3 to 5 V. The sidewall lengths of the sidewalls formed over the side surfaces of the gate electrodes thereof are, e.g., about 80 to 90 nm. The third nMISFETs and the third pMISFETs forming the peripheral circuit are the same as described above, and each driven with an applied voltage of, e.g., 1.2 V. The sidewall lengths of the sidewalls formed over the side surfaces of the gate electrodes thereof are, e.g., about 30 nm.

That is, the first nMISFETs and the first pMISFETs formed in the peripheral circuit region, the third nMISFETs and the third pMISFETs formed in the peripheral circuit region, and the nonvolatile memory cells formed in the memory region are different in terms of gate length and layout density. The gate lengths of the first nMISFETs and first pMISFETs are the longest, and the gate lengths of the nonvolatile memory cells and the third nMISFETs and third pMISFETs are progressively shorter in this order. The layout density of the first nMISFETs and first pMISFETs is the lowest, and the layout densities of the nonvolatile memory cells and the third nMISFETs and third pMISFETs are progressively higher in this order.

Figure 18:
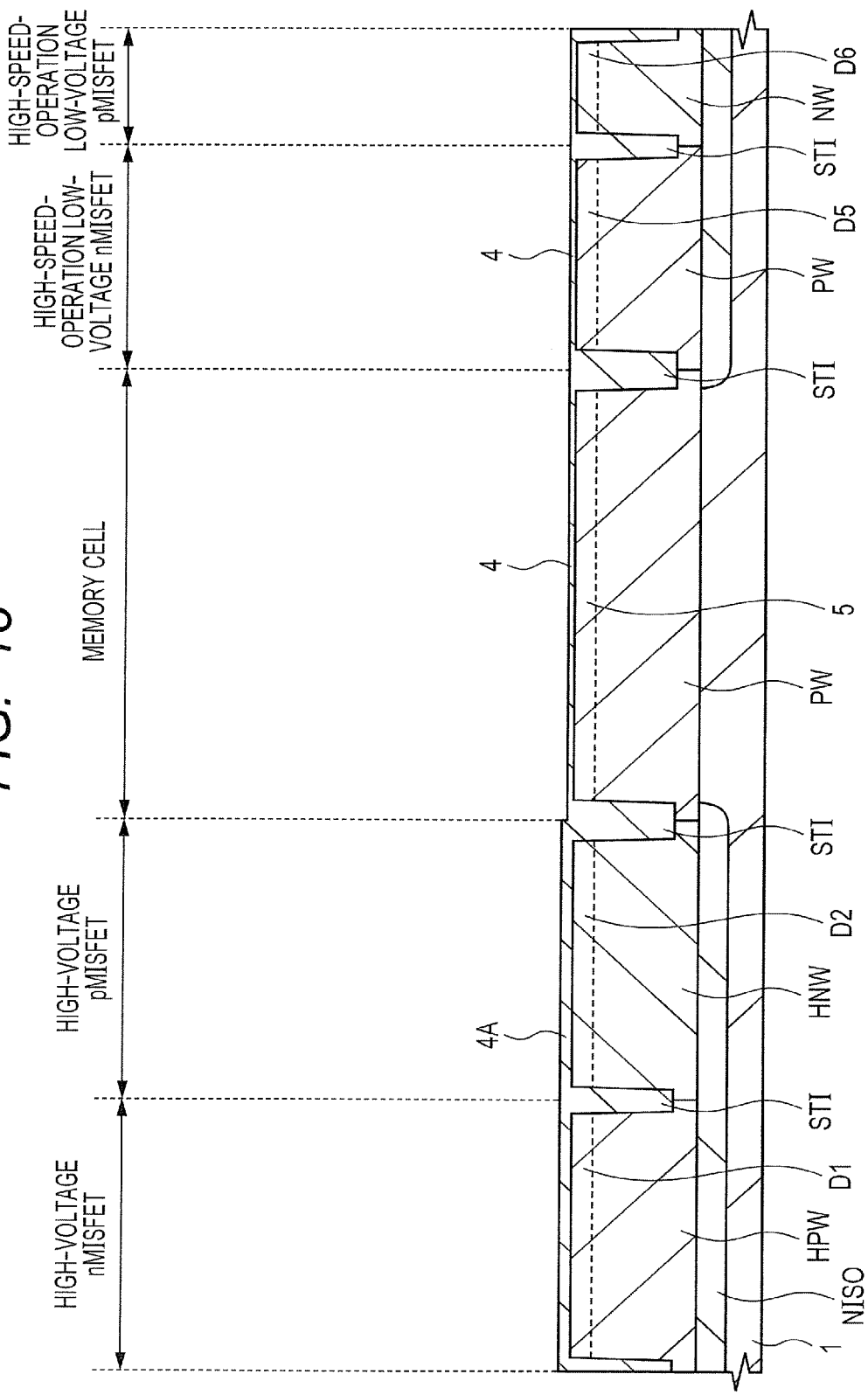
FIG. 18 is a main-portion cross-sectional view of the semiconductor device according to Embodiment 1 of the present invention, which illustrates another example of a manufacturing step of the semiconductor device.

First, as shown in FIG. 18, in the same manner as described above using FIG. 1, the isolation portion STI is formed in the main surface of the semiconductor substrate 1, and an n-type embedded well NISO, a p-type well HPW, an n-type well HNW, a p-type well PW, and an n-type well NW are formed. Then, into the semiconductor substrate 1 in the memory region, a p-type impurity is selectively ion-implanted. Thus, in the semiconductor substrate 1 in the memory region, a p-type semiconductor region 5 for forming the channels of the selection nMISFETs is formed. Likewise, into the semiconductor substrate 1 in the first nMISFET region, the first pMISFET region, the third nMISFET region, and the third pMISFET region, predetermined impurities are ion-implanted. Thus, in the semiconductor substrate 1 in the first nMISFET region, the first pMISFET region, the third nMISFET region, and the third pMISFET region, the channel-formation semiconductor regions D1, D2, D5, and D6 are formed.

Figure 19:
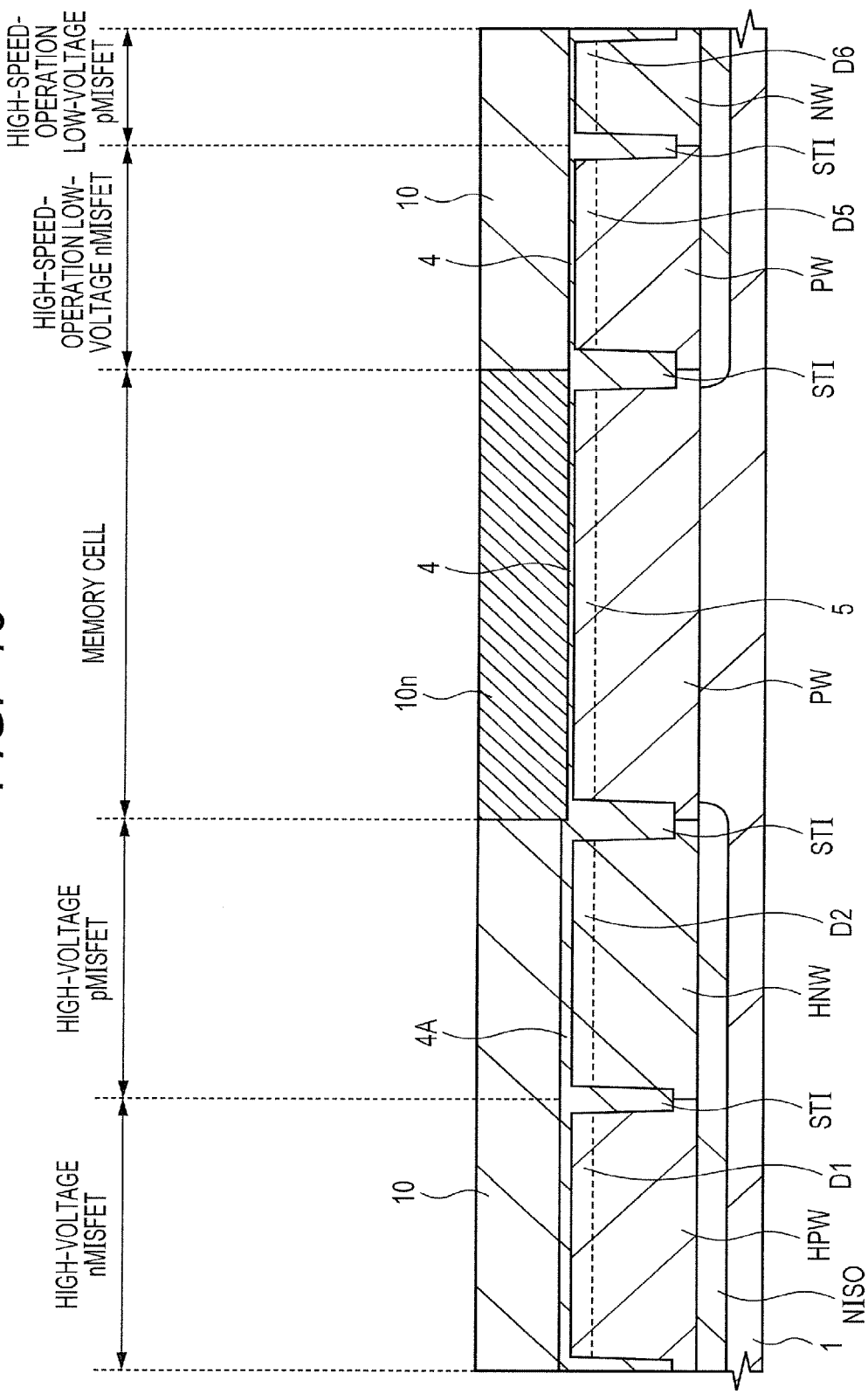
FIG. 19 is a main-portion cross-sectional view of the same portion of the semiconductor device as shown in FIG. 18 in a manufacturing step of the semiconductor device, which is subsequent to FIG. 18.

Next, over the main surface of the semiconductor substrate 1 in the first nMISFET region and the first pMISFET region, a gate insulating film 4A made of, e.g., a silicon oxide and having a thickness of about 10 to 20 nm is formed and, over the main surface of the semiconductor substrate 1 in the memory region, the third nMISFET region, and the third pMISFET region, a gate insulating film 4 made of, e.g., a silicon oxide and having a thickness of about 1 to 5 nm is formed Next, as shown in FIG. 19, over the main surface of the semiconductor substrate 1, the conductive film 10 made of, e.g., amorphous silicon is deposited by a CVD method. Then, into the conductive film 10 in the memory region, an n-type impurity is introduced by an ion implantation method or the like to form an n-type conductive film 10n. The thicknesses of the conductive films 10 and 10n are, e.g., about 100 nm.

Figure 20:
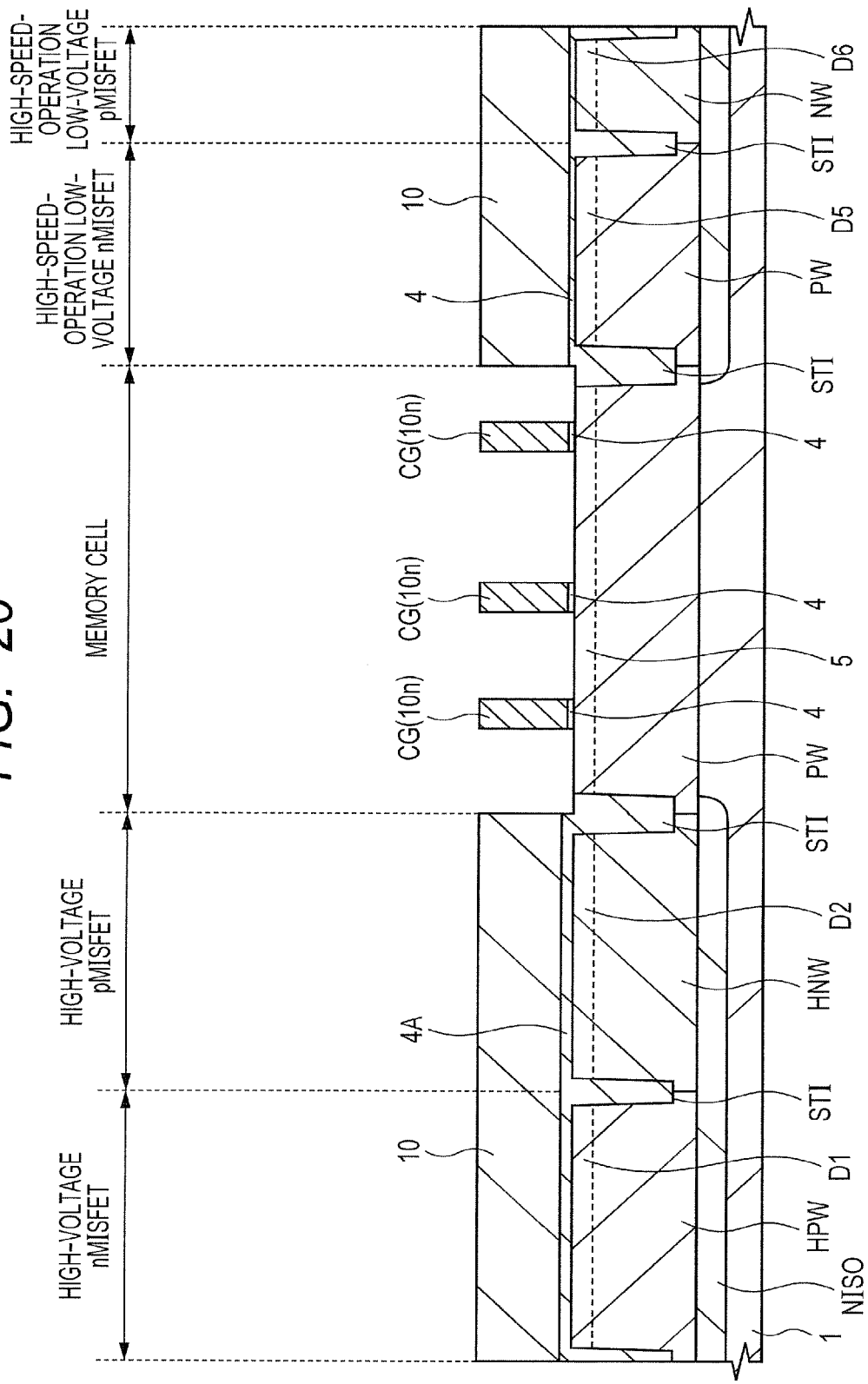
FIG. 20 is a main-portion cross-sectional view of the same portion of the semiconductor device as shown in FIG. 18 in a manufacturing step of the semiconductor device, which is subsequent to FIG. 19.

Next, as shown in FIG. 20, the n-type conductive film 10n in the memory region is patterned using photolithography and dry etching. In this manner, in the memory region, selection gate electrodes CG of the selection nMISFETs each made of the n-type conductive film 10n are formed. The gate lengths of the selection gate electrodes CG in the memory region are, e.g., about 100 nm.

Figure 21:
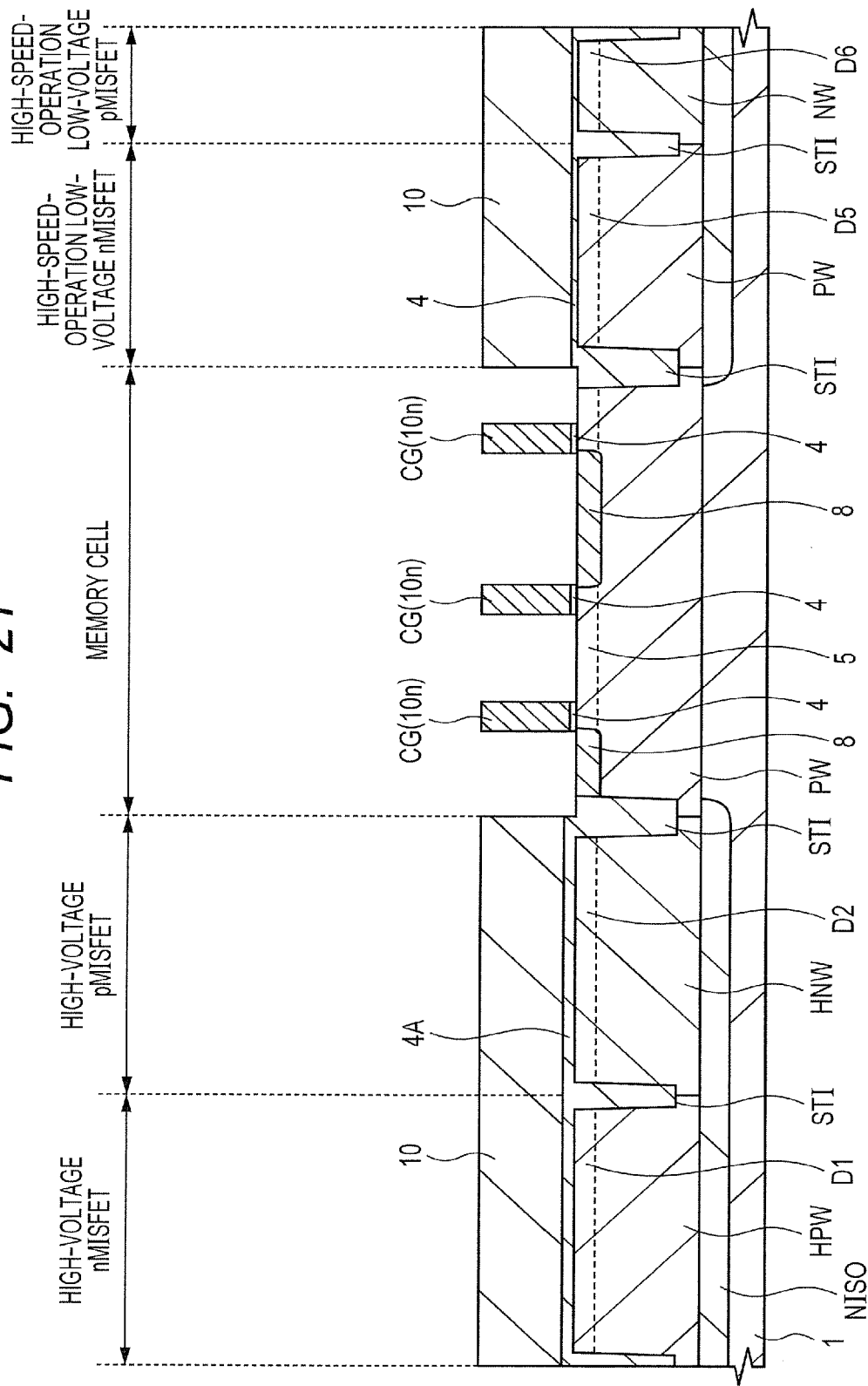
FIG. 21 is a main-portion cross-sectional view of the same portion of the semiconductor device as shown in FIG. 18 in a manufacturing step of the semiconductor device, which is subsequent to FIG. 20.

Next, as shown in FIG. 21, using the selection gate electrodes CG and a photoresist pattern as a mask, into the main surface of the semiconductor substrate 1 in the memory region, an n-type impurity, e.g., arsenic or phosphorus is ion implanted to form n-type semiconductor regions 8 for forming the channels of the memory nMISFETs.

Figure 22:
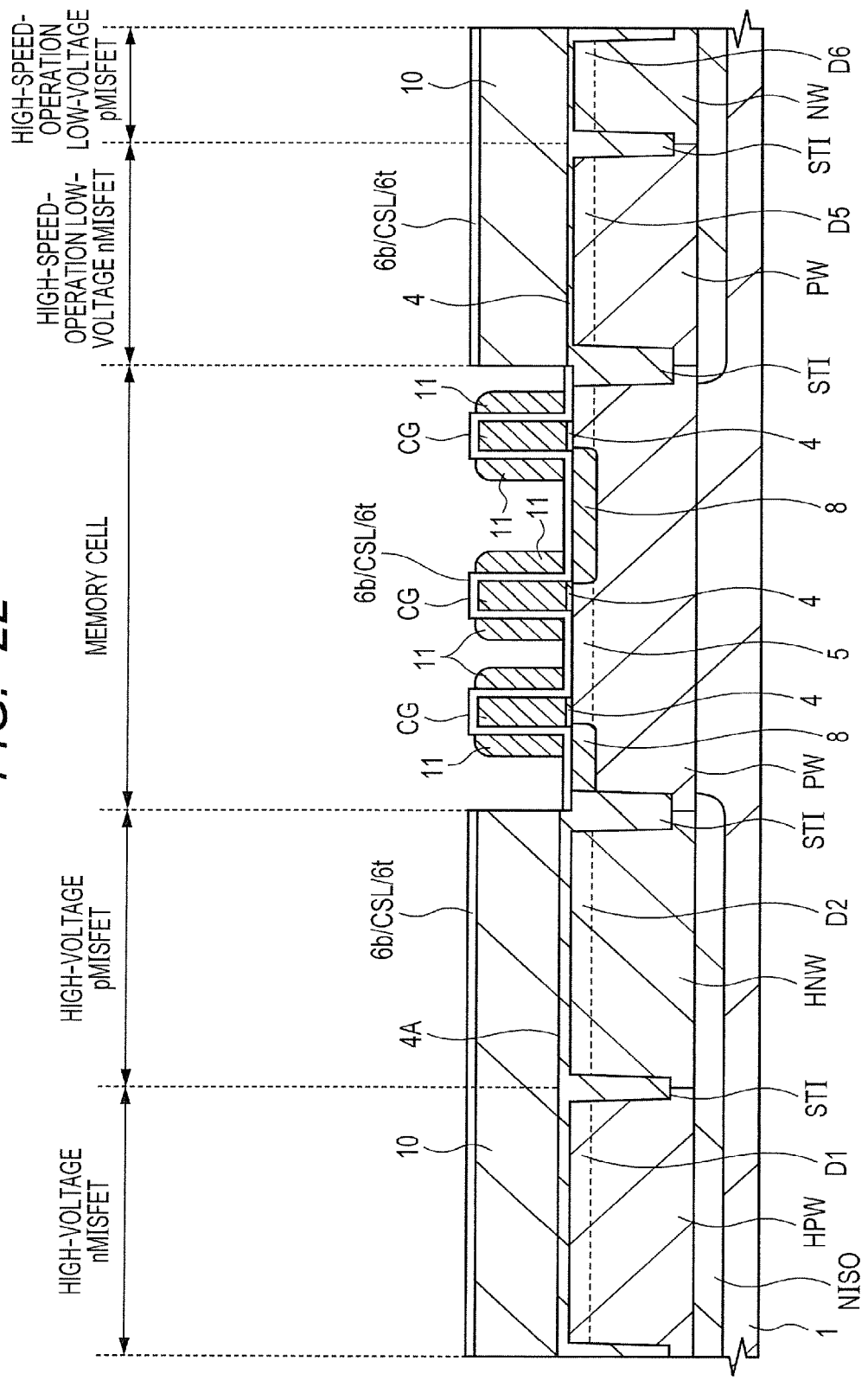
FIG. 22 is a main-portion cross-sectional view of the same portion of the semiconductor device as shown in FIG. 18 in a manufacturing step of the semiconductor device, which is subsequent to FIG. 21.

Next, as shown in FIG. 22, over the main surface of the semiconductor substrate 1, insulating films 6b each made of, e.g., a silicon oxide, charge storing layers CSL each as an insulating film having a trap level made of, e.g., a silicon nitride, and insulating films 6t each made of, e.g., a silicon oxide are successively formed. The insulating films 6b are formed by, e.g., a thermal oxidation method, an ISSG (In-Situ Steam Generation) oxidation method, or the like. The charge storing layers CSL are formed by, e.g., a CVD method or the like. The insulating films 6t are formed by, e.g., a CVD method, an ISSG oxidation method, or the like. As the thicknesses of laminate films (hereinafter referred to as the insulating films 6b and 6t and the charge storing layers CSL) including the insulating films 6b, the charge storing layers SCL, and the insulating films 6t, about 20 nm can be shown by way of example. Each of the insulating films 6b and 6t may also be formed of, e.g., a silicon oxide containing nitrogen. Each of the charge storing layers CSL may also be formed of a high-dielectric-constant film having a dielectric constant higher than that of a silicon nitride such as, e.g., an aluminum oxide (alumina), a hafnium oxide, or a tantalum oxide. Note that, in the drawings, the insulating films 6b and 6t and the charge storing layers CSL are denoted by 6b/CSL/6t.

Next, over the main surface of the semiconductor substrate 1, a conductive film made of low-resistance polysilicon is deposited. The conductive film is formed by a CVD method. The thickness of the conductive film is, e.g., about 50 nm. Subsequently, using photolithography and anisotropic dry etching, the conductive film is processed. Thus, in the memory region, over the both side surfaces of the selection gate electrodes CG, the sidewalls 11 are formed via the insulating films 6b and 6t and the charge storing layers CSL.

Figure 23:
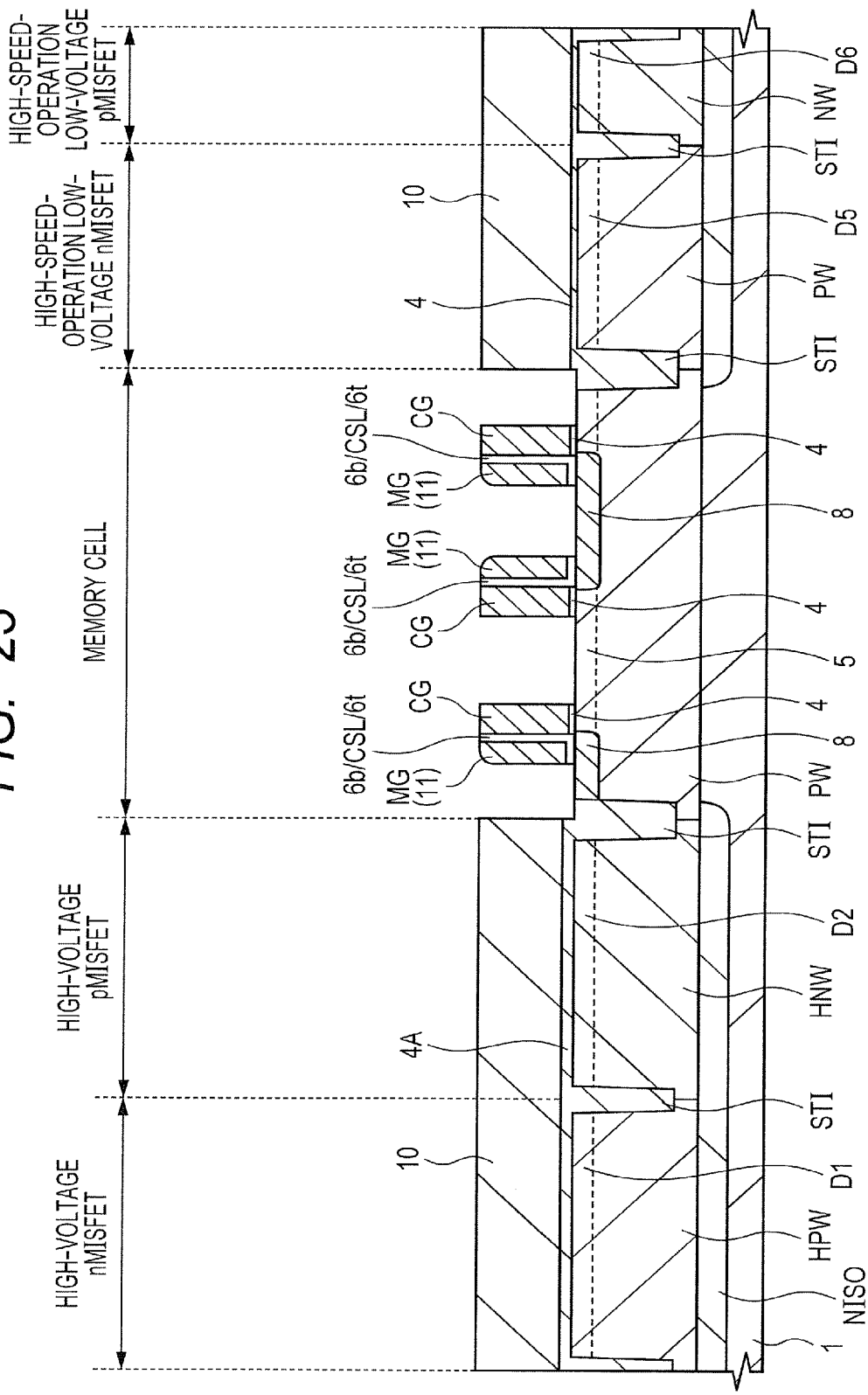
FIG. 23 is a main-portion cross-sectional view of the same portion of the semiconductor device as shown in FIG. 18 in a manufacturing step of the semiconductor device, which is subsequent to FIG. 22.

Next, as shown in FIG. 23, using a photoresist pattern as a mask, the sidewalls 1 exposed therefrom are etched. Thus, in the memory region, memory gate electrodes MG of the memory nMISFETs are formed only over one side surfaces of the selection gate electrodes CG. The gate lengths of the memory gate electrodes MG are, e.g., about 65 nm.

Next, in the memory region, the insulating films 6b and 6t and the charge storing layers CSL in the area other than the spaces between the selection gate electrodes CG and the memory gate electrodes MG and the spaces between the semiconductor substrate 1 and the memory gate electrodes MG are selectively etched, while the insulating films 6b and 6t and the charge storing layer CSL are left between the selection gate electrodes CG and the memory gate electrodes MG and between the semiconductor substrate 1 and the memory gate electrodes MG.

Figure 24:
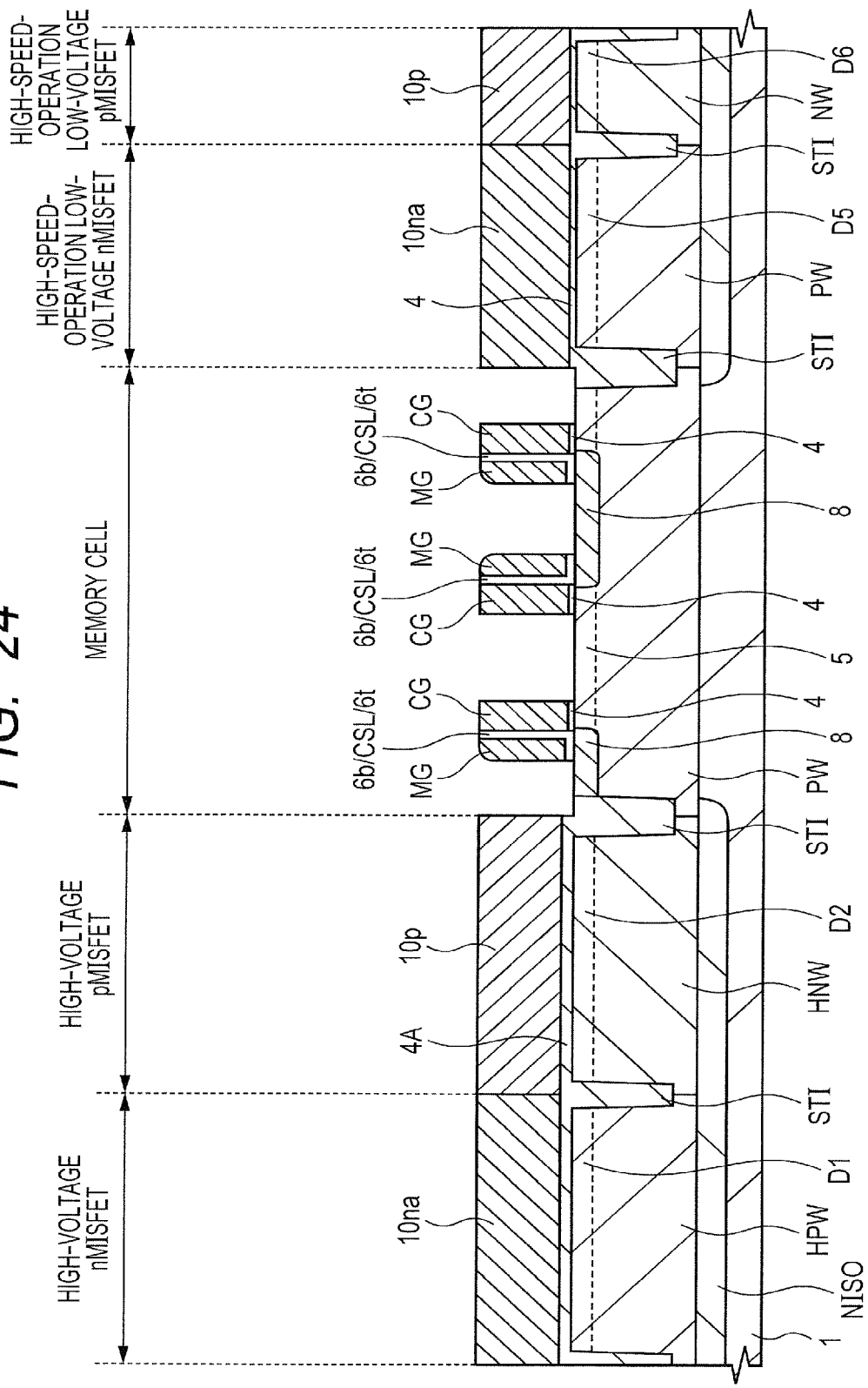
FIG. 24 is a main-portion cross-sectional view of the same portion of the semiconductor device as shown in FIG. 18 in a manufacturing step of the semiconductor device, which is subsequent to FIG. 23.

Next, as shown in FIG. 24, into the conductive film 10 in the first nMISFET region and the third nMISFET region, an n-type impurity is introduced by an ion implantation method or the like to form the n-type conductive films 10na. On the other hand, a p-type impurity is introduced into the conductive film 10 in the first pMISFET region and the third pMISFET region to form the p-type conductive films 10p.

Figure 25:
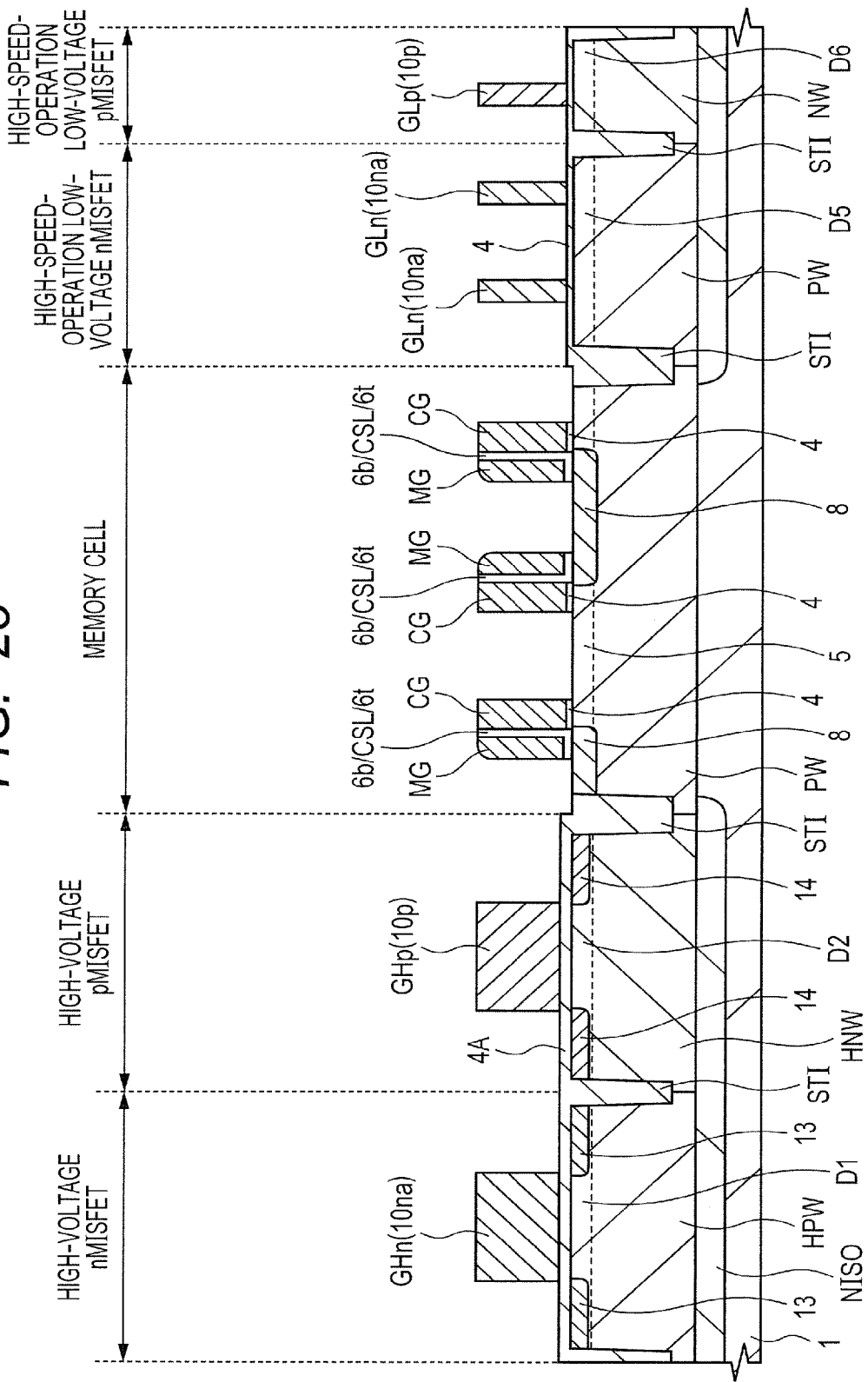
FIG. 25 is a main-portion cross-sectional view of the same portion of the semiconductor device as shown in FIG. 18 in a manufacturing step of the semiconductor device, which is subsequent to FIG. 24.

Next, as shown in FIG. 25, the conductive films 10na and 10p in the peripheral circuit region are patterned using photolithography and dry etching to form the gate electrodes GHn of the first nMISFETs each made of the conductive film 10na, the gate electrodes GHp of the first pMISFETs each made of the conductive film 10p, the gate electrodes GLn of the third nMISFETs each made of the conductive film 10na, and the gate electrodes GLp of the third pMISFETs each made of the conductive film 10p. In the active region, the gate lengths of the gate electrodes GHn of the first nMISFETs and the gate lengths of the gate electrodes GHp of the first pMISFETs are, e.g., about 800 nm. Also, in the active region, the gate lengths of the gate electrodes GLn of the third nMISFETs and the gate lengths of the gate electrodes GLp of the third pMISFETs are, e.g., about 44 nm, and the minimum spacing between the adjacent gate electrodes GLn, the minimum spacing between the adjacent gate electrodes GLn and GLp, and the minimum spacing between the adjacent gate electrodes GLp are, e.g., about 88 nm.

Next, into the main surface of the semiconductor substrate 1 in the first nMISFET region, an n-type impurity, e.g., arsenic is ion-implanted to form the n$^-$-type semiconductor regions 13 in the main surface of the semiconductor substrate 1 in the first nMISFET region by self-alignment with respect to the gate electrodes GHn. Likewise, into the main surface of the semiconductor substrate 1 in the first pMISFET region, a p-type impurity, e.g., a boron fluoride is ion-implanted to form the p$^-$-type semiconductor regions 14 in the main surface of the semiconductor substrate 1 in the first pMISFET region by self-alignment with respect to the gate electrodes GHp.

Figure 26:
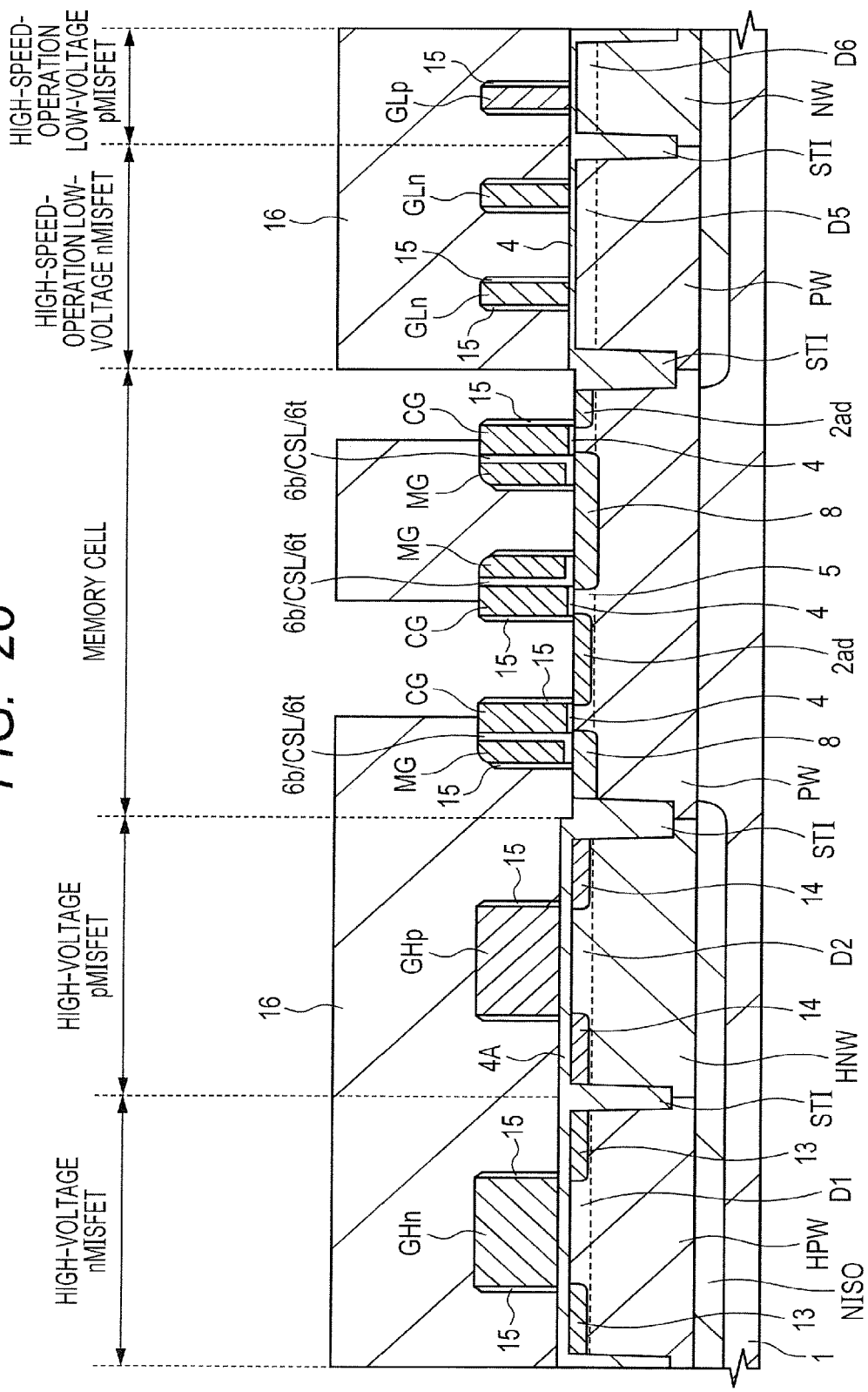
FIG. 26 is a main-portion cross-sectional view of the same portion of the semiconductor device as shown in FIG. 18 in a manufacturing step of the semiconductor device, which is subsequent to FIG. 25.

Next, as shown in FIG. 26, over the main surface of the semiconductor substrate 1, an insulating film made of, e.g., a silicon oxide and having a thickness of about 10 nm is deposited, and processed by anisotropic dry etching. Thus, the sidewalls 15 are formed over the side surfaces of the selection gate electrodes CG opposite to the memory gate electrodes MG and over the side surface of the memory gate electrodes MG in the memory region and over the respective side surfaces of the gate electrodes GHn of the first nMISFETs, the gate electrodes GHp of the first pMISFETs, the gate electrodes GLn of the third nMISFETs, and the gate electrodes GLp of the third pMISFETs in the peripheral circuit region. The spacer lengths of the sidewalls 15 are, e.g., about 3 to 6 nm.

By forming the sidewalls 15, it is possible to protect the exposed side surfaces of the gate insulating films 4 between the selection gate electrodes CG and the semiconductor substrate 1 and the exposed side surfaces of the insulating films 6b and 6t and the charge storing layers CSL between the memory gate electrodes MG and the semiconductor substrate 1. Also, by forming the sidewalls 15, in the step of forming n$^-$-type semiconductor regions in the third nMISFET region and the step of forming p$^-$-type semiconductor regions in the third pMISFET region each described later, the effective channel lengths of the n$^-$-type semiconductor regions and the p$^-$-type semiconductor regions are increased. This can suppress the short-channel effects of the third nMISFETs and the third pMISFETs.

Next, a photoresist pattern 16 having end portions thereof located over the upper surfaces of the selection gate electrodes CG in the memory portion and covering the parts of the selection gate electrodes CG closer to the memory gate electrodes MG and the memory gate electrodes MG is formed. Then, using the selection gate electrodes CG, the memory gate electrodes MG, and the photoresist pattern 16 as a mask, an n-type impurity, e.g., arsenic is ion-implanted into the main surface of the semiconductor substrate 1 to form n$^-$-type semiconductor regions 2ad in the main surface of the semiconductor substrate 1 by self-alignment with respect to the selection gate electrodes CG.

Figure 27:
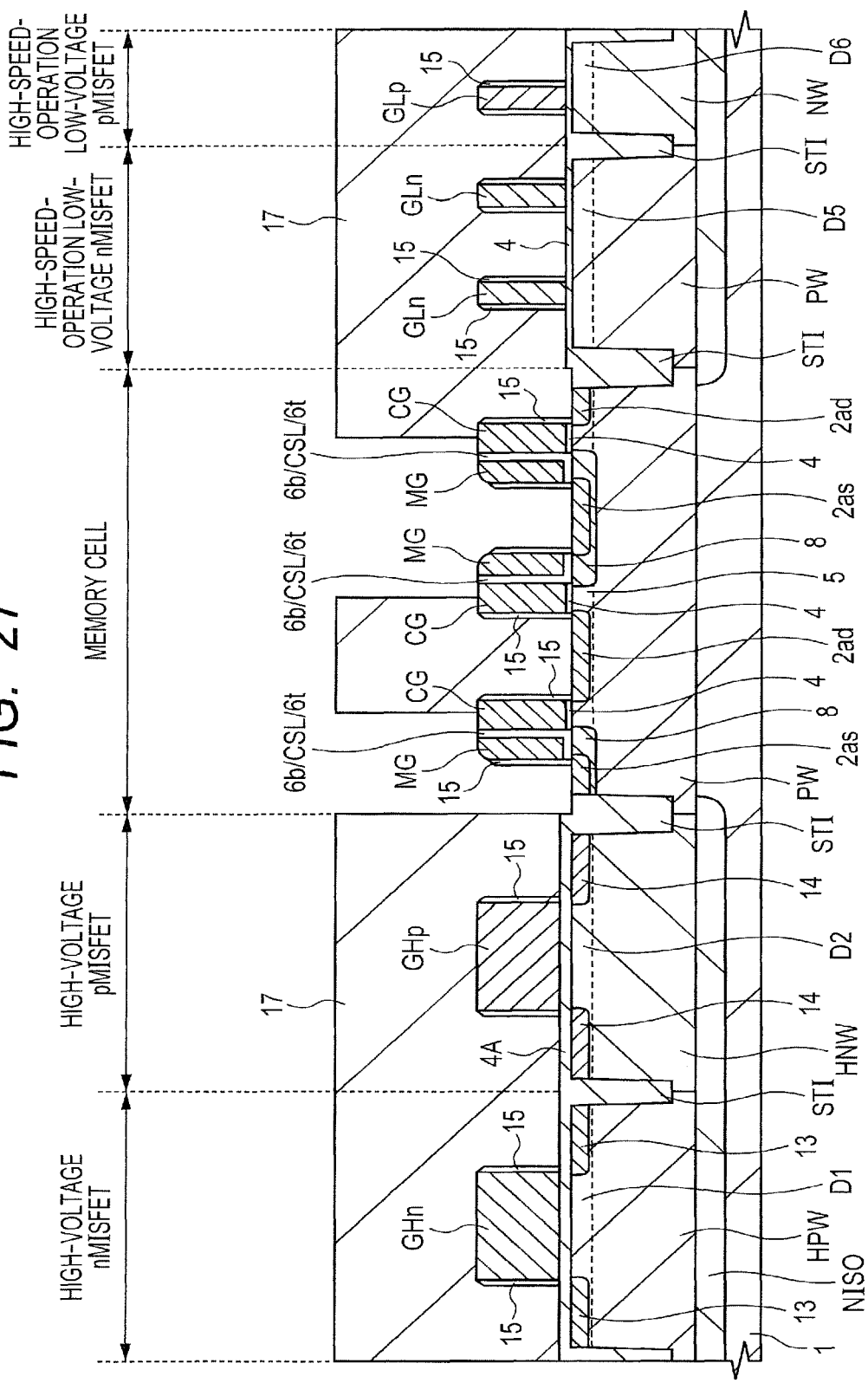
FIG. 27 is a main-portion cross-sectional view of the same portion of the semiconductor device as shown in FIG. 18 in a manufacturing step of the semiconductor device, which is subsequent to FIG. 26.

Next, as shown in FIG. 27, a photoresist pattern 17 having end portions thereof located over the upper surfaces of the selection gate electrodes CG in the memory portion and covering the parts of the selection gate electrodes CG opposite to the memory gate electrodes MG is formed. Then, using the selection gate electrodes CG, the memory gate electrodes MG, and the photoresist pattern 17 as a mask, an n-type impurity, e.g., arsenic is ion-implanted into the main surface of the semiconductor substrate 1 to form n$^-$-type semiconductor regions 2 as in the main surface, of the semiconductor substrate 1 by self-alignment with respect to the memory gate electrodes MG.

Here, the n$^-$-type semiconductor regions 2ad are formed first, and then the n$^-$-type semiconductor regions 2 as are formed. However, it may also be possible to form the n$^-$-type semiconductor regions 2 as first, and then form the n$^-$-type semiconductor regions 2ad. Subsequently to the ion implantation of the n-type impurity for forming the n$^-$-type semiconductor regions 2ad, a p-type impurity, e.g., boron may also be ion-implanted into the main surface of the semiconductor substrate 1 to form p-type semiconductor regions such that the lower portions of the n⁻-type semiconductor regions 2ad are surrounded thereby.

Figure 28:
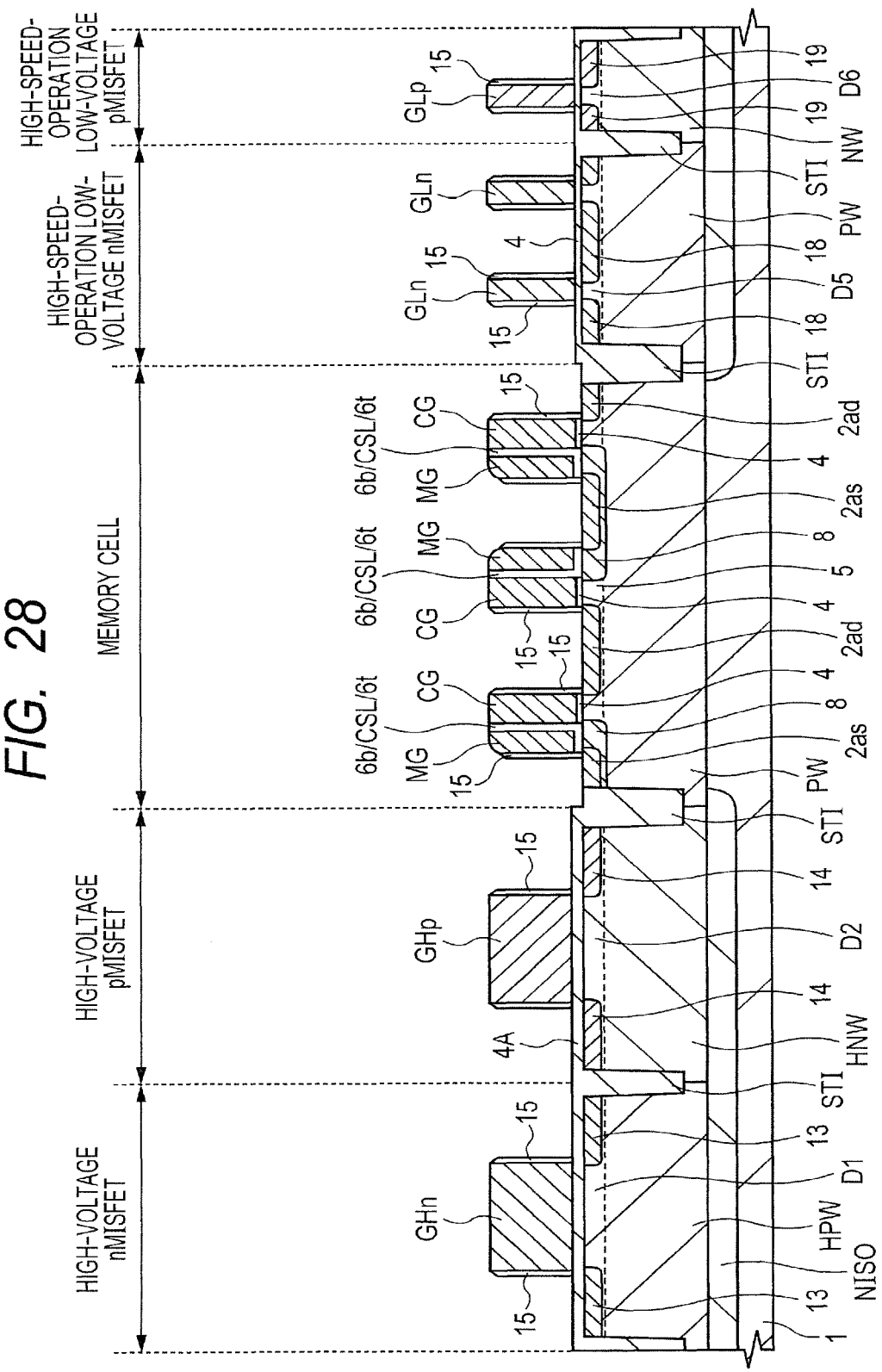
FIG. 28 is a main-portion cross-sectional view of the same portion of the semiconductor device as shown in FIG. 18 in a manufacturing step of the semiconductor device, which is subsequent to FIG. 27.

Next, as shown in FIG. 28, into the main surface of the semiconductor substrate 1 in the third nMISFET region, an n-type impurity, e.g., arsenic is ion-implanted to form the n⁻-type semiconductor regions 18 in the main surface of the semiconductor substrate 1 in the third nMISFET region by self-alignment with respect to the gate electrodes GLn. Likewise, into the main surface of the semiconductor substrate 1 in the third pMISFET region, a p-type impurity, e.g., a boron fluoride is ion-implanted to form the p⁻-type semiconductor regions 19 in the main surface of the semiconductor substrate 1 in the third pMISFET region by self-alignment with respect to the gate electrodes GLp.

Next, in the same manufacturing method as described above using FIGS. 6 to 11, in the memory region, the sidewalls SW are formed over the side surfaces of the selection gate electrodes CG opposite to the memory gate electrodes MG and over the side surfaces of the memory gate electrodes MG. In the first nMISFETs and the first pMISFETs in the peripheral circuit region, the sidewalls SWH are formed over the side surfaces of the gate electrodes GHn and GHp. In the third nMISFETs and the third pMISFETs in the peripheral circuit region, the sidewalls SWL are formed over the side surfaces of the gate electrodes GLn and GLp.

Figure 29:
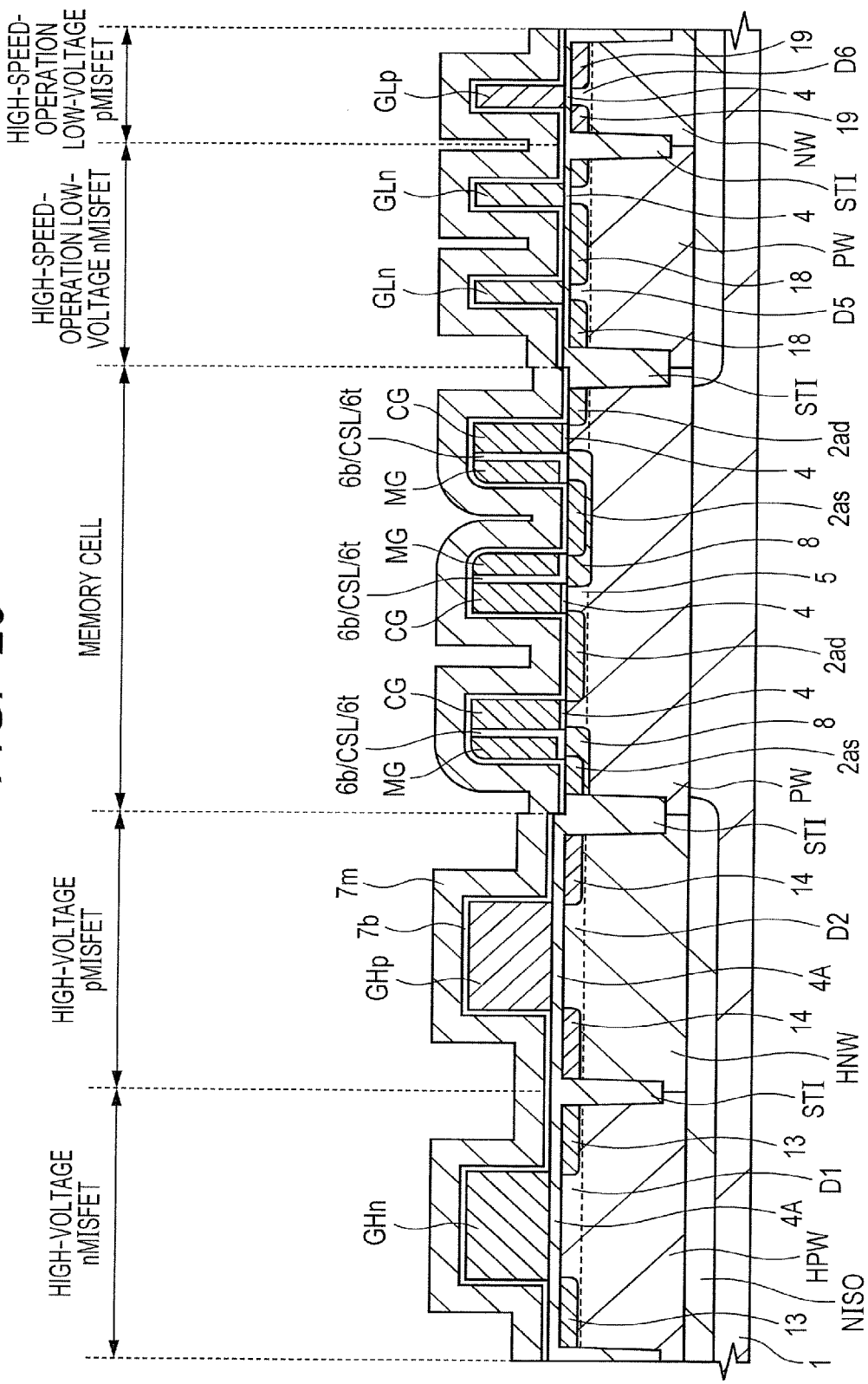
FIG. 29 is a main-portion cross-sectional view of the same portion of the semiconductor device as shown in FIG. 18 in a manufacturing step of the semiconductor device, which is subsequent to FIG. 28.

First, as shown in FIG. 29, over the main surface of the semiconductor substrate 1, the first insulating film (e.g., silicon nitride film) 7b is deposited by a CVD method. The thickness of the first insulating film 7b is, e.g., about 10 nm. Subsequently, over the first insulating film 7b, the second insulating film (e.g., silicon oxide film) 7m is deposited by a CVD method. The thickness of the second insulating film 7m is, e.g., about 50 to 60 nm.

Figure 30:
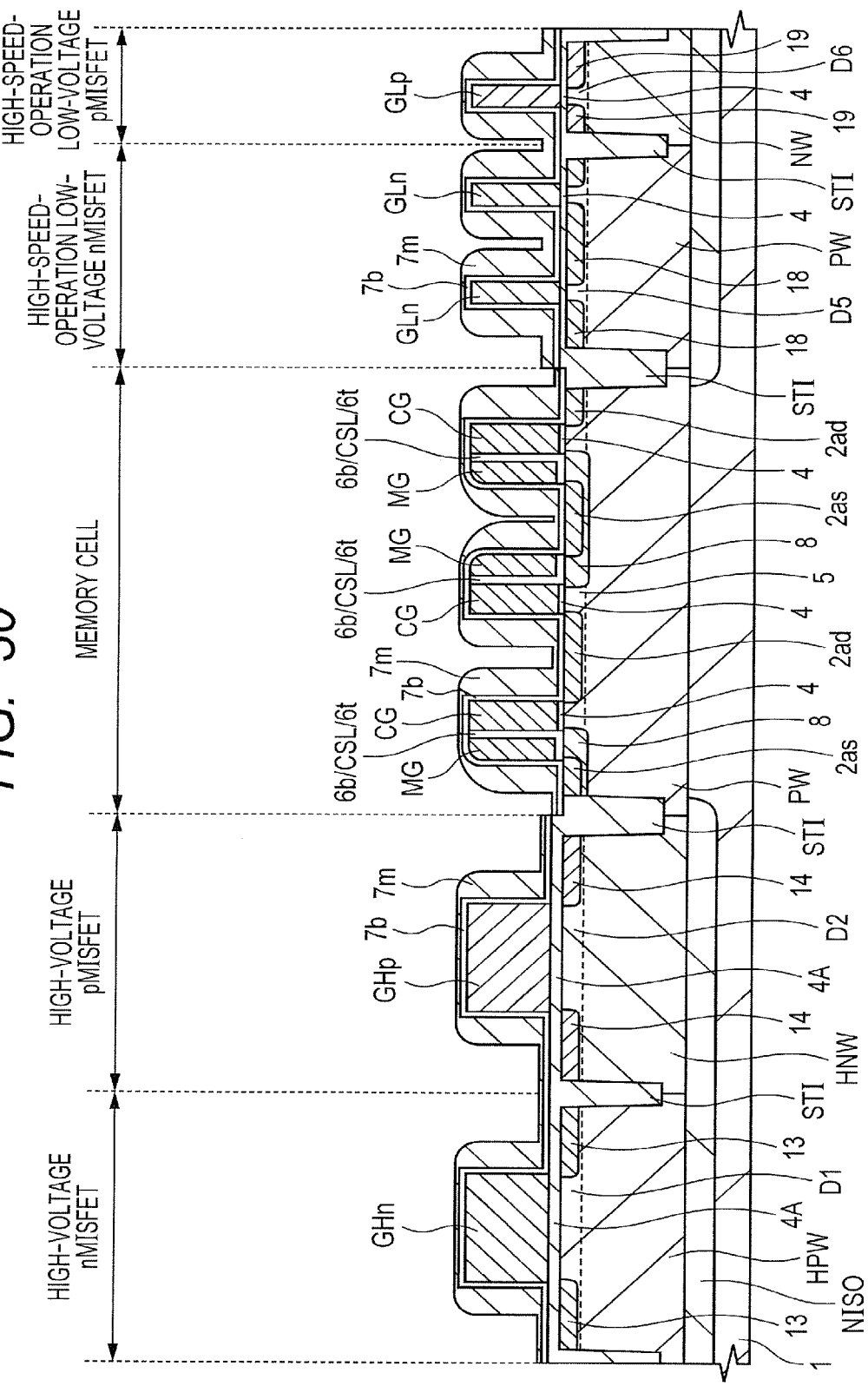
FIG. 30 is a main-portion cross-sectional view of the same portion of the semiconductor device as shown in FIG. 18 in a manufacturing step of the semiconductor device, which is subsequent to FIG. 29.

Next, as shown in FIG. 30, the second insulating film 7m is etched back by anisotropic dry etching. In this manner, in the memory region, the second insulating film 7m over the upper surfaces of the selection gate electrodes CG and the memory gate electrodes MG and over the main surface of the semiconductor substrate 1 where the selection gate electrodes CG and the memory gates MG are not formed is removed completely or such that a part (corresponding to, e.g., about to 3 nm) thereof remains. Likewise, in the peripheral circuit region, the second insulating film 7m over the respective upper surfaces of the gate electrodes GHn of the first nMISFETs, the gate electrodes GHp of the first pMISFETs, the gate electrodes GLn of the third nMISFETs, and the gate electrodes GLp of the third pMISFETs and over the main surface of the semiconductor substrate 1 where the gate electrodes GHn, GHp, GLn, and GLp are not formed is removed completely or such that a part (corresponding to, e.g., about 1 to 3 nm) thereof remains.

Figure 31:
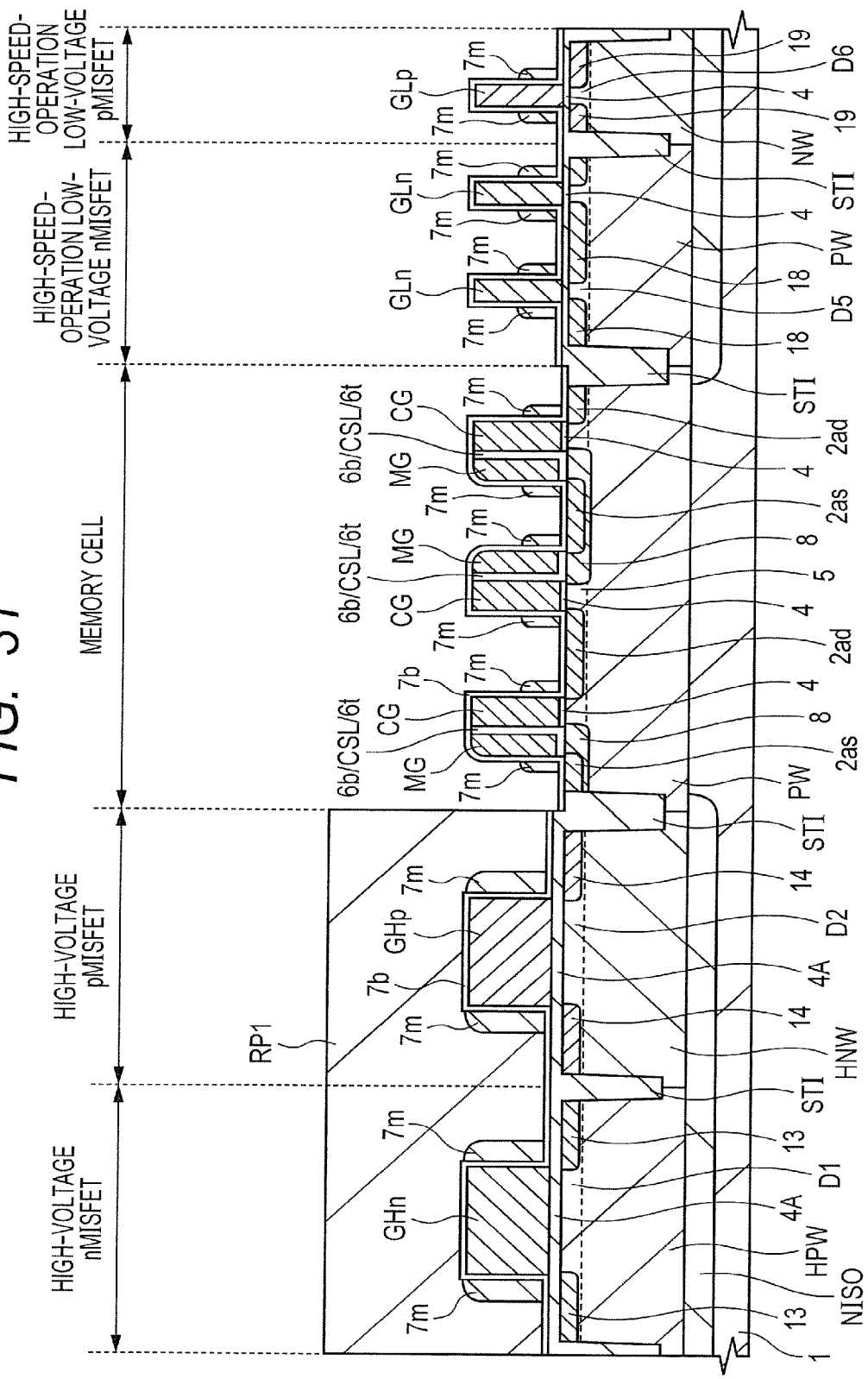
FIG. 31 is a main-portion cross-sectional view of the same portion of the semiconductor device as shown in FIG. 18 in a manufacturing step of the semiconductor device, which is subsequent to FIG. 30.

Next, as shown in FIG. 31, the first nMISFET region and the first pMISFET region are covered with the photoresist pattern RP1, and the second insulating film 7m in the memory region, the third nMISFET region, and the third pMISFET region is processed by isotropic wet etching or isotropic dry etching. Thus, in the memory region, the second insulating film 7m having a width of about 20 to 30 nm in a lateral direction (gate length direction) is left over the side surfaces of the selection gate electrodes CG opposite to the memory gate electrodes MG and over the side surfaces of the memory gate electrodes MG. Likewise, in the peripheral circuit region, the second insulating film 7m having a width of about 20 to 30 nm in the lateral direction (gate length direction) is left over the respective side surfaces of the gate electrodes GLn of the third nMISFETs and the gate electrodes GLp of the third pMISFETs.

Figure 32:
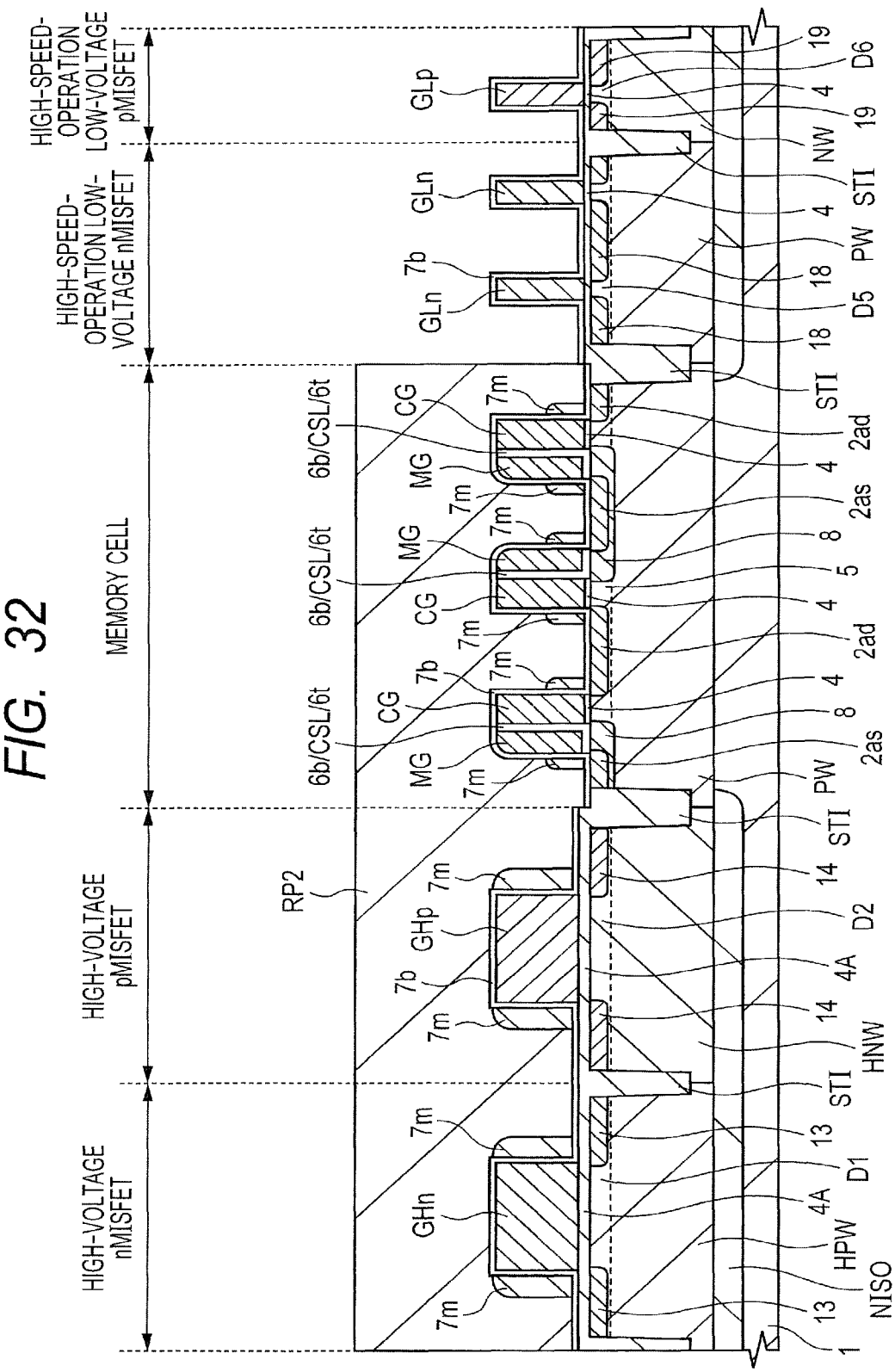
FIG. 32 is a main-portion cross-sectional view of the same portion of the semiconductor device as shown in FIG. 18 in a manufacturing step of the semiconductor device, which is subsequent to FIG. 31.

Next, as shown in FIG. 32, after the photoresist pattern PR1 is removed, the memory region, the first nMISFET region, and the first pMISFET region are covered with the photoresist pattern RP2, and the second insulating film 7m in the third nMISFET region and the third pMISFET region is removed by isotropic wet etching.

Figure 33:
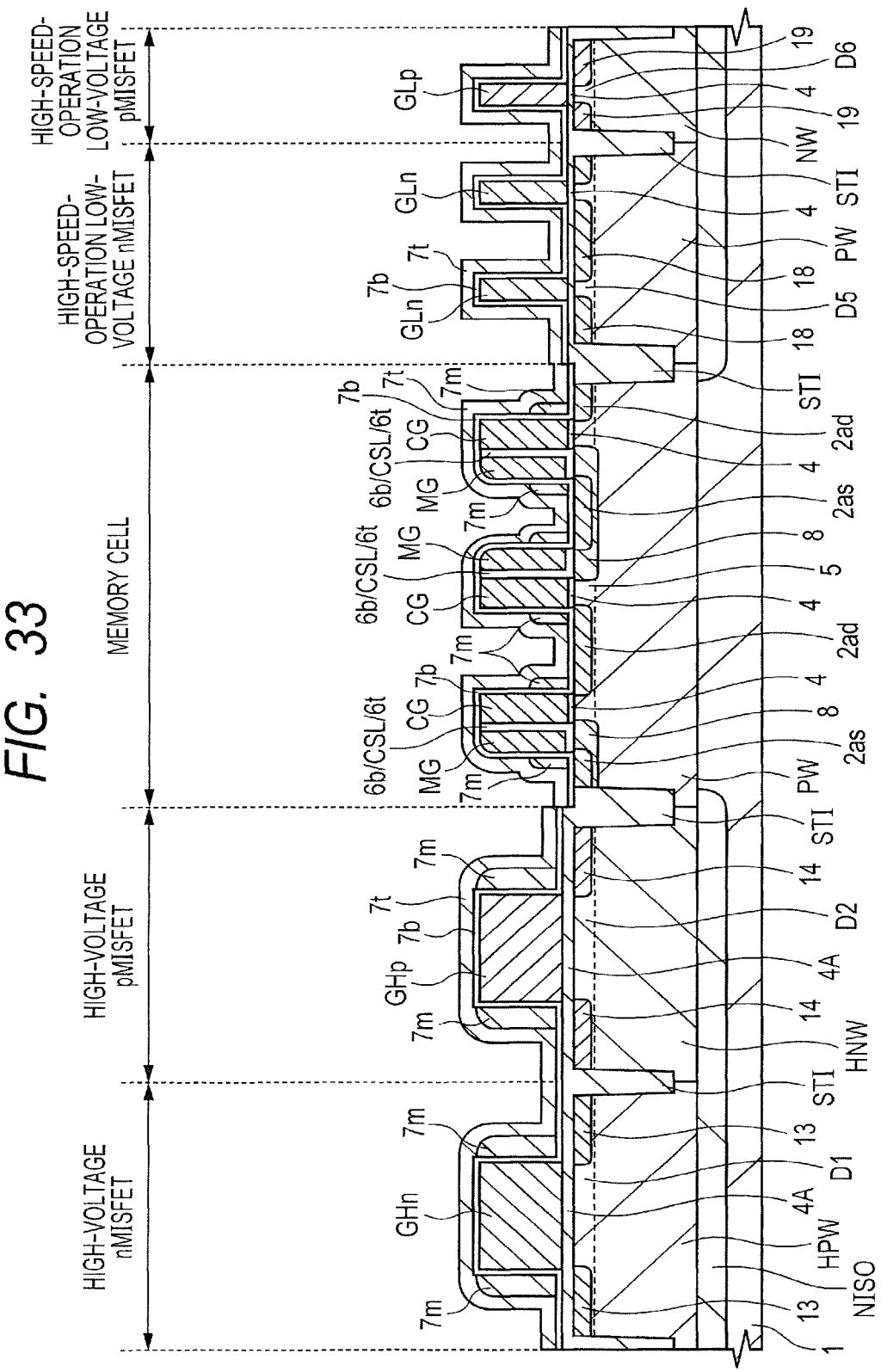
FIG. 33 is a main-portion cross-sectional view of the same portion of the semiconductor device as shown in FIG. 18 in a manufacturing step of the semiconductor device, which is subsequent to FIG. 32.

Next, as shown in FIG. 33, after the photoresist pattern RP2 is removed, over the main surface of the semiconductor substrate 1, the third insulating film (e.g., silicon oxide film) 7t is deposited by a CVD method. The thickness of the third insulating film 7t is, e.g., about 20 to 30 nm.

Figure 34:
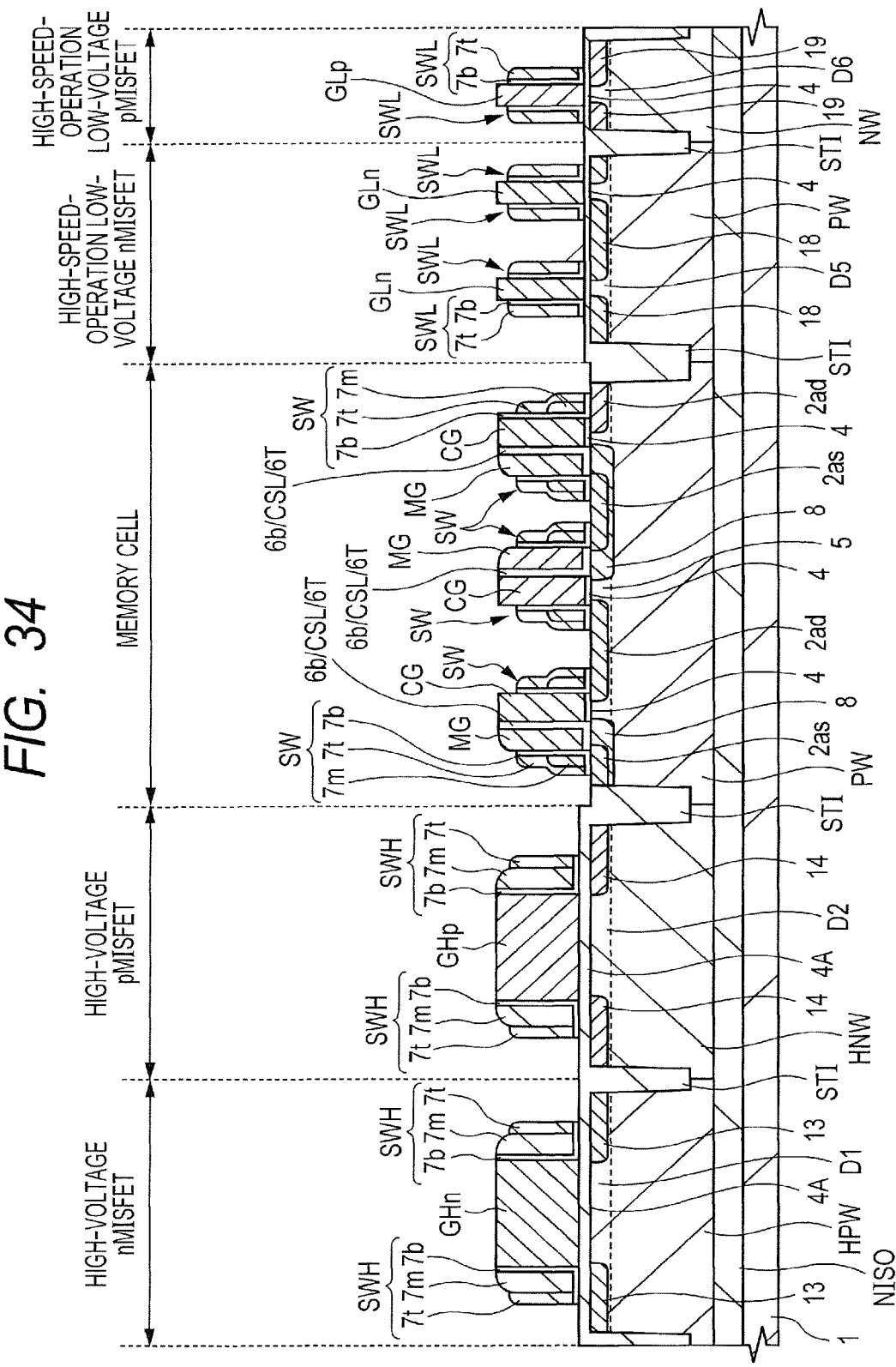
FIG. 34 is a main-portion cross-sectional view of the same portion of the semiconductor device as shown in FIG. 18 in a manufacturing step of the semiconductor device, which is subsequent to FIG. 33.

Next, as shown in FIG. 34, the third insulating film 7t is etched back by anisotropic dry etching. Then, the exposed first insulating film 7b is removed by dry etching or wet etching. Thus, in the memory region, over the side surfaces of the selection gate electrodes CG opposite to the memory gate electrodes MG and over the side surfaces of the memory gate electrodes MG, the sidewalls SW each including the first insulating film 7b, the second insulating film 7m, and the third insulating film 7t are formed. On the other hand, in the peripheral circuit region, over the respective side surfaces of the gate electrodes GHn of the first nMISFETs and the gate electrodes GHp of the first pMISFETs, the sidewalls SWH each including the first insulating film 7b, the second insulating film 7m, and the third insulating film 7t are formed and, over the respective side surfaces of the gate electrodes GLn of the third nMISFETs and the gate electrodes GLp of the third pMISFETs, the sidewalls SWL each including the first insulating film 7b and the third insulating film 7t are formed. The sidewall lengths of the foregoing sidewalls SW are, e.g., about 40 to 50 nm. The sidewall lengths of the foregoing sidewalls SWH are, e.g., about 80 to 90 nm. The sidewall lengths of the foregoing sidewalls SWL are, e.g., about 30 nm.

Figure 35:
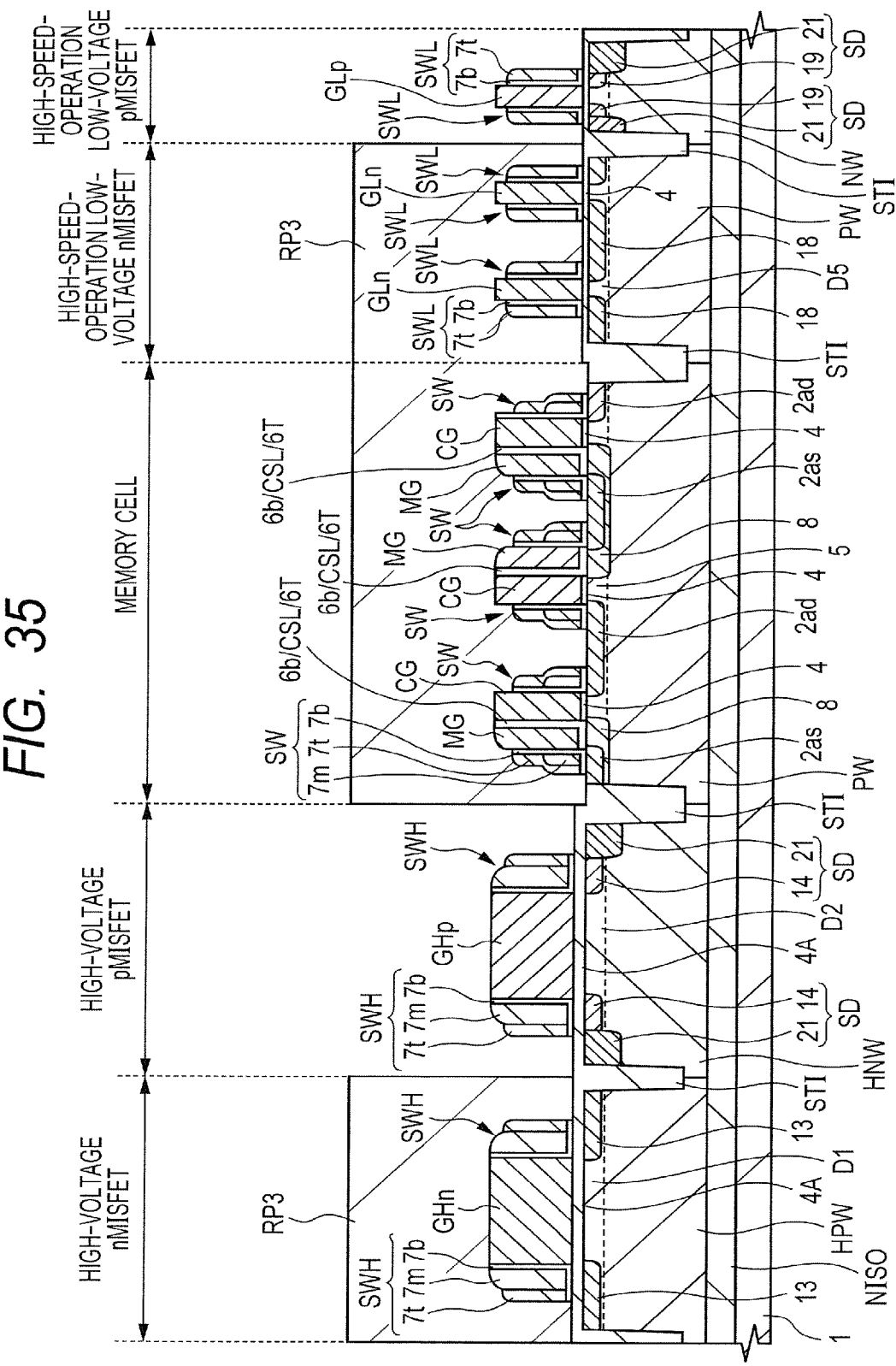
FIG. 35 is a main-portion cross-sectional view of the same portion of the semiconductor device as shown in FIG. 18 in a manufacturing step of the semiconductor device, which is subsequent to FIG. 34.

Next, as shown in FIG. 35, into the main surface of the semiconductor substrate 1 in the first pMISFET region and the third pMISFET region, using a photoresist pattern RP3 as a mask, a p-type impurity, e.g., boron or a boron fluoride is ion-implanted to form the p⁺-type semiconductor regions 21 by self-alignment with respect to the gate electrodes GHp of the first pMISFETs and to the gate electrodes GLp of the third pMISFETs.

In this manner, the source/drain regions SD of the first pMISFETs including the p⁻-type semiconductor regions 14 and the p⁺-type semiconductor regions 21 are formed, and the source/drain regions SD of the third pMISFETs including the p⁻-type semiconductor regions 19 and the p⁺-type semiconductor regions 21 are formed.

Figure 36:
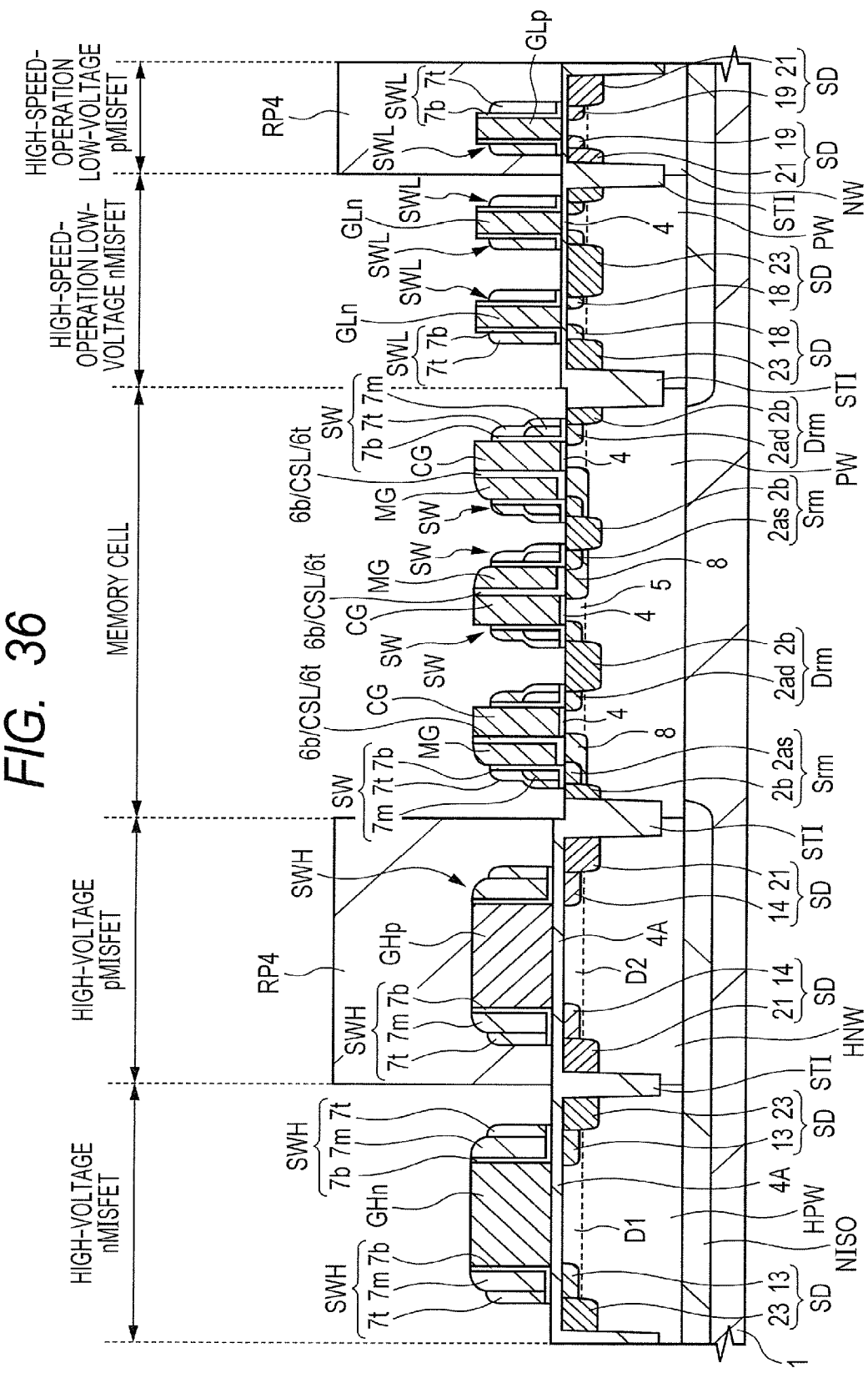
FIG. 36 is a main-portion cross-sectional view of the same portion of the semiconductor device as shown in FIG. 18 in a manufacturing step of the semiconductor device, which is subsequent to FIG. 35.

Next, as shown in FIG. 36, into the main surface of the semiconductor substrate 1 in the first nMISFET region, the memory region, and the third nMISFET region, using a photoresist pattern RP4 as a mask, an n-type impurity, e.g., arsenic or phosphorus is ion-implanted to form n⁺-type semiconductor regions 2b by self-alignment with respect to the selection gate electrodes CG and the memory gate electrodes MG in the memory region and form the n⁺-type semiconductor regions 23 by self-alignment with respect to the gate electrodes GHn of the first nMISFETs and the gate electrodes GLn of the third nMISFETs in the peripheral circuit region.

Thus, in the memory region, drain regions Drm including the n-type semiconductor regions 2ad and n⁺-type semiconductor regions 2b and source regions Srm including the n⁻-type semiconductor regions 2 as and n⁺-type semiconductor regions 2b are formed. In the peripheral circuit region, the source/drain regions SD of the first nMISFETs including the n⁻-type semiconductor regions 13 and the n⁺-type semiconductor regions 23 are formed, and the source/drain regions SD of the third nMISFETs including the n⁻-type semiconductor regions 18 and n⁺-type semiconductor regions 23 are formed.

Figure 37:
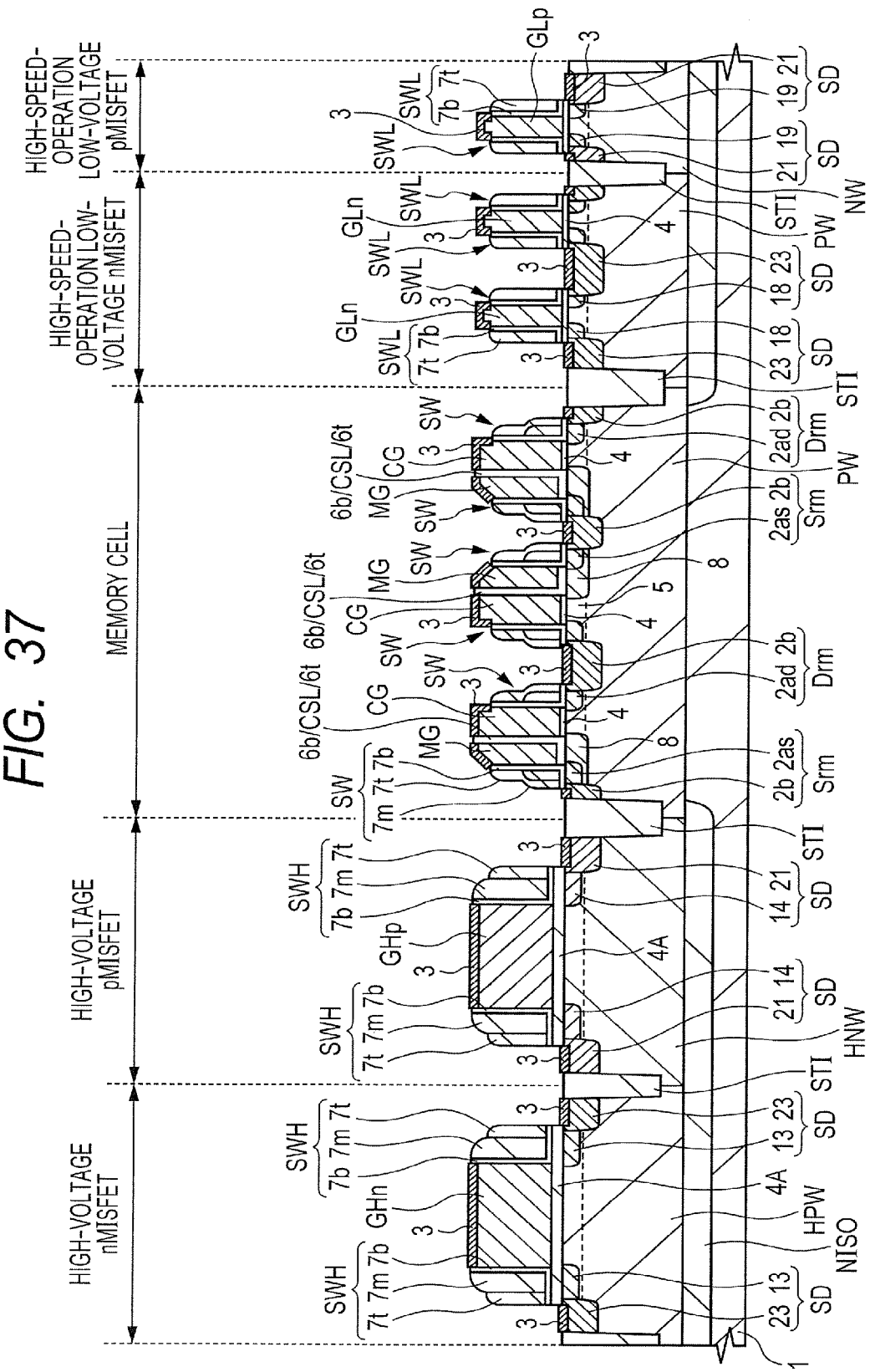
FIG. 37 is a main-portion cross-sectional view of the same portion of the semiconductor device as shown in FIG. 18 in a manufacturing step of the semiconductor device, which is subsequent to FIG. 36.

Next, as shown in FIG. 37, in the memory region, the silicide layers 3 are formed over the selection gate electrodes CG and the memory gate electrodes MG and in the upper surfaces of the n⁺-type semiconductor regions 2b. Likewise, in the peripheral circuit region, the silicide layers 3 are formed over the gate electrodes GHn of the first nMISFETs, in the upper surfaces of the n⁺-type semiconductor regions 23, over the gate electrodes GHp of the first pMISFETs, in the upper surfaces of the p⁺-type semiconductor regions 21, over the gate electrodes GLn of the third nMISFETs, in the upper surfaces of the n⁺-type semiconductor regions 23, over the gate electrodes GLp of the third pMISFETs, and in the upper surfaces of the p⁺-type semiconductor regions 21.

Thereafter, in the same manner as in the manufacturing method described above, an interlayer insulating film is formed. Subsequently, in the memory region, contact holes reaching the silicide layers 3 over the drain regions Drm are formed while, in the peripheral circuit region, contact holes reaching the silicide layers 3 formed over the gate electrodes GHn, GHp, GLn, and GLp of the first nMISFETs, the first pMISFETs, the third nMISFETs, and the third pMISFETs and in the upper surfaces of the respective source/drain regions SD thereof are formed. Subsequently, plugs are formed in these contact holes, and then a first-layer interconnect wire is formed.

By the manufacturing method described above, in the memory region, the nonvolatile memory cells are substantially completed while, in the peripheral circuit region, the first nMISFETs, the first pMISFETs, the third nMISFETs, and the third pMISFETs are substantially completed.

Thus, in Embodiment 1, in the manufacturing processes (of three kinds in Embodiment 1) for forming the plurality of sidewalls SWL, SWM (or SW), and SWH having different sidewall lengths, the foregoing sidewalls SWL, SWM (or SW), and SWH are formed not only by anisotropic dry etching, but also by combining anisotropic dry etching with isotropic wet etching or isotropic dry etching. Accordingly, the number of anisotropic dry etching steps is reduced and, particularly in the third nMISFET region and the third pMISFET region which are formed in the peripheral circuit region and where layout densities are high, the semiconductor substrate 1 can be prevented from being partially cut between the adjacent gate electrodes GLn, between the adjacent gate electrodes GLn and GLp, and between the adjacent gate electrodes GLp.

In addition, in the third nMISFETs and third pMISFETs at high layout densities, the heights of the sidewalls SWL from the main surface of the semiconductor substrate 1 can be reduced. Accordingly, the coverage (embeddedness) of the interlayer insulating film 9 formed so as to cover the third nMISFETs and the third pMISFETs is improved. As a result, the interlayer insulating film 9 is more likely to enter the space between the adjacent gate electrodes GLn, the space between the adjacent gate electrodes GLn and GLp, and the space between the adjacent gate electrodes GLp. Consequently, a void which is one of factors causing shape defects in the contact holes CA is less likely to be formed.

Embodiment 2

A method of producing a semiconductor device having first nMISFETs, first pMISFETs, second nMISFETs, second pMISFETs, third nMISFETs, and third pMISFET which form a peripheral circuit according to Embodiment 2 will be described in the order of process steps using FIGS. 38 to 42. FIGS. 38 to 42 are main-portion cross-sectional views of an example of the first nMISFETs, the first pMISFETs, the second nMISFETs, the second pMISFETs, the third nMISFETs, and the third pMISFETs which are formed in the peripheral circuit region in the manufacturing steps of the semiconductor device. Each of the drawings shows a main-portion cross section in which channels are cut along the gate length directions of gate electrodes. In Embodiment 2, in the same manner as in Embodiment 1 described above, the first nMISFETs and the first pMISFETs are formed as, e.g., high-voltage MISFETs, the second nMISFETs and the second pMISFETs are formed as, e.g., low-leakage low-voltage MISFETs, and the third nMISFETs and the third pMISFETs are formed as, e.g., high-speed-operation low-voltage MISFETs.

The manufacturing process prior to and including the step of depositing the first insulating film 7b and the second insulating film 7m over the main surface of the semiconductor substrate 1 (manufacturing step described above using FIG. 6) is the same as in Embodiment 1 described above so that a description thereof is omitted.

Figure 38:
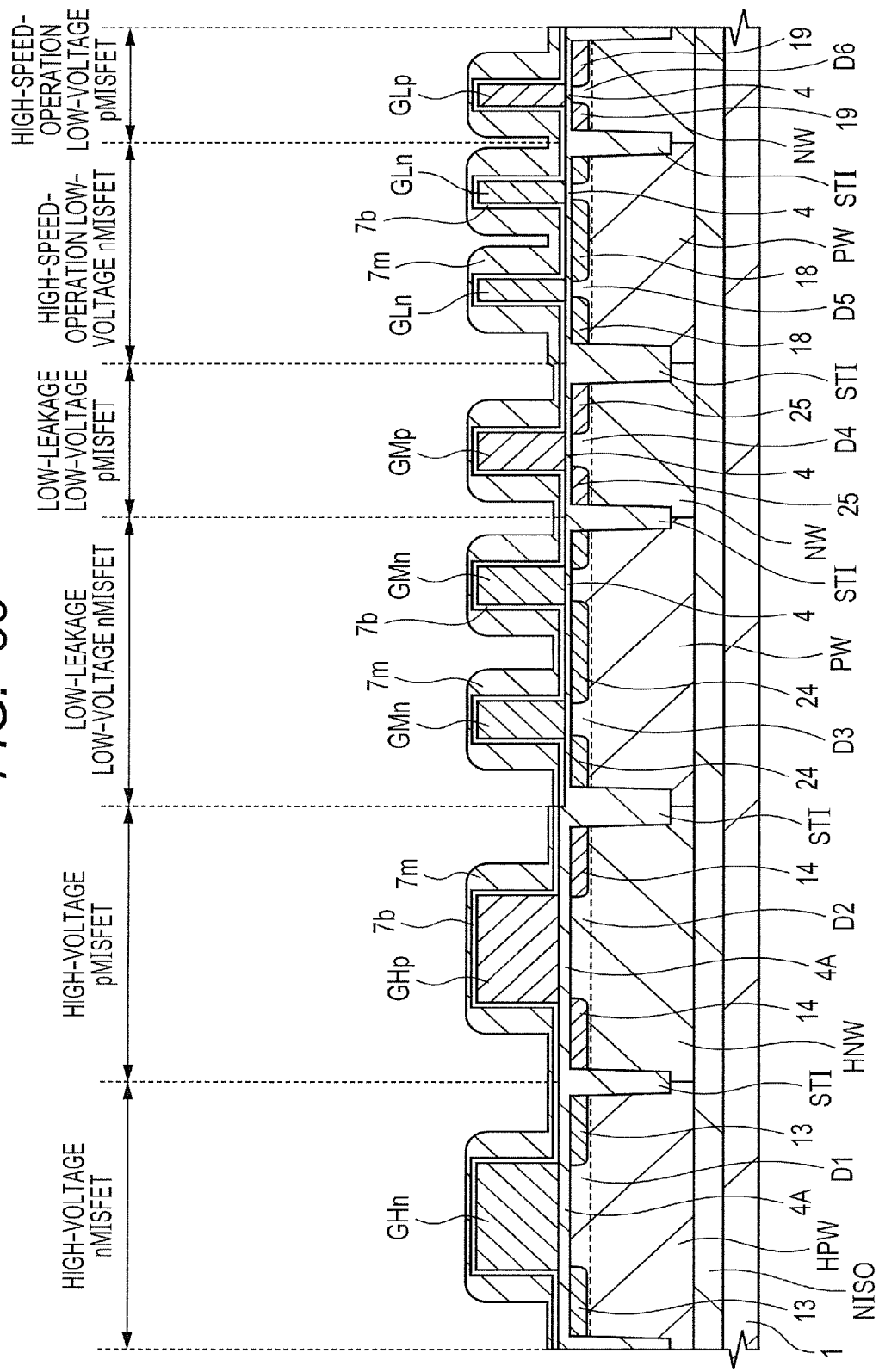
FIG. 38 is a main-portion cross-sectional view of a semiconductor device according to Embodiment 2 of the present invention, which illustrates a manufacturing step of the semiconductor device.

Subsequently to the manufacturing step described above using FIG. 6 in Embodiment 1, as shown in FIG. 38, the second insulating film 7m is etched back by anisotropic dry etching. Here, the second insulating film 7m is left such that the sidewalls have sidewall lengths (about 80 to 90 nm) which are needed to obtain operation characteristics required of the first nMISFETs and the first pMISFETs. In this manner, over the respective side surfaces of the gate electrodes GHn of the first nMISFETs, the gate electrodes GHp of the first pMISFETs, the gate electrodes GMn of the second nMISFETs, the gate electrodes GMp of the second pMISFETs, the gate electrodes GLn of the third nMISFETs, and the gate electrodes GLp of the third pMISFETs, the second insulating film 7m having a width of about 80 to 90 nm in a lateral direction (gate length direction) is left.

Here, the second insulating film 7m over the respective upper surfaces of the gate electrodes GHn of the first nMISFETs, the gate electrodes GHp of the first pMISFETs, the gate electrodes GMn of the second nMISFETs, the gate electrodes GMp of the second pMISFETs, the gate electrodes GLn of the third nMISFETs, and the gate electrodes GLp of the third pMISFETs and over the main surface of the semiconductor substrate 1 where the gate electrodes GHn of the first nMISFETs and the gate electrodes GHp of the first pMISFETs are not formed is removed completely or such that a part thereof (corresponding to, e.g., about 1 to 3 nm) remains. Since the etching selectivity between the first insulating film 7b and the second insulating film 7m is high, the first insulating film 7b is unlikely to be etched.

However, in the second nMISFET region and the second pMISFET region, the second insulating film 7m over the main surface of the semiconductor substrate 1 located between the adjacent gate electrodes GMn, between the adjacent gate electrodes GMn and GMp, and between the adjacent gate electrodes GMp is not completely removed, but a part thereof (corresponding to, e.g., about 3 to 7 nm) is left. Likewise, in the third nMISFET region and the third pMISFET region, the second insulating film 7m over the main surface of the semiconductor substrate 1 located between the adjacent gate electrodes GLn, between the adjacent gate electrodes GLn and GLp, and between the adjacent gate electrodes GLp is not completely removed, but a part thereof (corresponding to, e.g., about 5 to 10 nm) is left. Note that, in the second nMISFET region and the second pMISFET region, depending on the spacings between the adjacent gate electrodes GMn, between the adjacent gate electrodes GMn and GMp, and between the adjacent gate electrodes GMp, the second insulating film 7m over the main surface of the semiconductor substrate 1 may also be removed completely.

Thus, in the second nMISFET region and the second pMISFET region, a part of the second insulating film 7m over the main surface of the semiconductor substrate 1 located between the adjacent gate electrodes GMn, between the adjacent gate electrodes GMn and GMp, and between the adjacent gate electrodes GMp is left and, in the third nMISFET region and the third pMISFET region, a part of the second insulating film 7m over the main surface of the semiconductor substrate 1 located between the adjacent gate electrodes GLn, between the adjacent gate electrodes GLn and GLp, and between the adjacent gate electrodes GLp is left. This can prevent the first insulating film 7b from being exposed to an etching gas for anisotropic dry etching, and therefore the first insulating film 7b remains without being etched.

Subsequently, wet etching is performed to remove the second insulating film 7m remaining over the main surface of the semiconductor substrate 1 located between the adjacent gate electrodes GMn, between the adjacent gate electrodes GMn and GMp, and between the adjacent gate electrodes GMp in the second nMISFET region and the second pMISFET region and remaining over the main surface of the semiconductor substrate 1 located between the adjacent gate electrodes GLn, between the adjacent gate electrodes GLn and GLp, and between the adjacent gate electrodes GLp in the third nMISFET region and the third pMISFET region. The first insulating film 7b is exposed to an etchant for wet etching, but damage by wet etching is far smaller than damage by anisotropic dry etching. Note that the second insulating film 7m thus remaining over the main surface of the semiconductor substrate 1 can also be removed by isotropic etching in the step described later. Accordingly, the foregoing wet etching is performed as necessary.

Figure 39:
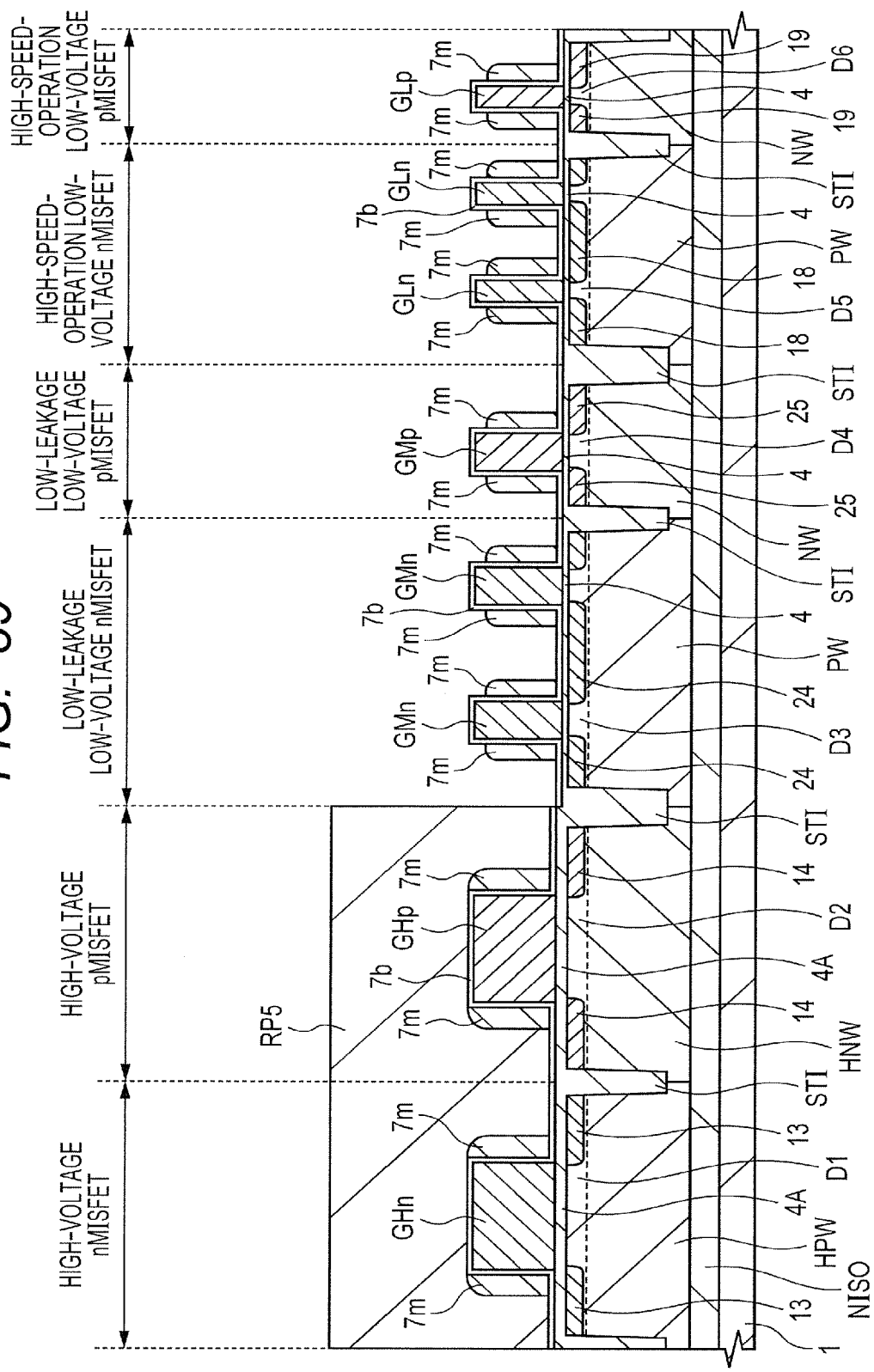
FIG. 39 is a main-portion cross-sectional view of the same portion of the semiconductor device as shown in FIG. 38 in a manufacturing step of the semiconductor device, which is subsequent to FIG. 38.

Next, as shown in FIG. 39, the first nMISFET region and the first pMISFET region are covered with a photoresist pattern RP5, and the second insulating film 7m in the second nMISFET region, the second pMISFET region, the third nMISFET region, and the third pMISFET region is processed by isotropic wet etching or isotropic dry etching. Since isotropic etching is used, the second insulating film 7m is etched from above in the vertical direction and in the lateral direction.

Here, the second insulating film 7m is left such that the sidewalls have sidewall lengths (40 to 50 nm) which are needed to obtain operation characteristics required of the second nMISFETs and the second pMISFETs. In this manner, over the respective side surfaces of the gate electrodes GMn of the second nMISFETs, the gate electrodes GMp of the second pMISFETs, the gate electrodes GLn of the third nMISFETs, and the gate electrodes GLp of the third pMISFETs, the second insulating film 7m having a width of about 40 to 50 nm in the lateral direction (gate length direction) is left. Since the etching selectivity between the first insulating film 7b and the second insulating film 7m is high, the first insulating film 7b is unlikely to be etched so that the main surface of the semiconductor substrate 1 is not partially cut.

Figure 40:
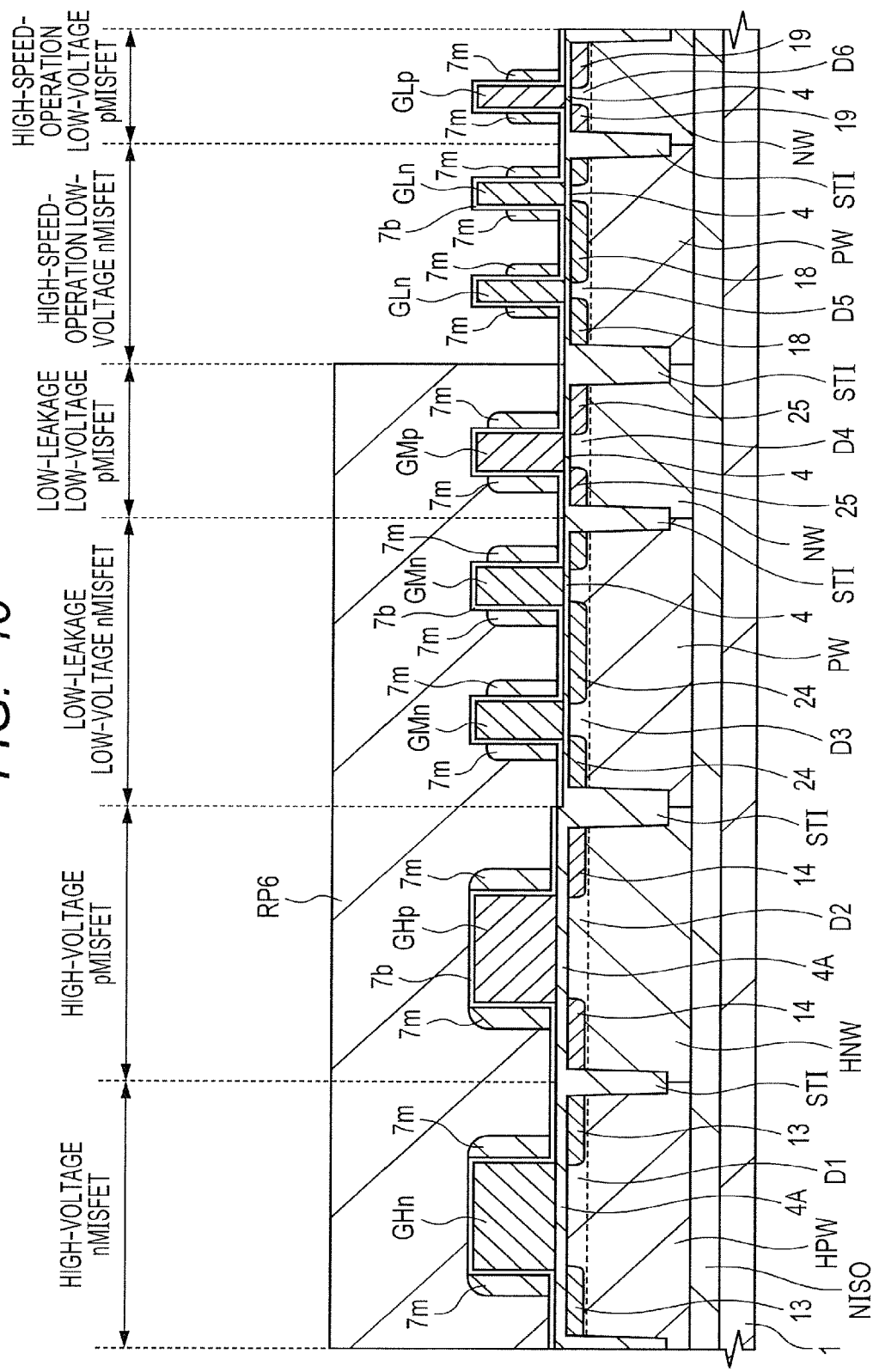
FIG. 40 is a main-portion cross-sectional view of the same portion of the semiconductor device as shown in FIG. 38 in a manufacturing step of the semiconductor device, which is subsequent to FIG. 39.

Next, as shown in FIG. 40, after the photoresist pattern RP5 is removed, the first nMISFET region, the first pMISFET region, the second nMISFET region, and the second pMISFET region are covered with a photoresist pattern PR6, and the second insulating film 7m in the third nMISFET region and the third pMISFET region is processed by isotropic wet etching or isotropic dry etching. Since isotropic etching is used, the second insulating film 7m is etched from above in the vertical direction and in the lateral direction.

Here, the second insulating film 7m is left such that the sidewalls have sidewall lengths (about 30 nm) which are needed to obtain operation characteristics required of the third nMISFETs and the third pMISFETs. In this manner, over the respective side surfaces of the gate electrodes GLn of the third nMISFETs and the gate electrodes GLp of the third pMISFETs, the second insulating film 7m having a width of about 30 nm in the lateral direction (gate length direction) is left. Since the etching selectivity between the first insulating film 7b and the second insulating film 7m is high, the first insulating film 7b is unlikely to be etched so that the main surface of the semiconductor substrate 1 is not partially cut.

Figure 41:
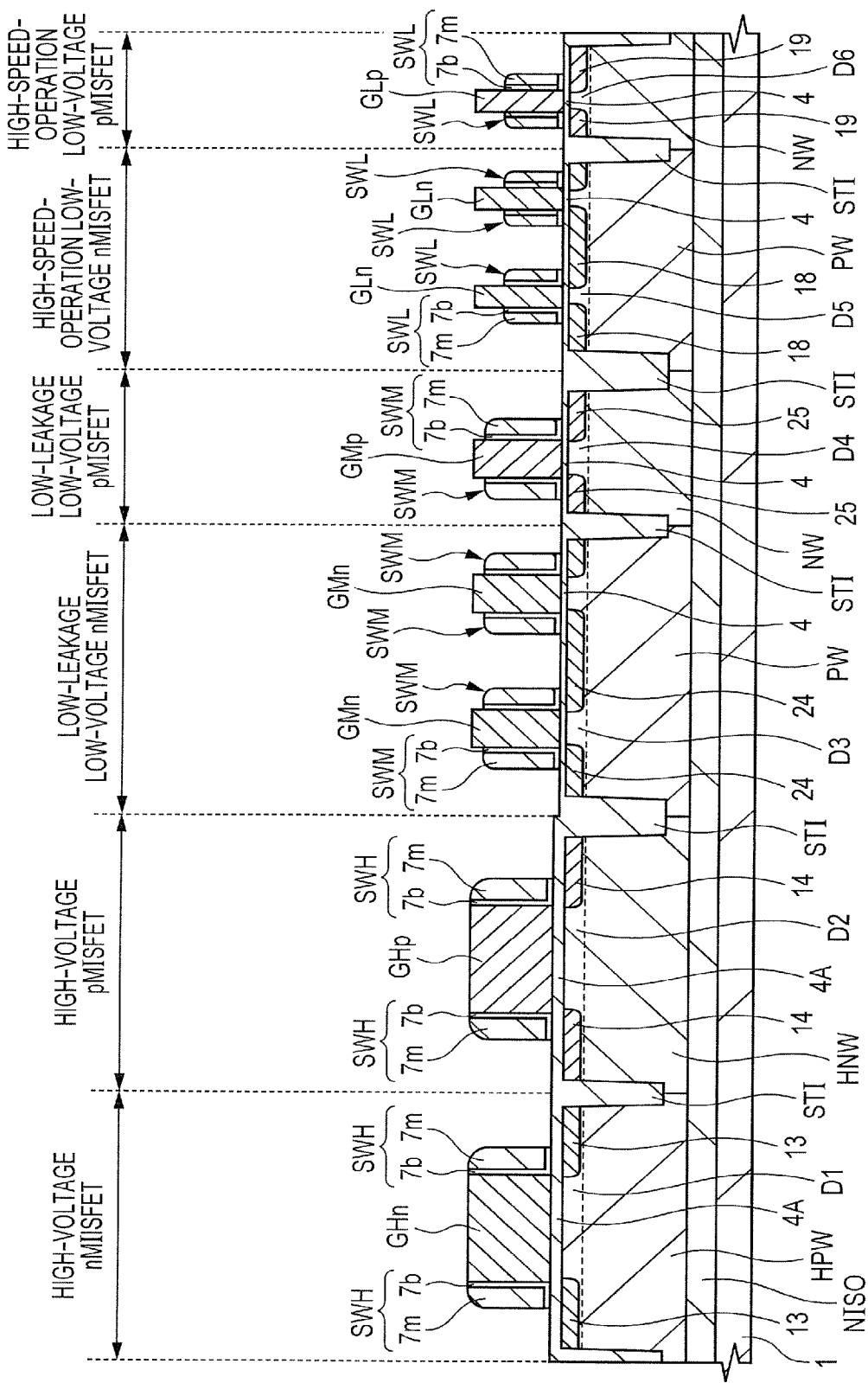
FIG. 41 is a main-portion cross-sectional view of the same portion of the semiconductor device as shown in FIG. 38 in a manufacturing step of the semiconductor device, which is subsequent to FIG. 40.

Next, as shown in FIG. 41, after the photoresist pattern PR6 is removed, the exposed first insulating film 7b is removed by dry etching or wet etching.

Thus, in the first nMISFETs and the first pMISFETs, over the side surfaces of the gate electrodes GHn and GHp, the sidewalls SWH each including the first insulating film 7b and the second insulating film 7m are formed. In the second nMISFETs and the second pMISFETs, over the side surfaces of the gate electrodes GMn and GMp, the sidewalls SWM each including the first insulating film 7b and the second insulating film 7m are formed. In the third nMISFETs and the third pMISFETs, over the side surfaces of the gate electrodes GLn and GLp, the sidewalls SWL each including the first insulating film 7b and the second insulating film 7m are formed.

The sidewall lengths of the sidewalls SWH provided in the first nMISFETs and the first pMISFETs are the longest, and the sidewall lengths of the sidewalls SWM provided in the second nMISFETs and the second pMISFETs and the sidewall lengths of the sidewalls SWL provided in the third nMISFETs and the third pMISFETs are progressively shorter in this order. The sidewall lengths of the foregoing sidewalls SWH are, e.g., about 80 to 90 nm. The sidewall lengths of the foregoing sidewalls SWM are, e.g., about 40 to 50 nm. The sidewall lengths of the foregoing sidewalls SWL are, e.g., about 30 nm.

Thus, in the third nMISFETs and the third pMISFETs, the sidewall lengths of the sidewalls SWL are shorter than the sidewall lengths of the sidewalls SWH of the first nMISFETs and the first pMISFETs and the sidewall lengths of the sidewalls SWM of the second nMISFETs and the second pMISFETs, and the area of the semiconductor substrate 1 between the adjacent sidewalls SWL can be maximized. Therefore, it is possible to suppress fluctuations in etching speed when the first insulating film 7b is etched.

In addition, the heights of the sidewalls SWH provided in the first nMISFETs and the first pMISFETs from the main surface of the semiconductor substrate 1 are the highest, and the heights of the sidewalls SWM provided in the second nMISFETs and the second pMISFETs from the main surface of the semiconductor substrate 1 and the heights of the sidewalls SWL provided in the third nMISFETs and the third pMISFETs from the main surface of the semiconductor substrate 1 are progressively shorter in this order.

Figure 42:
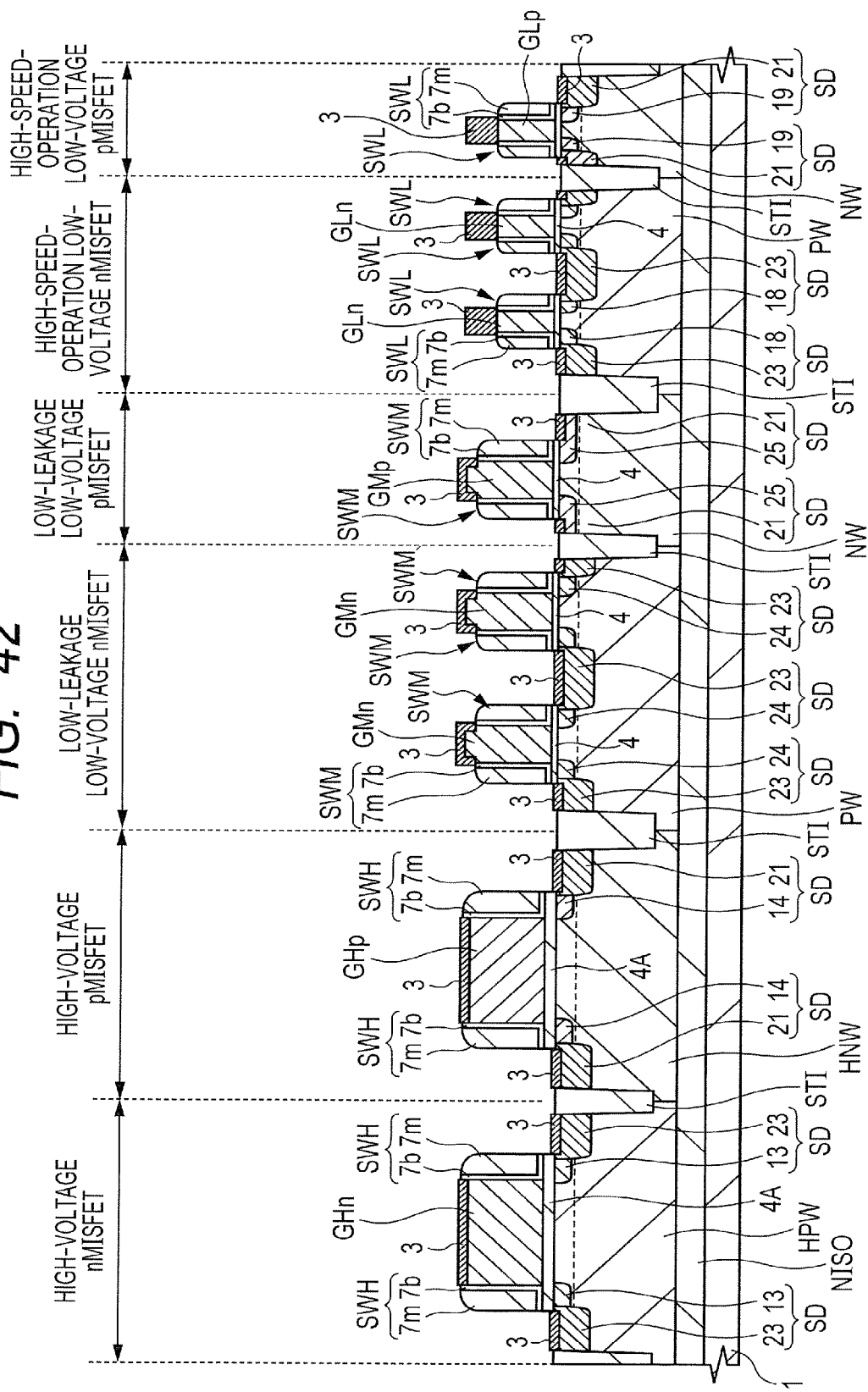
FIG. 42 is a main-portion cross-sectional view of the same portion of the semiconductor device as shown in FIG. 38 in a manufacturing step of the semiconductor device, which is subsequent to FIG. 41.

Next, as shown in FIG. 42, the source/drain regions SD of the first nMISFETs including the $n^-$-type semiconductor regions 13 and the $n^+$-type semiconductor regions 23 are formed, the source/drain regions SD of the second nMISFETs including the $n^-$-type semiconductor regions 24 and the $n^+$-type semiconductor regions 23 are formed, and the source/drain regions SD of the third nMISFETs including the $n^-$-type semiconductor regions 18 and the $n^+$-type semiconductor regions 23 are formed.

Also, the source/drain regions SD of the first pMISFETs including the p⁻-type semiconductor regions 14 and the p⁺-type semiconductor regions 21 are formed, the source/drain regions SD of the second pMISFETs including the p⁻-type semiconductor regions 25 and the p⁺-type semiconductor regions 21 are formed, and the source/drain regions SD of the third pMISFETs including the p⁻-type semiconductor regions 19 and the p⁺-type semiconductor regions 21 are formed.

Next, over the gate electrodes GHn of the first nMISFETs, in the upper surfaces of the n⁺-type semiconductor regions 23, over the gate electrodes GHp of the first pMISFETs, in the upper surfaces of the p⁺-type semiconductor regions 21, over the gate electrodes GMn of the second nMISFETs, in the upper surfaces of the n⁺-type semiconductor regions 23, over the gate electrodes GMp of the second pMISFETs, in the upper surfaces of the p⁺-type semiconductor regions 21, over the gate electrodes GLn of the third nMISFETs, in the upper surfaces of the n⁺-type semiconductor regions 23, over the gate electrodes GLp of the third pMISFETs, and in the upper surfaces of the p⁺-type semiconductor regions 21, the silicide layers 3 are formed by a salicide process.

Here, in the first nMISFETs and the first pMISFETs, a silicide reaction proceeds from the exposed upper surfaces of the gate electrodes GHn and GHp. On the other hand, in the second nMISFETs and the second pMISFETs, a silicide reaction proceeds from the exposed upper surfaces and both side surfaces of the gate electrodes GMn and GMp. Likewise, in the third nMISFETs and the third pMISFETs, a silicide reaction proceeds from the exposed upper surfaces and both side surfaces of the gate electrodes GLn and GLp. Consequently, even over the both side surfaces of the upper portions of the gate electrodes GMn, GMp, GLn, and GLp, the silicide layers 3 are formed. Therefore, the resistances of the gate electrodes GMn, GMp, GLn, and GLp can be further reduced.

In the third nMISFETs and the third pMISFETs, the gate lengths are relatively short. As a result, the portions of the silicide layer 3 formed by the silicide reaction which proceeds from the both side surfaces of the upper portion of each of the gate electrodes GLn and GLp are likely to be united. In this case, the film thickness of the entire silicide layer 3 equals the total thickness of the film thickness of the portion of the silicide layer 3 formed from the upper surface and the film thicknesses of the portions thereof formed from the both side surfaces of the upper portion. Accordingly, the film thicknesses of the silicide layers 3 formed over the gate electrodes GLn and GLp of the third nMISFETs and the third pMISFETs are larger than the film thicknesses of the silicide layers 3 formed over the gate electrodes GHn and GHp of the first nMISFETs and the first pMISFETs. This further reduces the resistances of the gate electrodes GLn and GLp to allow a high-speed operation.

In the second nMISFETs and the second pMISFETs also, when the portions of the silicide layer 3 formed by the silicide reaction which proceeds from the both side surfaces of the upper portion of each of the gate electrodes GMn and GMp are similarly united, the film thickness of the entire silicide layer 3 equals the total thickness of the film thickness of the portion of the silicide layer 3 formed from the upper surface and the film thicknesses of the portions thereof formed from the both side surfaces of the upper portion, though not shown. Accordingly, the film thicknesses of the silicide layers 3 formed over the gate electrodes GMn and GMp of the second nMISFETs and the second pMISFETs may conceivably be larger than the film thicknesses of the silicide layers 3 formed over the gate electrodes GHn and GHp of the first nMISFETs and the first pMISFETs.

It is considered that, in such a case, the film thicknesses of the silicide layers 3 formed over the gate electrodes GMn and GMp of the second nMISFETs and the second pMISFETs are larger than the film thicknesses of the silicide layers 3 formed over the gate electrodes GHn and GHp of the first nMISFETs and the first pMISFETs, and the film thicknesses of the silicide layers 3 formed over the gate electrodes GLn and GLp of the third nMISFETs and the third pMISFETs are larger than the film thicknesses of the silicide layers 3 formed over the gate electrodes GMn and GMp of the second nMISFETs and the second pMISFETs.

Thereafter, in the same manner as in the manufacturing method of Embodiment 1 described above, an interlayer insulating film, contact holes, plugs, interconnect wires, and the like are formed successively.

In the third nMISFETs and the third pMISFETs at high layout densities, the heights of the sidewalls SWL from the main surface of the semiconductor substrate 1 can be reduced. Accordingly, the coverage (embeddedness) of the interlayer insulating film formed so as to cover these MISFETs is improved. As a result, the interlayer insulating film is more likely to enter the space between the adjacent gate electrodes GLn, the space between the adjacent gate electrodes GLn and GLp, and the space between the adjacent gate electrodes GLp. Consequently, a void which is one of factors causing shape defects in the contact holes is less likely to be formed.

Note that, in the same manner as in Embodiment 1 described above, as the MISFETs including the gate electrodes having gate lengths shorter than those of the gate electrodes GHn and GHp of the first nMISFETs and the first pMISFETs and longer than those of the gate electrodes GLn and GLp of the third nMISFETs and the third pMISFETs, the second nMISFETs and the second pMISFETs are shown by way of example, but such MISFETs are not limited thereto. For example, the nonvolatile memory cells formed in the memory region can also be shown by way of example.

Figure 43:
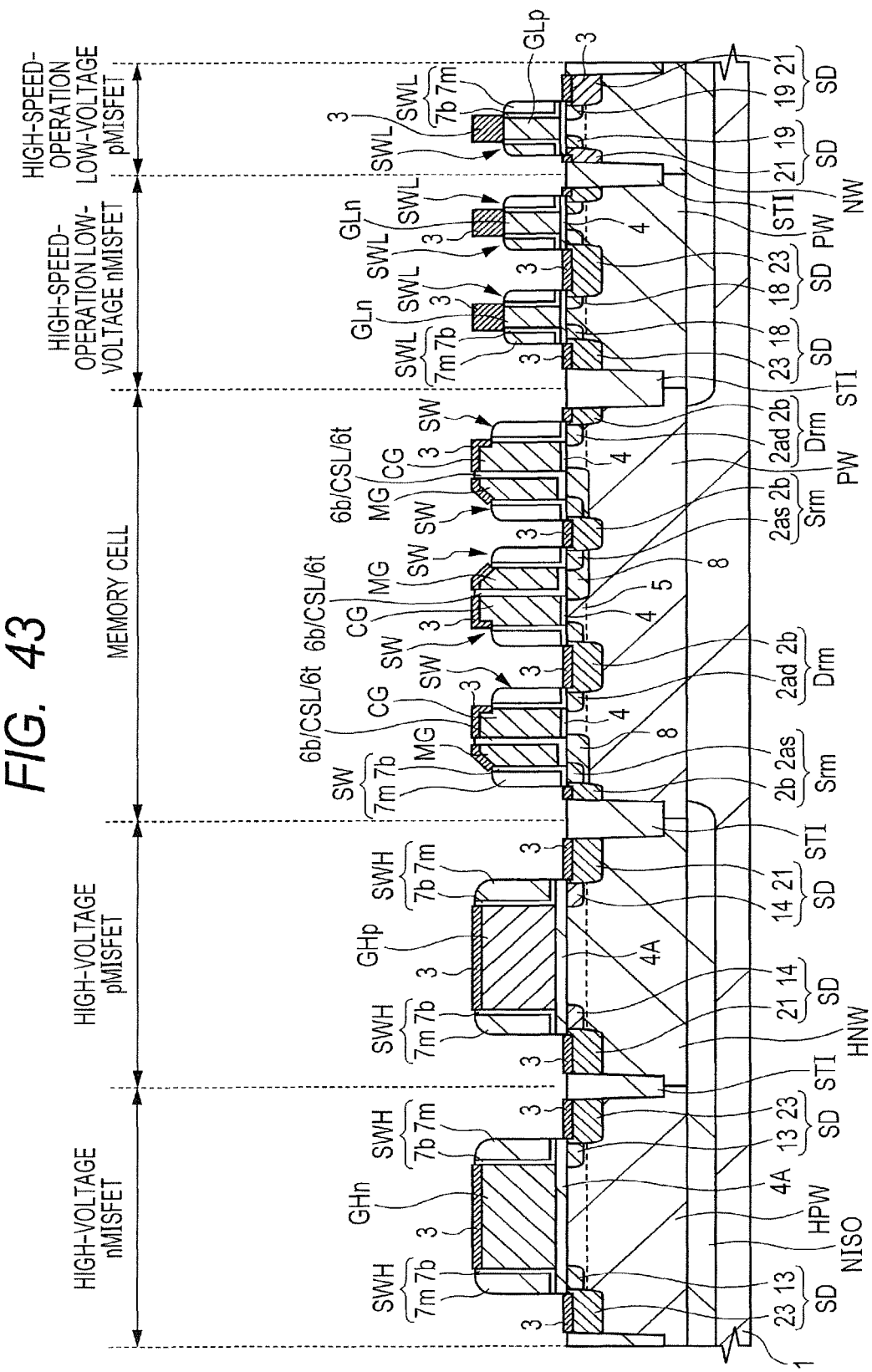
FIG. 43 is a main-portion cross-sectional view of the semiconductor device according to Embodiment 2 of the present invention, which illustrates another example of a manufacturing step of the semiconductor device.

FIG. 43 shows a main-portion cross-sectional view of an example of the semiconductor device including the nonvolatile memory cells according to Embodiment 2 and the first nMISFETs, the first pMISFETs, the third nMISFETs, and the third pMISFETs each forming the peripheral circuit.

As shown in FIG. 43, the structures and manufacturing method of the first, nMISFETs, the first pMISFETs, the third nMISFETs, and the third pMISFETs are the same as those described above. On the other hand, the structures and manufacturing method of the gate electrodes (selection gate electrodes CG and the memory gate electrode MG) of the nonvolatile memory cells are different in the structures and manufacturing method of the second nMISFETs and the second pMISFETs. However, the structure and manufacturing method of the sidewalls SW are substantially the same as those described above using FIGS. 38 to 41.

Therefore, the sidewall lengths (e.g., 80 to 90 nm) of the sidewalls SWH provided in the first nMISFETs and the first pMISFETs are the longest, and the sidewall lengths (e.g., 40 to 50 nm) of the sidewalls SW provided in the nonvolatile memory cells and the sidewall lengths (e.g., 30 nm) of the sidewalls SWL provided in the third nMISFETs and the third pMISFETs are progressively shorter in this order. Also, the heights of the sidewalls SWH provided in the first nMISFETs and the first pMISFETs from the main surface of the semiconductor substrate 1 are the highest, and the heights of the sidewalls SW provided in the nonvolatile memory cells from the main surface of the semiconductor substrate 1 and the heights of the sidewalls SWL provided in the third nMISFETs and the third pMISFETs from the main surface of the semiconductor substrate 1 are progressively shorter in this order.

Thus, in Embodiment 2, in the manufacturing processes (of three kinds in Embodiment 2) for forming the plurality of sidewalls SWL, SWM (or SW), and SWH having different sidewall lengths, after anisotropic dry etching is performed once, isotropic wet etching or isotropic dry etching is performed a plurality of times (twice in Embodiment 2) to form the foregoing sidewalls SWL, SWM (or SW), and SWH. As a result, particularly in the third nMISFET region and the third pMISFET region which are formed in the peripheral circuit region and where layout densities are high, the semiconductor substrate 1 can be prevented from being partially cut between the adjacent gate electrodes GLn, between the adjacent gate electrodes GLn and GLp, and between the adjacent gate electrodes GLp.

Embodiment 3

A method of producing a semiconductor device having first nMISFETs, first pMISFETs, second nMISFETs, second pMISFETs, third nMISFETs, and third pMISFETs which form a peripheral circuit according to Embodiment 3 will described in the order of process steps using FIGS. 44 to 47. FIGS. 44 to 47 are main-portion cross-sectional views of an example of the first nMISFET, the first pMISFET, the second nMISFET, the second pMISFET, the third nMISFET, and the third pMISFET which are formed in the peripheral circuit region in the manufacturing steps of the semiconductor device. Each of the drawings shows a main-portion cross section in which channels are cut along the gate length directions of gate electrodes. In Embodiment 3, in the same manner as in Embodiment 1 described above, the first nMISFETs and the first pMISFETs are formed as, e.g., high-voltage MISFETs, the second nMISFETs and the second pMISFETs are formed as, e.g., low-leakage low-voltage MISFETs, and the third nMISFETs and the third pMISFETs are formed as, e.g., high-speed-operation low-voltage MISFETs.

The manufacturing process prior to and including the step of depositing the first insulating film 7b and the second insulating film 7m over the main surface of the semiconductor substrate 1 (manufacturing step described above using FIG. 6) is the same as in Embodiment 1 described above so that a description thereof is omitted.

Figure 44:
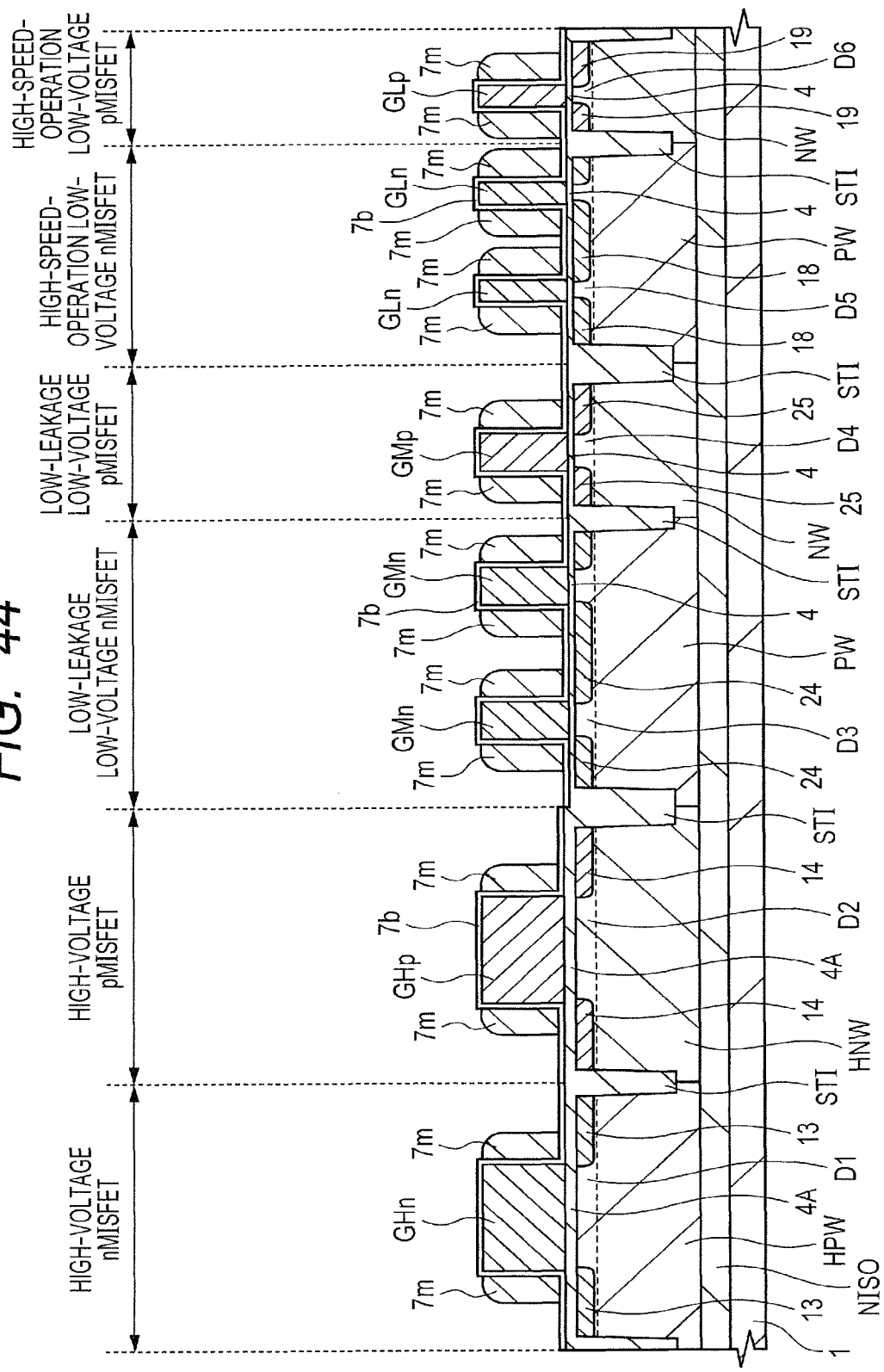
FIG. 44 is a main-portion cross-sectional view of a semiconductor device according to Embodiment 3 of the present invention, which illustrates a manufacturing step of the semiconductor device.

Subsequently to the manufacturing step described above using FIG. 6 in Embodiment 1, as shown in FIG. 44, the second insulating film 7m is etched back by anisotropic dry etching. Here, the second insulating film 7m is left such that the sidewalls have sidewall lengths (about 80 to 90 nm) which are needed to obtain operation characteristics required of the first nMISFETs and the first pMISFETs. In this manner, over the respective side surfaces of the gate electrodes GHn of the first nMISFETs, the gate electrodes GHp of the first pMISFETs, the gate electrodes GMn of the second nMISFETs, the gate electrodes GMp of the second pMISFETs, the gate electrodes GLn of the third nMISFETs, and the gate electrodes GLp of the third pMISFETs, the second insulating film 7m having a width of about 80 to 90 nm in a lateral direction (gate length direction) is left. Since the etching selectivity between the first insulating film 7b and the second insulating film 7m is high, the first insulating film 7b is unlikely to be etched.

On the other hand, the second insulating film 7m over the respective upper surfaces of the gate electrodes GHn of the first nMISFETs, the gate electrodes GHp of the first pMISFETs, the gate electrode GMn of the second nMISFETs, the gate electrode GMp of the second pMISFETs, the gate electrode GLn of the third nMISFETs, and the gate electrode GLp of the third pMISFETs and over the main surface of the semiconductor substrate 1 where the gate electrodes GHn, GHp, GMn, GMp, GLn, and GLp are not formed is removed completely.

Figure 45:
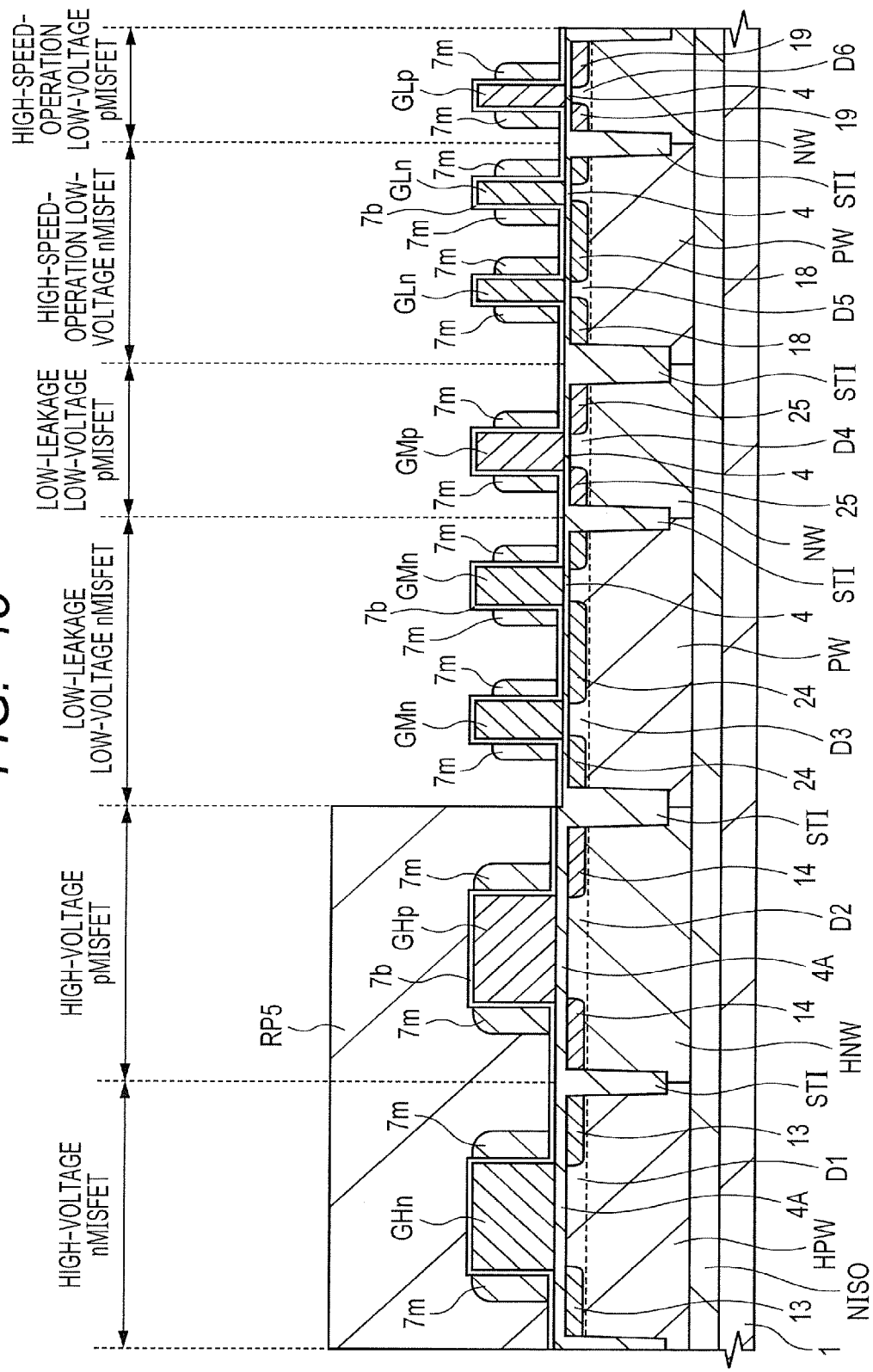
FIG. 45 is a main-portion cross-sectional view of the same portion of the semiconductor device as shown in FIG. 44 in a manufacturing step of the semiconductor device, which is subsequent to FIG. 44.

Next, as shown in FIG. 45, the first nMISFET region and the first pMISFET region are covered with the photoresist pattern RP5, and the second insulating film 7m in the second nMISFET region, the second pMISFET region, the third nMISFET region, and the third pMISFET region is processed by isotropic wet etching or isotropic dry etching. Since isotropic etching is used, the second insulating film 7m is etched from above in the vertical direction and in the lateral direction.

Here, the second insulating film 7m is left such that the sidewalls have sidewall lengths (40 to 50 nm) which are needed to obtain operation characteristics required of the second nMISFETs and the second pMISFETs. In this manner, over the respective side surfaces of the gate electrodes GMn of the second nMISFETs, the gate electrodes GMp of the second pMISFETs, the gate electrodes GLn of the third nMISFETs, and the gate electrodes GLp of the third pMISFETs, the second insulating film 7m having a width of about 40 to 50 nm in the lateral direction (gate length direction) is left. Since the etching selectivity between the first insulating film 7b and the second insulating film 7m is high, the first insulating film 7b is unlikely to be etched so that the main surface of the semiconductor substrate 1 is not partially cut.

Figure 46:
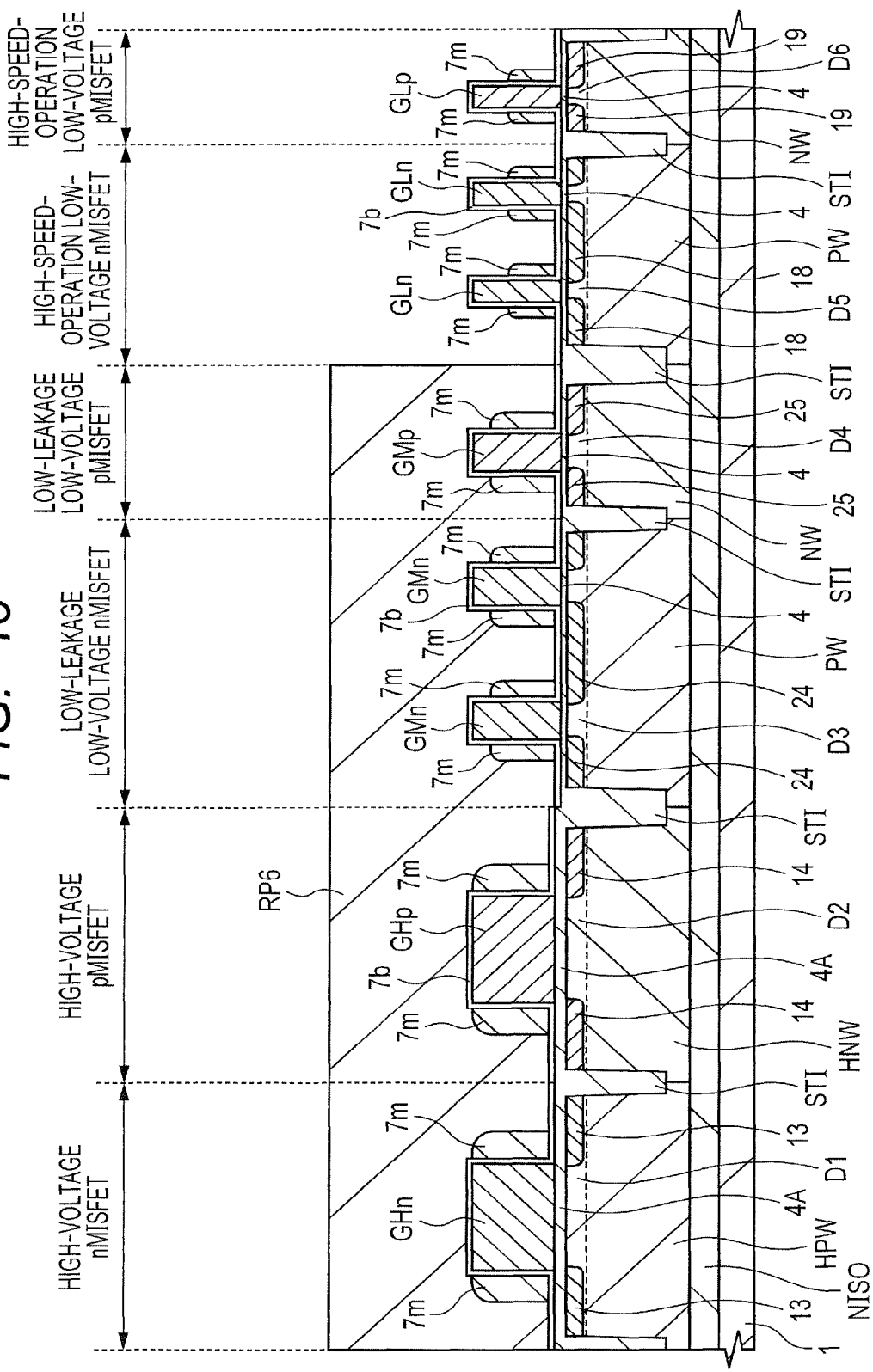
FIG. 46 is a main-portion cross-sectional view of the same portion of the semiconductor device as shown in FIG. 44 in a manufacturing step of the semiconductor device, which is subsequent to FIG. 45.

Next, as shown in FIG. 46, after the photoresist pattern RP5 is removed, the first nMISFET region, the first pMISFET region, the second nMISFET region, and the second pMISFET region are covered with a photoresist pattern PR6, and the second insulating film 7m in the third nMISFET region and the third pMISFET region is processed by isotropic wet etching or isotropic dry etching. Since isotropic etching is used, the second insulating film 7m is etched from above in the vertical direction and in the lateral direction.

Here, the second insulating film 7m is left such that the sidewalls have sidewall lengths (about 30 nm) which are needed to obtain operation characteristics required of the third nMISFETs and the third pMISFETs. In this manner, over the respective side surfaces of the gate electrodes GLn of the third nMISFETs and the gate electrodes GLp of the third pMISFETs, the second insulating film 7m having a width of about 30 nm in the lateral direction (gate length direction) is left. Since the etching selectivity between the first insulating film 7b and the second insulating film 7m is high, the first insulating film 7b is unlikely to be etched so that the main surface of the semiconductor substrate 1 is not partially cut.

Figure 47:
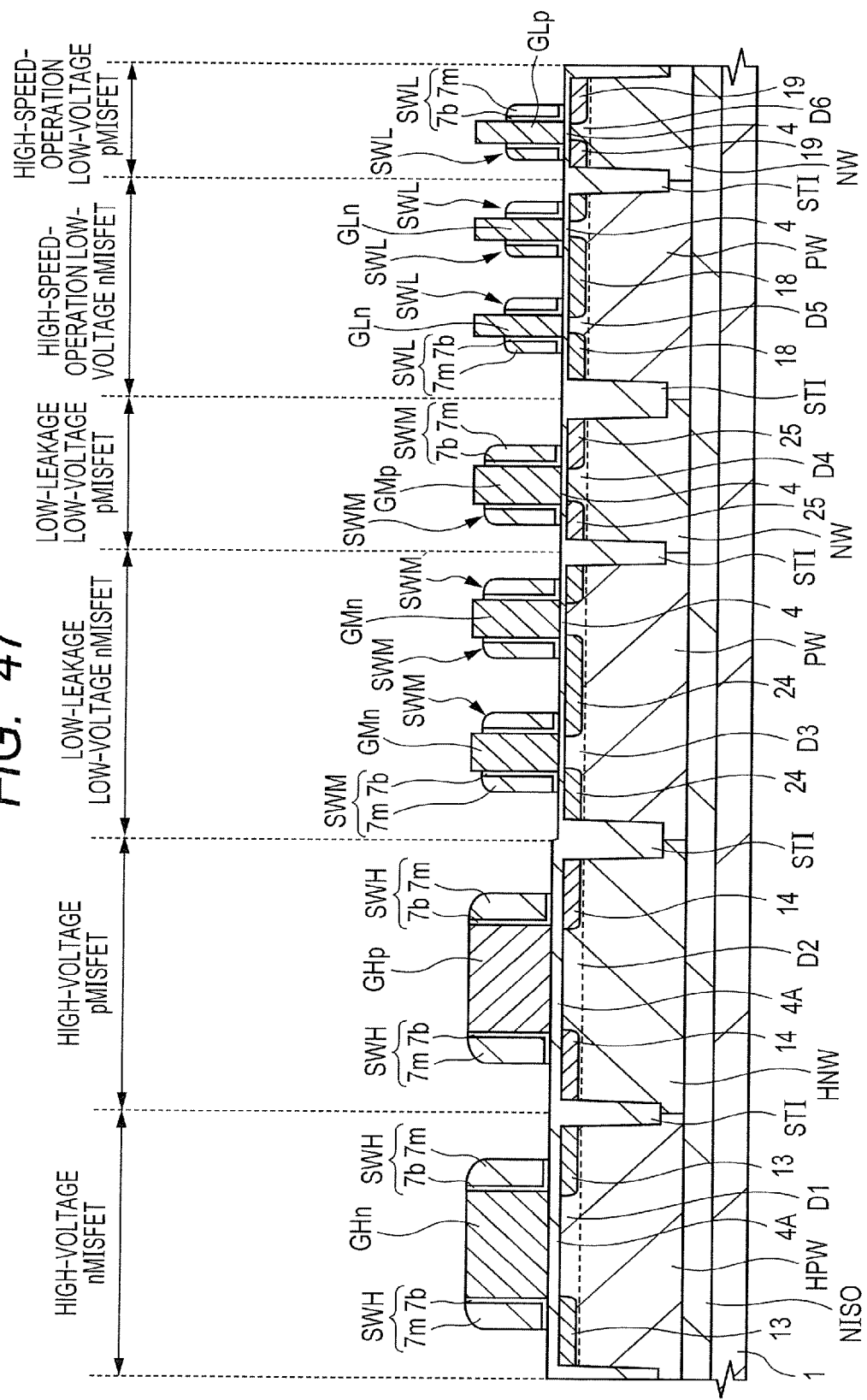
FIG. 47 is a main-portion cross-sectional view of the same portion of the semiconductor device as shown in FIG. 44 in a manufacturing step of the semiconductor device, which is subsequent to FIG. 46.

Next, as shown in FIG. 47, after the photoresist pattern PR6 is removed, the exposed first insulating film 7b is removed by dry etching or wet etching.

Thus, in the first nMISFETs and the first pMISFETs, over the side surfaces of the gate electrodes GHn and GHp, the sidewalls SWH each including the first insulating film 7b and the second insulating film 7m are formed. In the second nMISFETs and the second pMISFETs, over the side surfaces of the gate electrodes GMn and GMp, the sidewalls SWM each including the first insulating film 7b and the second insulating film 7m are formed. In the third nMISFETs and the third pMISFETs, over the side surfaces of the gate electrodes GLn and GLp, the sidewalls SWL each including the first insulating film 7b and the second insulating film 7m are formed.

The sidewall lengths of the sidewalls SWH provided in the first nMISFETs and the first pMISFETs are the longest, and the sidewall lengths of the sidewalls SWM provided in the second nMISFETs and the second pMISFETs and the sidewall lengths of the sidewalls SWL provided in the third nMIS- FETs and the third pMISFETs are progressively shorter in this order. The sidewall lengths of the foregoing sidewalls SWH are, e.g., about 80 to 90 nm. The sidewall lengths of the foregoing sidewalls SWM are, e.g., about 40 to 50 nm. The sidewall lengths of the foregoing sidewalls SWL are, e.g., about 30 nm.

In addition, the heights of the sidewalls SWH provided in the first nMISFETs and the first pMISFETs from the main surface of the semiconductor substrate 1 are the highest, and the heights of the sidewalls SWM provided in the second nMISFETs and the second pMISFETs from the main surface of the semiconductor substrate 1 and the heights of the sidewalls SWL provided in the third nMISFETs and the third pMISFETs from the main surface of the semiconductor substrate 1 are progressively shorter in this order.

Thereafter, in the same manner as in Embodiment 2 described above, as shown in FIG. 43 described above, the source/drain regions SD of the first nMISFETs including the $n^-$-type semiconductor regions 13 and the $n^+$-type semiconductor regions 23, the source/drain regions SD of the second nMISFETs including the $n^-$-type semiconductor region 24 and the $n^+$-type semiconductor regions 23, and the source/drain regions SD of the third nMISFETs including the $n^-$-type semiconductor regions 18 and the $n^+$-type semiconductor regions 23 are formed. Also, the source/drain regions SD of the first pMISFETs including the $p^-$-type semiconductor regions 14 and the $p^+$-type semiconductor regions 21, the source/drain regions SD of the second pMISFETs including the $p^-$-type semiconductor regions 25 and the $p^+$-type semiconductor regions 21, and the source/drain regions SD of the third pMISFETs including the $p^-$-type semiconductor regions 19 and the $p^+$-type semiconductor regions 21 are formed.

Additionally, over the gate electrodes GHn of the first nMISFETs, in the upper surfaces of the $n^+$-type semiconductor regions 23, over the gate electrodes GHp of the first pMISFETs, in the upper surfaces of the $p^+$-type semiconductor regions 21, over the gate electrodes GMn of the second nMISFETs, in the upper surfaces of the $n^+$-type semiconductor regions 23, over the gate electrodes GMp of the second pMISFETs, in the upper surfaces of the $p^+$-type semiconductor regions 21, over the gate electrodes GLn of the third nMISFETs, in the upper surfaces of the $n^+$-type semiconductor regions 23, over the gate electrodes GLp of the third pMISFETs, and in the upper surfaces of the $p^+$-type semiconductor regions 21, the silicide layers 3 are formed.

Thereafter, in the same manner as in the manufacturing method of Embodiment 1 described above, an interlayer insulating film, contact holes, plugs, interconnect wires, and the like are formed successively.

Thus, according to Embodiment 3, the same effect as obtained in Embodiment 2 can be obtained.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

For example, in the foregoing embodiments, the present invention has been applied to the three types of MISFETs having different sidewall lengths, but the present invention is not limited thereto. The present invention is also applicable to two types of or four or more types of MISFETs having different sidewall lengths.

The present invention is applicable to a semiconductor device including a plurality of semiconductor elements having sidewalls of different sidewall lengths.

What is claimed is:

1. A semiconductor device, comprising:
a plurality of first field effect transistors in a first region of a semiconductor substrate, each said first field effect transistor having a first gate electrode and first sidewall spacers provided over side surfaces of the first gate electrode; and
a plurality of second field effect transistors in a second region of the semiconductor substrate which is different from the first region, each said second field effect transistor having a second gate electrode and second sidewall spacers provided over side surfaces of the second gate electrode,
wherein the first gate electrode is formed of the same conductive film as that of the second gate electrode,
wherein a height of the first gate electrode from a main surface of the semiconductor substrate is the same as a height of the second gate electrode from the main surface of the semiconductor or substrate,
wherein a height of each of the second sidewall spacers from the main surface of the semiconductor substrate is shorter than a height of the second gate electrode from the main surface of the semiconductor substrate, and
wherein a height of each of the second sidewall spacers from the main surface of the semiconductor substrate is shorter than a height of each of the first sidewall spacers from the main surface of the semiconductor substrate.

2. The semiconductor device according to claim 1, wherein a length of the second gate electrode is shorter than a length of the first gate electrode.

3. The semiconductor device according to claim 1, wherein a first silicide layer is formed over the first gate electrode, a second silicide layer is formed over the second gate electrode, and
wherein the second silicide layer has a thickness larger than a thickness of the first silicide layer.

4. The semiconductor device according to claim 1, wherein a layout density of the plurality of second field effect transistors is higher than a layout density of the plurality of first field effect transistors.

5. The semiconductor device according to claim 1, wherein the first sidewall spacers are formed of the same insulating layer as that of the second sidewall spacers.

6. The semiconductor device according to claim 1, wherein a length of each of the second sidewall spacers is shorter than a length of each of the first sidewall spacers.

* * * * *